US008669462B2

(12) United States Patent
Almogy et al.

(10) Patent No.: US 8,669,462 B2
(45) Date of Patent: Mar. 11, 2014

(54) CONCENTRATING SOLAR ENERGY COLLECTOR

(75) Inventors: Gilad Almogy, Palo Alto, CA (US); Ratson Morad, Palo Alto, CA (US); Ofer Ricklis, Kfar-Sava (IL); Nathan P. Beckett, Oakland, CA (US); Amir Bar, Sunnyvale, CA (US); Andrey Bochkariov, Rosh Ha'ayin (IL); Amir A. Weiss, Sunnyvale, CA (US); Radu Raduta, Mountain View, CA (US); Brian E. Atchley, Oakland, CA (US)

(73) Assignee: Cogenra Solar, Inc., Mountain View, CA (US)

( * ) Notice: Subject to any disclaimer, the term of this patent is extended or adjusted under 35 U.S.C. 154(b) by 96 days.

(21) Appl. No.: 13/079,193

(22) Filed: Apr. 4, 2011

(65) Prior Publication Data

US 2011/0284055 A1    Nov. 24, 2011

Related U.S. Application Data

(60) Provisional application No. 61/347,585, filed on May 24, 2010, provisional application No. 61/431,603, filed on Jan. 11, 2011.

(51) Int. Cl.
*H01L 31/052*   (2006.01)
*H01L 31/058*   (2006.01)

(52) U.S. Cl.
USPC ............................ 136/246; 136/248; 52/173.3

(58) Field of Classification Search
USPC .......... 136/246, 248; 126/634, 694, 704, 606, 126/573, 600, 646; 52/173.3
See application file for complete search history.

(56) References Cited

U.S. PATENT DOCUMENTS

| 3,490,950 | A | 1/1970 | Myer |
| 3,769,091 | A | 10/1973 | Leinkram et al. |
| 3,988,166 | A | 10/1976 | Beam |
| 4,002,031 | A | 1/1977 | Bell |
| 4,038,971 | A | 8/1977 | Bezborodko |
| 4,075,420 | A | 2/1978 | Walton |
| 4,078,544 | A | 3/1978 | Hollands et al. |
| 4,097,309 | A | 6/1978 | Horne |
| 4,178,913 | A | 12/1979 | Hutchison |
| 4,180,414 | A | 12/1979 | Diamond et al. |
| 4,243,019 | A | 1/1981 | Severson |

(Continued)

FOREIGN PATENT DOCUMENTS

| DE | 20 2011 103 199 U1 | 2/2012 |
| WO | WO 99-42765 | 8/1999 |

(Continued)

OTHER PUBLICATIONS

Smeltink, J.F.H., et al., 40kW PV Thermal Roof Mounted Concentrator System, Conference Record of the 2006 IEEE 4th World Conference on Photovoltaic Energy Conversion, May 2006, pp. 636-639.

(Continued)

*Primary Examiner* — Jonathan Johnson
*Assistant Examiner* — Bethany Lambright
(74) *Attorney, Agent, or Firm* — K&L Gates LLP

(57) ABSTRACT

Systems, methods, and apparatus by which solar energy may be collected to provide electricity, heat, or a combination of heat and electricity are disclosed herein.

19 Claims, 31 Drawing Sheets

(56) References Cited

U.S. PATENT DOCUMENTS

| | | |
|---|---|---|
| 4,249,514 A | 2/1981 | Jones |
| 4,281,900 A | 8/1981 | Lewis, Jr. |
| 4,296,737 A | 10/1981 | Silk |
| 4,332,238 A | 6/1982 | Garcia, Jr. |
| 4,337,758 A | 7/1982 | Meinel et al. |
| 4,351,319 A | 9/1982 | Robbins, Jr. |
| 4,361,717 A | 11/1982 | Gilmore et al. |
| 4,386,600 A | 6/1983 | Eggert, Jr. |
| 4,388,481 A | 6/1983 | Uroshevich |
| 4,422,443 A | 12/1983 | Arendt |
| 4,422,893 A | 12/1983 | Duchateau et al. |
| 4,427,838 A | 1/1984 | Goldman |
| 4,435,043 A | 3/1984 | Mertens et al. |
| 4,454,371 A | 6/1984 | Folino |
| 4,719,904 A | 1/1988 | O'Neill |
| 4,771,764 A | 9/1988 | Cluff |
| 4,846,151 A | 7/1989 | Simko, Jr. |
| 4,877,959 A * | 10/1989 | Page .......................... 250/336.1 |
| 5,054,466 A | 10/1991 | White et al. |
| 5,191,876 A | 3/1993 | Atchley |
| 5,232,519 A | 8/1993 | Glatfelter et al. |
| 5,253,637 A | 10/1993 | Maiden |
| 5,344,497 A | 9/1994 | Fraas et al. |
| 5,401,329 A | 3/1995 | Fraas et al. |
| 5,498,297 A | 3/1996 | O'Neill et al. |
| 5,505,789 A | 4/1996 | Fraas et al. |
| 5,505,917 A | 4/1996 | Collier, Jr. |
| 5,542,409 A | 8/1996 | Sampayo |
| 5,616,185 A | 4/1997 | Kukulka |
| 5,994,641 A | 11/1999 | Kardauskas et al. |
| 6,020,555 A | 2/2000 | Garboushian et al. |
| 6,080,927 A | 6/2000 | Johnson |
| 6,082,353 A | 7/2000 | Van Doorn et al. |
| 6,123,067 A | 9/2000 | Warrick |
| 6,218,605 B1 | 4/2001 | Daily et al. |
| 6,232,545 B1 | 5/2001 | Samaras et al. |
| 6,276,359 B1 | 8/2001 | Frazier |
| 6,303,853 B1 | 10/2001 | Fraas et al. |
| 6,946,081 B2 | 9/2005 | Voutchkov |
| 7,388,146 B2 | 6/2008 | Fraas et al. |
| 7,709,730 B2 | 5/2010 | Johnson et al. |
| 7,772,484 B2 | 8/2010 | Li et al. |
| 7,820,906 B2 | 10/2010 | Johnson et al. |
| 7,825,327 B2 | 11/2010 | Johnson et al. |
| 7,926,480 B2 | 4/2011 | LeLievre |
| 7,932,461 B2 | 4/2011 | Johnson et al. |
| 7,952,057 B2 | 5/2011 | Finot et al. |
| 7,968,791 B2 | 6/2011 | Do et al. |
| 8,039,777 B2 | 10/2011 | Lance et al. |
| 8,049,150 B2 | 11/2011 | Johnson et al. |
| 8,071,930 B2 | 12/2011 | Wylie et al. |
| 8,083,362 B2 | 12/2011 | Finot et al. |
| 8,134,104 B2 | 3/2012 | Finot et al. |
| 8,410,351 B1 * | 4/2013 | Gu .............................. 136/246 |
| 2001/0017154 A1 | 8/2001 | Washio |
| 2003/0024802 A1 | 2/2003 | Burgos |
| 2003/0121228 A1 | 7/2003 | Stoehr et al. |
| 2003/0201008 A1 | 10/2003 | Lawheed |
| 2004/0055594 A1 * | 3/2004 | Hochberg et al. ............. 126/696 |
| 2004/0093965 A1 | 5/2004 | Hardcastle, III |
| 2005/0081910 A1 | 4/2005 | Danielson et al. |
| 2005/0133082 A1 | 6/2005 | Hvistendahl et al. |
| 2006/0016772 A1 | 1/2006 | Presher et al. |
| 2006/0150967 A1 * | 7/2006 | Hoelle et al. .................. 126/694 |
| 2006/0174930 A1 | 8/2006 | Murphy et al. |
| 2006/0231133 A1 | 10/2006 | Fork et al. |
| 2006/0249143 A1 | 11/2006 | Caseiro et al. |
| 2007/0034207 A1 | 2/2007 | Niedermeyer |
| 2007/0056579 A1 | 3/2007 | Caseiro et al. |
| 2007/0068162 A1 | 3/2007 | Komura et al. |
| 2007/0089775 A1 | 4/2007 | Lasich |
| 2007/0175871 A1 | 8/2007 | Brezni et al. |
| 2007/0251569 A1 | 11/2007 | Shan et al. |
| 2008/0053701 A1 | 3/2008 | Antaya et al. |
| 2008/0127967 A1 | 6/2008 | Kimura et al. |
| 2008/0128017 A1 * | 6/2008 | Ford .............................. 136/248 |
| 2008/0216887 A1 | 9/2008 | Hacke et al. |
| 2008/0271776 A1 | 11/2008 | Morgan |
| 2008/0302357 A1 | 12/2008 | DeNault |
| 2008/0302418 A1 | 12/2008 | Buller et al. |
| 2008/0308091 A1 | 12/2008 | Corio |
| 2008/0308094 A1 | 12/2008 | Johnston |
| 2009/0000662 A1 | 1/2009 | Harwood et al. |
| 2009/0014058 A1 | 1/2009 | Croft et al. |
| 2009/0056698 A1 | 3/2009 | Johnson et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |
| 2009/0065045 A1 | 3/2009 | Tsadka et al. |
| 2009/0114261 A1 | 5/2009 | Stancel et al. |
| 2009/0114281 A1 * | 5/2009 | Gobel .......................... 136/259 |
| 2009/0126774 A1 * | 5/2009 | Taylor et al. .................. 136/244 |
| 2009/0173375 A1 | 7/2009 | Frazier et al. |
| 2009/0178704 A1 | 7/2009 | Kalejs et al. |
| 2009/0183731 A1 | 7/2009 | Capan |
| 2009/0211644 A1 | 8/2009 | Wylie et al. |
| 2009/0223550 A1 | 9/2009 | Curtin et al. |
| 2009/0308379 A1 | 12/2009 | Capan |
| 2009/0314283 A1 | 12/2009 | Kimura et al. |
| 2010/0000165 A1 | 1/2010 | Koller |
| 2010/0031991 A1 | 2/2010 | Mochizuki et al. |
| 2010/0051015 A1 * | 3/2010 | Ammar ........................ 126/600 |
| 2010/0089435 A1 | 4/2010 | Lockenhoff |
| 2010/0126554 A1 | 5/2010 | Morgan et al. |
| 2010/0132776 A1 | 6/2010 | Nakata |
| 2010/0147347 A1 | 6/2010 | Dyreby et al. |
| 2010/0163014 A1 | 7/2010 | Johnson et al. |
| 2010/0170501 A1 | 7/2010 | Albritton |
| 2010/0193014 A1 | 8/2010 | Johnson et al. |
| 2010/0207951 A1 | 8/2010 | Plaisted et al. |
| 2010/0218807 A1 * | 9/2010 | Arbore et al. ................. 136/246 |
| 2010/0236626 A1 | 9/2010 | Finot et al. |
| 2010/0288332 A1 | 11/2010 | O'Neill |
| 2010/0294336 A1 | 11/2010 | Johnson et al. |
| 2010/0294340 A1 * | 11/2010 | Cunningham et al. ........ 136/251 |
| 2010/0319684 A1 | 12/2010 | Almogy et al. |
| 2011/0017267 A1 | 1/2011 | Lichy et al. |
| 2011/0023940 A1 | 2/2011 | Do et al. |
| 2011/0036345 A1 | 2/2011 | Almogy et al. |
| 2011/0061719 A1 | 3/2011 | Tsadka et al. |
| 2011/0108090 A1 | 5/2011 | Lance et al. |
| 2011/0114154 A1 | 5/2011 | Lichy et al. |
| 2011/0120524 A1 * | 5/2011 | Wares et al. .................. 136/246 |
| 2011/0132457 A1 | 6/2011 | Finot |
| 2011/0146662 A1 * | 6/2011 | Dehlsen et al. ............... 126/600 |
| 2011/0162692 A1 | 7/2011 | Giacalone et al. |
| 2011/0168161 A1 | 7/2011 | Capan |
| 2011/0226309 A1 | 9/2011 | Do et al. |
| 2011/0226310 A1 | 9/2011 | Johnson et al. |
| 2011/0265869 A1 | 11/2011 | Finot et al. |
| 2011/0279918 A1 | 11/2011 | Almogy et al. |
| 2011/0284055 A1 | 11/2011 | Almogy et al. |
| 2012/0042932 A1 | 2/2012 | Wylie et al. |
| 2012/0318318 A1 | 12/2012 | Metin et al. |
| 2012/0318319 A1 | 12/2012 | Pinarbasi et al. |
| 2012/0325282 A1 | 12/2012 | Snow et al. |
| 2013/0112237 A1 | 5/2013 | Almogy et al. |
| 2013/0206221 A1 | 8/2013 | Gannon et al. |
| 2013/0265665 A1 | 10/2013 | Clavelle et al. |

FOREIGN PATENT DOCUMENTS

| | | |
|---|---|---|
| WO | WO 03022578 A1 | 3/2003 |
| WO | WO 2005-057092 A1 | 6/2005 |
| WO | WO 2005-090873 A1 | 9/2005 |
| WO | WO 2006-000834 A1 | 1/2006 |
| WO | WO 2006-120475 A1 | 11/2006 |
| WO | WO 2007-022756 A2 | 3/2007 |
| WO | WO 2007-087680 A1 | 8/2007 |
| WO | WO 2007-109900 A1 | 10/2007 |
| WO | WO 2007-110713 A1 | 10/2007 |
| WO | WO 2007-129146 A1 | 11/2007 |
| WO | WO 2008-105913 A2 | 9/2008 |
| WO | WO 2008-112180 A9 | 9/2008 |

(56) References Cited

FOREIGN PATENT DOCUMENTS

| | | |
|---|---|---|
| WO | WO 2008-143482 A2 | 11/2008 |
| WO | WO 2009-002350 A1 | 12/2008 |
| WO | WO 2009-011013 | 1/2009 |
| WO | WO 2009-029275 A2 | 3/2009 |
| WO | WO 2009-032917 A2 | 3/2009 |
| WO | WO 2009-032920 A2 | 3/2009 |
| WO | WO 2009-034573 A2 | 3/2009 |
| WO | WO 2009-061495 A1 | 5/2009 |
| WO | WO 2009-076740 A1 | 6/2009 |
| WO | WO 2009-090538 A2 | 7/2009 |
| WO | WO 2009-096754 A2 | 8/2009 |
| WO | WO 2009-103077 A2 | 8/2009 |
| WO | WO 2009-137864 A1 | 11/2009 |
| WO | WO 2009-146215 A2 | 12/2009 |
| WO | WO 2010-004420 A2 | 1/2010 |
| WO | WO 2010/004420 A2 | 1/2010 |
| WO | WO 2010-017422 A2 | 2/2010 |
| WO | WO 2010-035064 A1 | 4/2010 |
| WO | WO 2010-047656 A1 | 4/2010 |
| WO | WO 2010-048677 A1 | 5/2010 |
| WO | WO 2010-096001 A1 | 8/2010 |
| WO | WO 2010-099236 A1 | 9/2010 |
| WO | WO 2010-108141 A2 | 9/2010 |
| WO | WO 2010-132312 A1 | 11/2010 |
| WO | WO 2010-138606 A1 | 12/2010 |
| WO | WO 2010-138606 A2 | 12/2010 |
| WO | WO 2010-138606 A3 | 12/2010 |
| WO | WO 2011-014690 A2 | 2/2011 |
| WO | WO 2011-062902 A1 | 5/2011 |
| WO | WO 2011-069079 A2 | 6/2011 |
| WO | WO 2011-134759 A2 | 11/2011 |
| WO | WO 2011-139494 A1 | 11/2011 |
| WO | WO 2011-139494 A1 | 11/2011 |
| WO | WO 2011-139852 A2 | 11/2011 |
| WO | WO 2011-141198 A2 | 11/2011 |
| WO | WO 2011-146177 A1 | 11/2011 |
| WO | WO 2011-149589 A1 | 12/2011 |
| WO | WO 2012-003235 A1 | 1/2012 |
| WO | WO 2012-005747 A1 | 1/2012 |
| WO | WO 2012-113478 A1 | 8/2012 |
| WO | WO 2013-122639 | 8/2013 |
| WO | WO 2013/154840 | 10/2013 |

OTHER PUBLICATIONS

Sala, G., et al., 480 kW peak EUCLIDES Concentrator Power Plant Using Parabolic Troughs, $2^{nd}$ World Conference and Exhibition PVSEC, 1998, pp. 1963-1968.

Smeltink, J.F.H, et al., A 40Kw Roof Mounted PV Thermal Concentrator System, $20^{th}$ EC PV Solar Energy Conference, Mar. 27, 2006, 4 pgs.

Smeltink, J., et al., A hybrid pv-thermal linear microconcentrator for domestic application, $22^{nd}$ EU PVSEC, 2007, 4 pgs.

Chow, T.T., A review on photovoltaic/thermal hybrid solar technology, Applied Energy, Feb. 2010, pp. 365-379, available online Jul. 25, 2009.

Kempe, M.D., et al., Accelerated Stress Testing of Hydrocarbon-Based Encapsulants for Medium-Concentration CPV Applications, $34^{th}$ IEEE Photovoltaic Specialists Conference (PVSC), Jun. 7-12, 2009, pp. 1826-1831.

Mason, N.B. et al., Advanced Laser Processing for Industrial Solar Cell Manufacturing, 2006, 62 pgs, Department of Trade and Industry (United Kingdom).

Price, Hank, et al., Advances in Parabolic Trough Solar Power Technology, Journal of Solar Energy Engineering, May 2002, pp. 109-125, vol. 124.

Miller, D.C., et al., Analysis of Transmitted Optical Spectrum Enabling Accelerated Testing of CPV Designs, SPIE 2009 Solar Energy + Technology Conference, Aug. 2-6, 2009, Jul. 2009 preprint, 15 pgs.

Le Lievre, Peter, Chromasun Photovoltaic; Heating-Cooling; Daylighting—all in a single panel, Cleantech Showcase—Abu Dhabi, Jan. 21, 2009, 21 pgs.

Combined Heat and Power Solar (CHAPS), brochure, Nov. 2004, 2 pgs., Australian National University Centre for Sustainable Energy Systems.

Crowley, Mark, Commercialization of CPV in 2010—Toward the First 100 MW, CPV Today $2^{nd}$ Concentrated Photovoltaic Summit US, Feb. 2-3, 2010, 17 pgs.

Fraas, Lewis, Concentrated Photocoltaics (CPV): Path to Affordable Solar Electric Power, Southeast Solar Summit, Nov. 2007, 22 pgs.

Grama, Sorin, et al., Concentrating Solar Power—Technology, Cost, and Markets, 2008 Industry Report, 2008, 149 pgs, Pròmetheus Institute for Sustainable Development and Greentech Media.

Royne, Anja, et al., Cooling of Photovoltaic cells under concentrated illumination: a critical review, Solar Energy Materials & Solar Cells, 2005, pp. 451-483, vol. 86, Elsevier.

Boehm, Robert, CPV—Competing and Beating Other Solar Technologies, CPV Today $2^{nd}$ Concentrated Photovoltaic Summit USA, Feb. 2-3, 2010, 62 pgs.

Skumanich, Andy, CPV: Market Considerations for 2010 and Beyond, CPV Conference Feb. 3, 2010, 31 pgs.

Shisler, Bill, CPV Qualification and Safety Testing, CPV Today $2^{nd}$ Concentrated Photovoltaic Summit—US, Feb. 3, 2010, 19 pgs.

Lerchenmuller, Hansjorg, CPV Super Panel—The CPV Landscape, CPV Today $2^{nd}$ Concentrated Photovoltaic Summit—US, Feb. 2, 2010, 21 pgs.

CPV Systems: The Road to Successful Deployments, CPV Today $2^{nd}$ Concentrated Photovoltaic Summit—US, Feb. 2-3, 2010, 11 pgs.

Plesniak, Adam, Deployment and Performance of Boeing HCPV Modules and Arrays, CPV Today $2^{nd}$ Concentrated Photovoltaic Summit—US, Feb. 3, 2010, 18 pgs.

Etzkorn, Edward V., DOE Outlook and Opportunities for CPV, CPV Today $2^{nd}$ Concentrated Photovoltaic Summit—US, Feb. 2, 2010, 33 pgs.

Fraas, Dr. Lewis, Economic Comparisons of the Various PV Options, CPV Today Concentrated Photovoltaics Summit USA, Feb. 4, 2009, 21 pgs.

Kempe, M.D., et al., Ethylene-Vinyl Acetate Potential Problems for Photovoltaic Packaging, 2006 IEEE $4^{th}$ World Conference on Photovoltaic Energy Conversion (WCPEC-4), May 7-12, 2006, 6 pgs.

Lupfert, Eckhard, Eurotrough Design Issues and Prototype Testing at PSA, Proceedings of the Solar Forum 2001, Solar Energy: The Power to Choose, Apr. 21-25, 2001, 5 pgs.

O'Neill, Mark, Fifth-Generation 20X Linear Frensel Lens Silicon Cell Concentrator Technology, Fifth International Conference on Solar Concentrators (ICSC-5), Nov. 19, 2008, pp. 1-23

Cohen, Gilbert E., et al., Final Report on The Operation and Maintenance Improvment Program for Concentrating Solar Power Plants, Jun. 1999, pp. 1-186, issued by Sandia National Laboratories.

Zondag, Herbert, et al., Guidelines for performance mesurements of liquid-cooled non-concentrating PVT collectors using c-Si cells, 2006, pp. 1-41, issued by PV Catapult.

Tobias, Ignacio, et al., Handbook of Photovoltaic Science and Engineering, Chapter 7—Crystalline Silicon Solar Cells and Modules, 2003, pp. 255-306, 2003 John Wiley & Sons, Ltd.

Anderson, William G., et al., Heat Pipe Cooling of Concentrating Photovoltaic (CPV) Systems, 6th International Energy Conversion Engineering Conference (IECEC), Jul. 28-30, 2008, pp. 1-9.

Neuhaus, Dirk-Holger, et al., Industrial Silicon Wafer Solar Cells, Advances in OptoElectronics, 2007, pp. 1-15, Hindawi Publishing Corporation.

Mirroxx Linear Fresnel Collector Technology, (brochure), 2009, 8 pgs.

Cohen, Gilbert, et al., Parabolic Trough Concentrator Development, USA Trough Third Annual Parabolic Trough Workshop, Jun. 18, 2000, pp. 1-13.

Smeltink, J. et al., Performance monitoring of a pv thermal concentrator system, 22nd EU PVSEC, 2007, 4 pgs.

Birkmire, R. W., et al., Processing Materials, Devices and Diagnostics for Thin Film Photovoltaics: Fundamental and Manufacturability Issues, Annual Report to National Renewable Energy Laboratory by Institute of Energy Conversion University of Delaware, Apr. 1, 2007-Dec. 31, 2007, pp. 1-77.

(56) References Cited

OTHER PUBLICATIONS

Kaminar, N.R., et al., PVMaT Improvements in the Manufacturing of the PVI Powergrid, Final Technical Report, Oct. 1999, 77 pgs.
Affolter, Pascal, et al., PVT Roadmap, Accessed from the world wide web Jan. 3, 2010, 91 pgs.
Harwood, D., et al., Receiver Development for Rooftop Concentrator Applications, International Conference on Solar Concentrators (ICSC-4), 2007, 4 pgs.
Renewable Energy Technology Characterizations, Topical Report TR-109496, Dec. 1997, 283 pgs, Office of Utility Technologies, Energy Efficiency and Renewable Energy, U.S. Department of Energy and Electric Power Research Institute.
Kennedy, Cheryl, Session CSP Advanced Systems: Optical Materials, 2008 Solar Annual Review Meeting, 27 pgs.
SkyFuel & SkyTrough Questions and Answers, (brochure), 2009, 6 pgs, www.SkyFuel.com.
SkyTrough Parabolic Trough Concentrator, (brochure), 2009, 2 pgs., www.SkyFuel.com.
SkyTrough Parabolic Trough Collector Assembly, (brochure), 2 pgs., www.Skyfuel.com.
Weatherby, Clive, Solar CPV—a great opportunity for traditional manufacturing industry, CPV Today Concentrated Photovoltaic Summit USA, Feb. 3-4, 2009, pp. 1-33.
Meydbray, Y., et al., Solder Joint Degradation in High Efficiency All Back Contact Solar Cells, Proceedings of the 22nd European Photovoltaic Solar Energy Conference, 2007, 5 pgs.
Sala, G., et al., Test, Rating and Specification of PV Concentrator Components and Systems, Book 1, Classification of PV Concentrators, Chapter 3—History of Concentrators, Jan. 31, 2002, pp. 1, 13-57.
Morvillo, Pasquale, The ENEA c-Si high efficiency solar cell, Tutorial on PV-Concentrators Technology, 2007, 32 pgs.
Swanson, Richard M., The Promise of Concentrators, Progress in Photovoltaics: Research and Applications, 2000, pp. 93-111, John Wiley & Sons, Ltd.
Coventry, Franklin J., et al., Thermal and electrical performance of a concentrating PV/Thermal collector: results from the ANU CHAPS collector, 2002, 6 pgs., ANZSES Solar Energy Conference, Newcastle, Australia.
Van Kessel, Theodore, Thermal Management for CPV at 2000 Suns, CPV Today 2nd Concentrated Photovoltaic Summit—US, Feb. 2-3, 2010, 36 pgs.
Lee, B., et al., Thermally conductive and electrically insulating EVA composite encapsulants for solar photovoltaic (PV) cell, Express Polymer Letters, 2008, pp. 357-363, vol. 2, No. 5.
Youssef, Cherif, Utility's Perspective to Concentrated Solar . . . , CPV Today 2nd Annual Concentrated Photovoltaic Summit USA, Feb. 2, 2010, 28 pgs.
SKYWAT-002US Non-Final Office Action dated Nov. 23, 2010 (U.S. Appl. No. 12/622,416) 14 pages.
International Search Report and Written Opinion for PCT/US/10/56847, Mar. 3, 2011; 11 pages.
International Search Report PCT/US/10/25280, May 2, 2010; 2 pages.
PCT/US2010/036220 International Search Report and Written Opinion mailing date Jun. 20, 2011; 12 pp.
PCT/US2011/032163 International Search Report and Written Opinion mailing date Jun. 27, 2011; 21 pp.
PCT/US2011/032169 International Search Report and Written Opinion mailing date Jul. 5, 2011; 24 pp.
PCT/US/2010/025280 International Preliminary Report and Written Opinion, mailing date May 3, 2010; 5 pp.
PCT/US2010/025280 International Search Report and Written Opinion, mailing date May 3, 2010, 6 pp.
PCT/US2011/031117 International Search Report 4 pp. and Written Opinion 16 pg; mailing date Jun. 20, 2011; 20 pp.
Bunea, Marius M., et al., Simulation and Characterization of High Efficiency Back Contact Cells for Low-Concentration Photovoltaics; Photovoltaic Specialists Conference (PVSC), 2010 35th IEEE; Jun. 20-25, 2010; pp. 000873-000876, ISSN: 0160-8371; Print ISBN: 978-1-4244-5890-S; Honolulu, HI.
Judkins, Zachary S., et al.; Performance Results of a Low-Concentration Photovoltaic System Based on High Efficiency Back Contact Cells; 25th European Photovoltaic Solar Energy Conference and Exhibition / 5th World Conference on Photovoltaic Energy Conversion; Sep. 6-10, 2010; pp. 123-127; Valencia, Spain.
U.S. Appl. No. 12/622,416, Final Office Action mailing date Jun. 21, 2011, 15 pp.
U.S. Appl. No. 12/622,416, Amendment filed Apr. 18, 2011.
U.S. Appl. No. 12/622,416, RCE and Amendment filed Dec. 21, 2011.
U.S. Appl. No. 12/712,122, Office Action mailed Nov. 30, 2012.
U.S. Appl. No. 12/774,436, Office Action dated Dec. 7, 2012.
U.S. Appl. No. 12/788,048, Amendment filed Jun. 18, 2012.
U.S. Appl. No. 12/788,048, Office Action mailed Jan. 18, 2012.
U.S. Appl. No. 12/788,048, Office Action mailed Nov. 8, 2012.
U.S. Appl. No. 12/887,958, Office Action mailed Mar. 14, 2012.
U.S. Appl. No. 12/912,177, Amendment filed Jul. 13, 2012.
U.S. Appl. No. 12/912,177, Amendment filed Jun. 18, 2012.
U.S. Appl. No. 12/912,177, Office Action mailed Jan. 17, 2012.
U.S. Appl. No. 12/912,177, Ofice Action mailed Jun. 25, 2012.
Hittite Solar Energy; Pages from http://www.hittitesolarenergy.com; Accessed on Feb. 7, 2013; 6 pp.
Laila S. Mattos, et al.; New Module Efficiency Record: 23.5% under 1-Sun Illumination Using Thin-film Single-junction GaAs Solar Cells; 38th IEEE PVSC Jun. 3-8, 2012; Alta Devices, Inc., Santa Clara, CA USA; pp. 003187-003190.
Mathur, S. S., et al.; Geometrical Designs and Performace Analysis of a Linear Fresnel Reflector Solar Concentrator with a Flat Horizontal Absorber; International Journal of Energy Research, vol. 14, pp. 107-124; Jan. 18, 1989, John Wilet & Sons, Ltd.
EP107249385, Response to Written Opinion 161/162 filed Jul. 23, 2012.
PCT/US/2010/56847, International Preliminary Report and Written Opinion mailing date May 31, 2012.
PCT/US2010/036220, International Preliminary Report on Patentability and Written Opinion mailing Nov. 29, 2011; 8 pp.
PCT/US2011/031117, International Preliminary Report on Opinion mailing date Nov. 27, 2012; 17 pp.
PCT/US2011/032163, International Preliminary Report on Opinion mailing date Nov. 6, 2012; 13 pp.
PCT/US2011/032169, International Preliminary Report on Opinion mailing date Nov. 20, 2012; 17 pp.
PCT/US2011/031117, International Preliminary Report on Patentability and Written Opinion mailing date Nov. 27, 2012; 17 pp.
PCT/US2011/032163, International Preliminary Report on Patentability and Written Opinion mailing date Nov. 6, 2012; 13 pp.
PCT/US2011/032169, International Preliminary Report on Patentability and Written Opinion mailing date Nov. 20, 2012; 17 pp.
U.S. Appl. No. 12/622,416, Office Action mailed Nov. 23, 2010.
U.S. Appl. No. 12/912,177, Office Action mailed Jun. 25, 2012.
Mattos, Laila S., et al.; New Module Effciency Record: 23.5% under 1-Sun Illumination Using Thin-film Single-junction GaAs Solar Cells; 38th IEEE PVSC Jun. 3-8, 2012; Alta Devices, Inc., Santa Clara, CA USA; pp. 003187-003190.
Mathur, S. S., et al.; Geometrical Designs and Performace Analysis of a Linear Fresnel Reflector Solar Concentrator with a Flat Horizontal Absorber; International Journal of Energy Research, vol. 14, pp. 107-124; 1990; Jan. 18, 1989, John Wiley & Sons, Ltd.
U.S. Appl. No. 12/622,416, Office Action mailed Aug. 15, 2013.
U.S. Appl. No. 12/712,122, Interview Summary mailed Apr. 9, 2013.
U.S. Appl. No. 12/774,436, Amendment dated Dec. 7, 2012.
U.S. Appl. No. 12/774,436, Office Action dated Aug. 29, 2013.
U.S. Appl. No. 12/781,706, Office Action dated Apr. 25, 2013.
U.S. Appl. No. 12/788,048, RCE and Amendment filed May 8, 2013.
U.S. Appl. No. 12/912,177, Office Action mailed Oct. 7, 2013.
U.S. Appl. No. 13/607,507, Amendment dated Oct. 9, 2013.
U.S. Appl. No. 13/607,570, Office Action dated Apr. 11, 2013.

(56) References Cited

OTHER PUBLICATIONS

U.S. Appl. No. 13/619,952, Office Action dated May 16, 2013.
U.S. Appl. No. 13/763,412, Office Action dated May 21, 2013.
U.S. Appl. No. 13/763,429, Office Action dated May 23, 2013.
AU2010322164 Examination Report dated Sep. 9, 2013.
PCT/US2013/034383 International Search Report and Written Opinion mailing date Jun. 28, 2013.
U.S. Appl. No. 12/781,706, Amendment dated Oct. 23, 2013.
U.S. Appl. No. 13/619,952, Amendment dated Nov. 15, 2013.
U.S. Appl. No. 13/763,412, Amendment dated Nov. 20, 2013.
U.S. Appl. No. 13/763,429, Amendment dated Nov. 21, 2013.

* cited by examiner

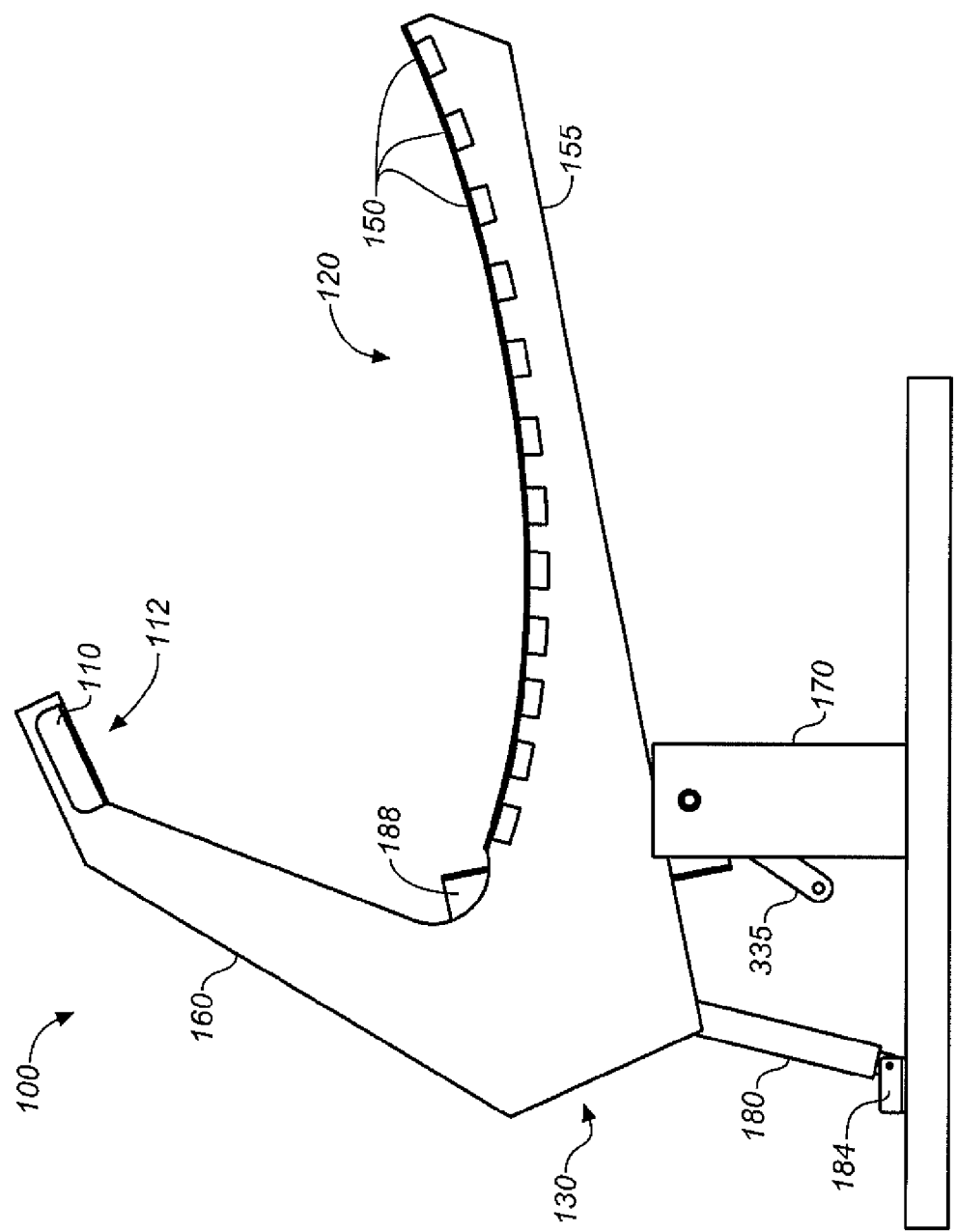

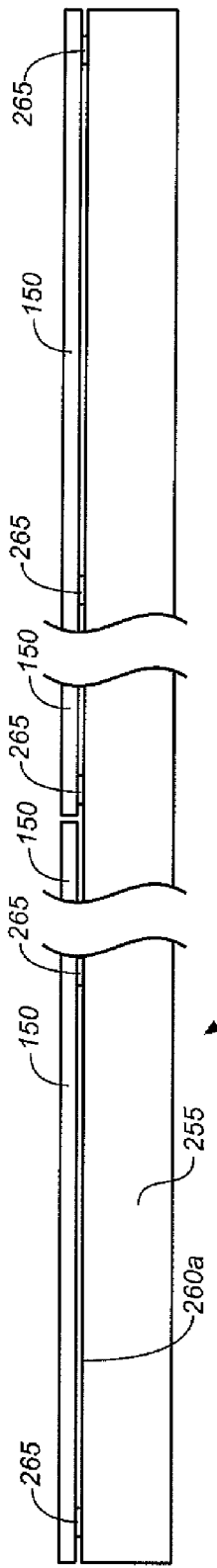
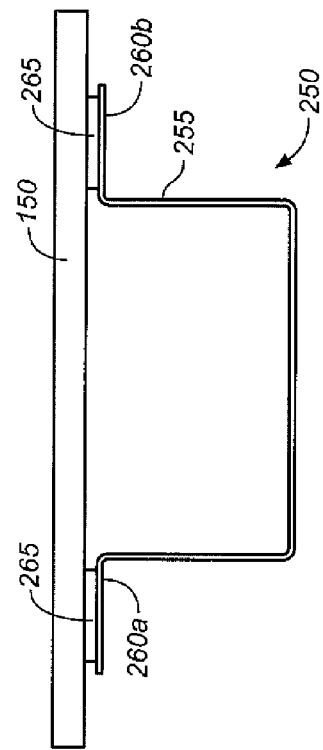
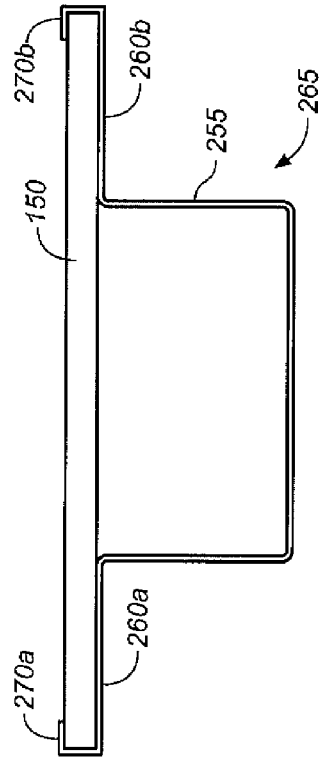
FIG. 3B
FIG. 3C
FIG. 3D

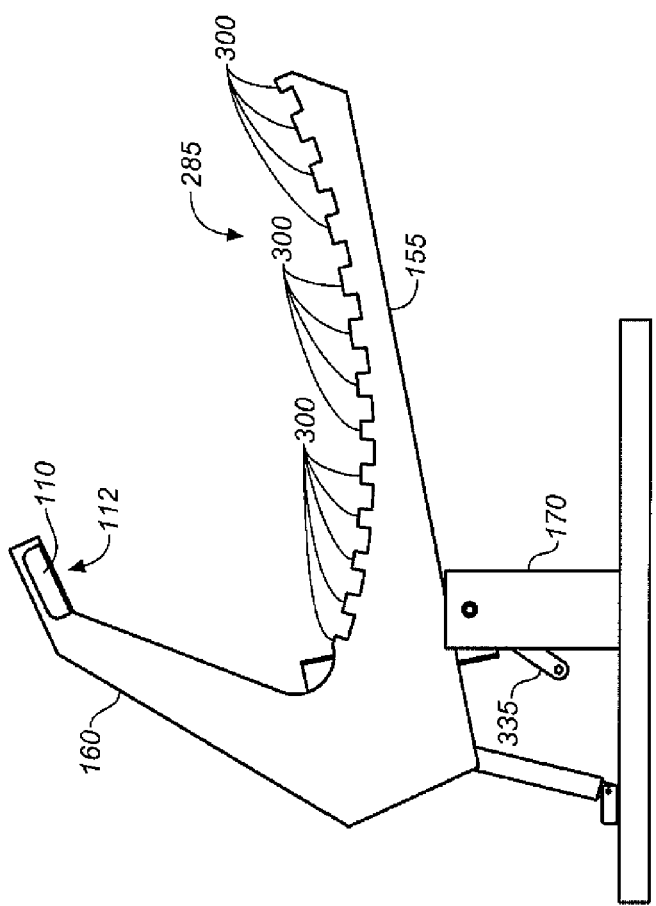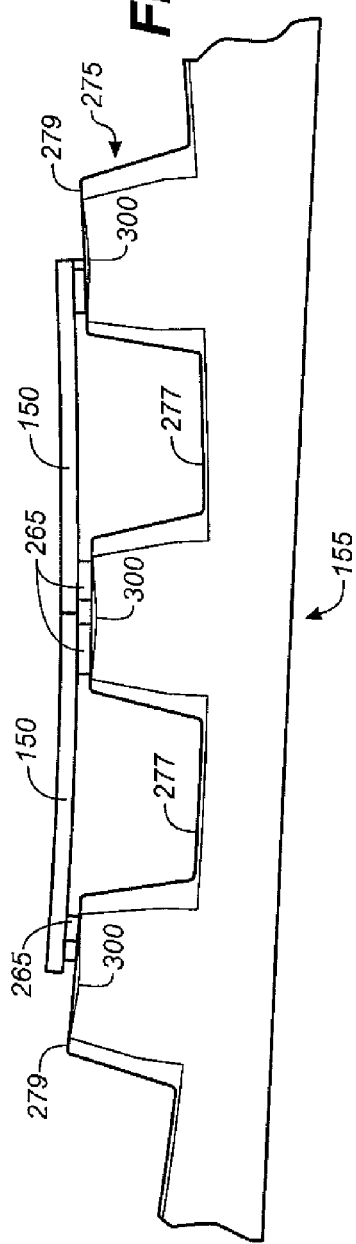

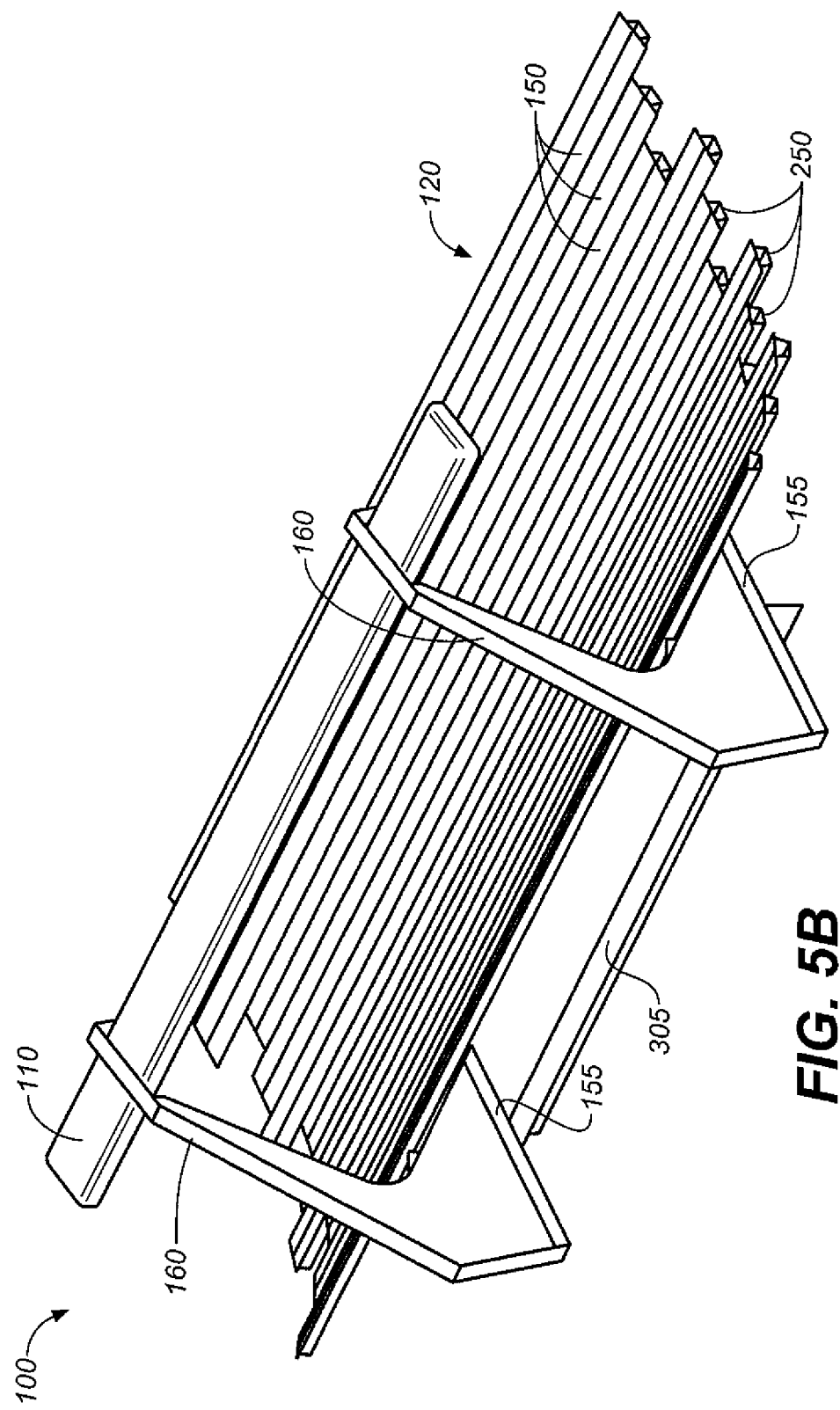

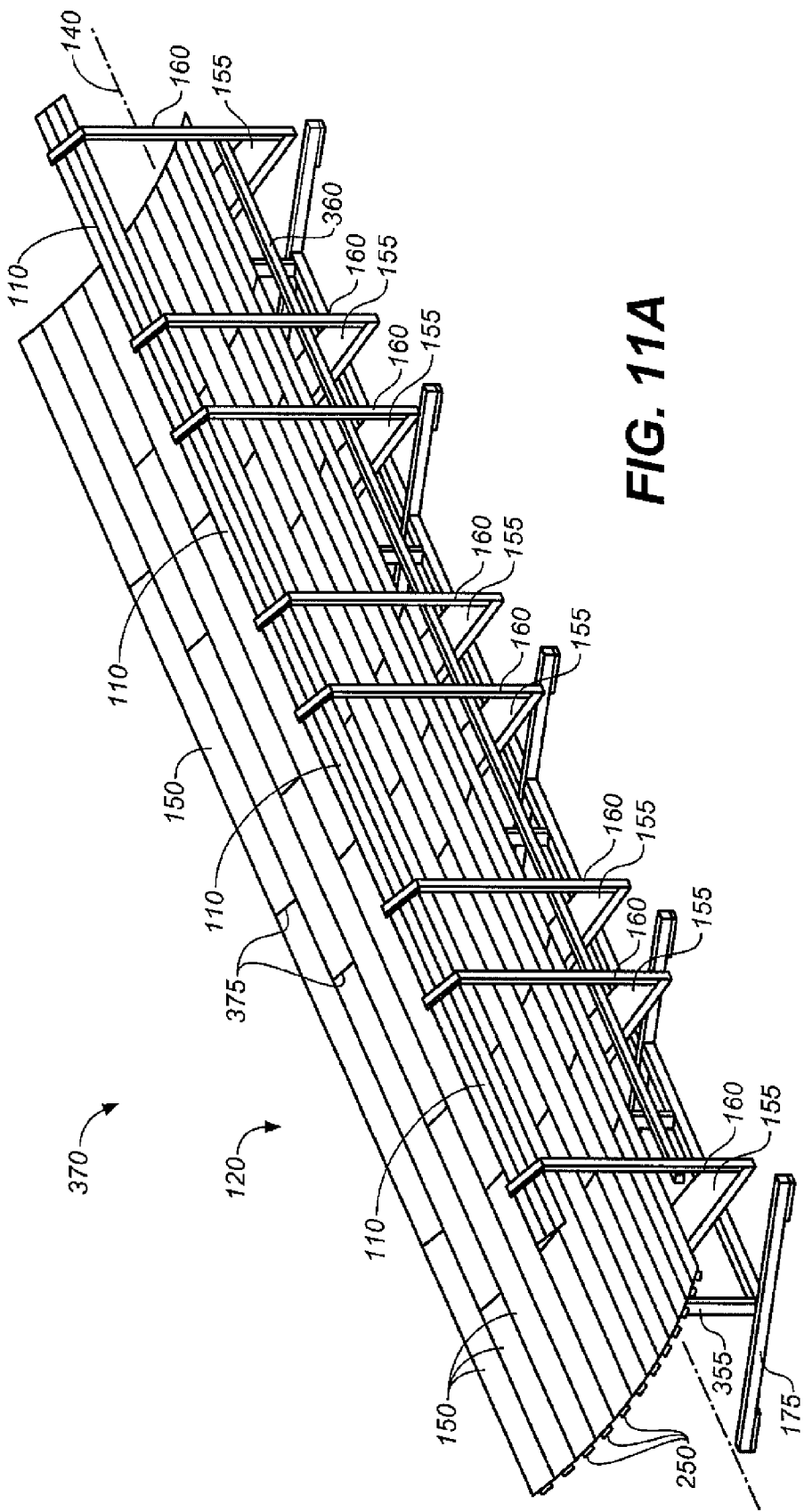

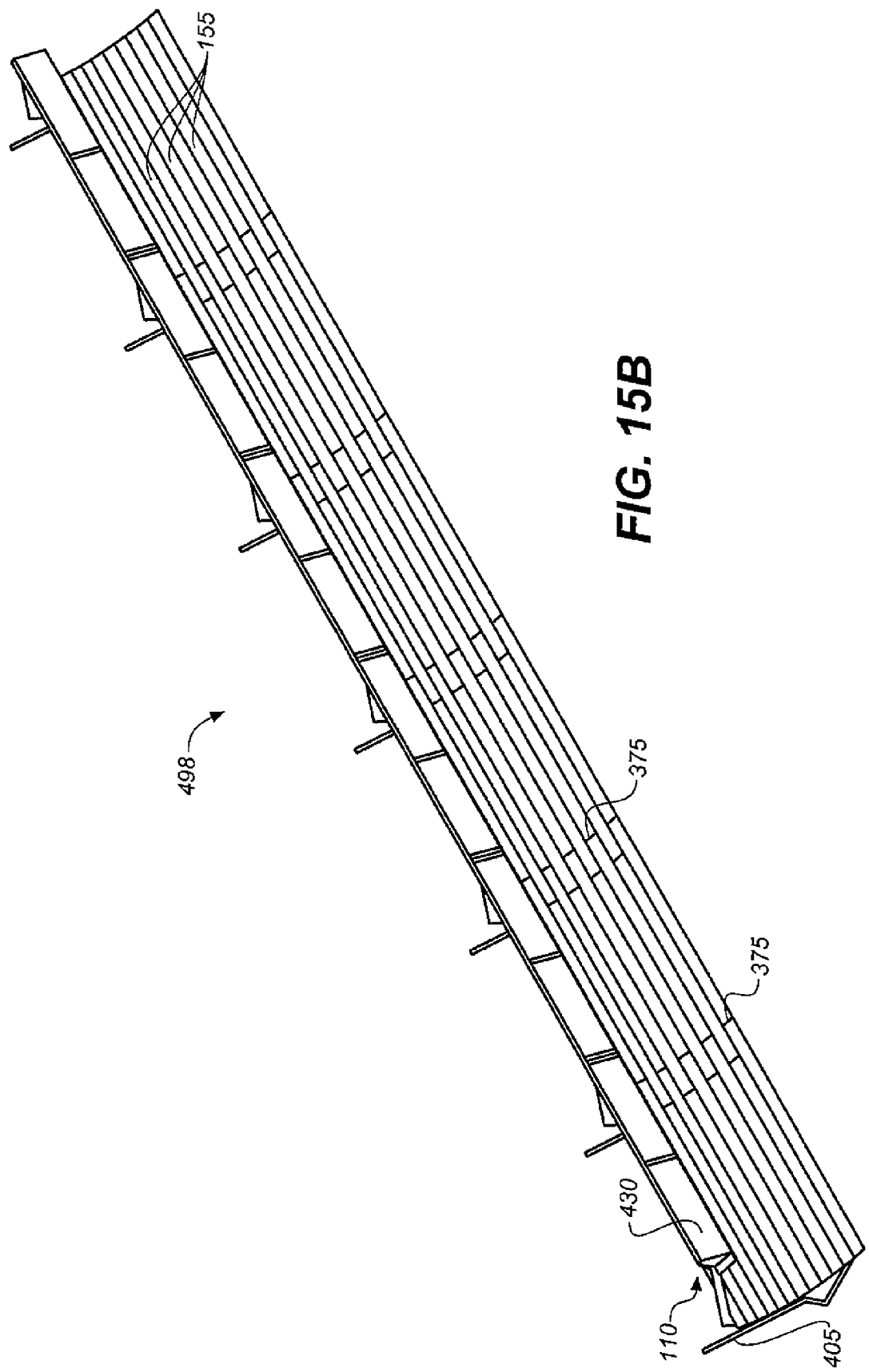

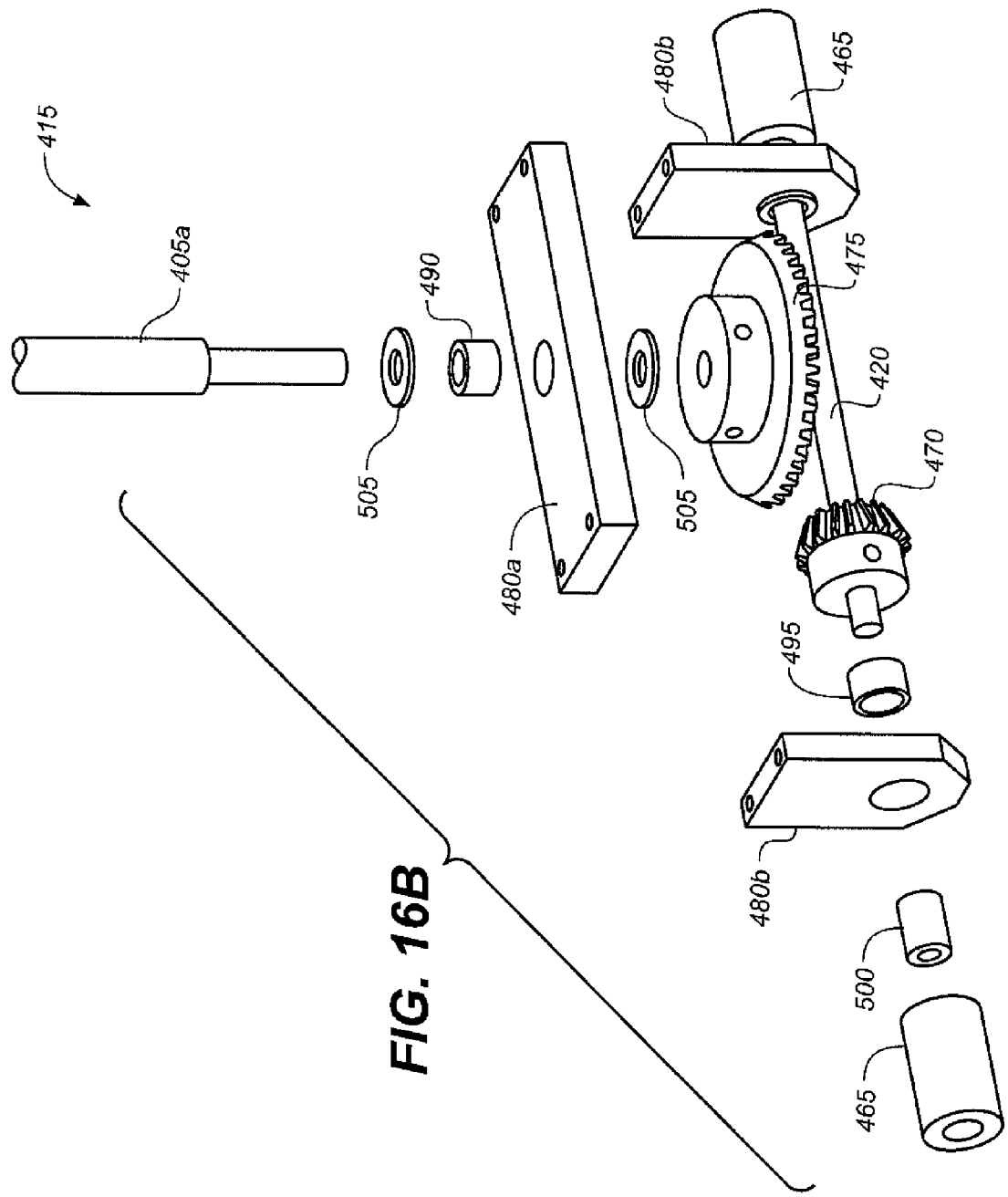

CONCENTRATING SOLAR ENERGY COLLECTOR

CROSS REFERENCE TO RELATED APPLICATIONS

This application claims priority to U.S. Provisional Patent Application No. 61/347,585 filed May 24, 2010 and titled "Concentrating Solar Energy Collector" and to U.S. Provisional Patent Application No. 61/431,603 filed Jan. 11, 2011 and also titled "Concentrating Solar Energy Collector," both of which are incorporated herein by reference in their entirety.

FIELD OF THE INVENTION

The invention relates generally to the collection of solar energy to provide electric power, heat, or electric power and heat.

BACKGROUND

Alternate sources of energy are needed to satisfy ever increasing world-wide energy demands. Solar energy resources are sufficient in many geographical regions to satisfy such demands, in part, by provision of electric power and useful heat.

SUMMARY

Systems, methods, and apparatus by which solar energy may be collected to provide electricity, heat, or a combination of electricity and heat are disclosed herein.

In one aspect, a concentrating solar energy collector comprises a linearly extending reflector having a linear focus and a reflective surface that is or approximates a portion of a parabolic surface from primarily on one side of a symmetry plane of the parabolic surface, a linearly extending receiver oriented parallel to and located at or approximately at the linear focus of the reflector and fixed in position with respect to the reflector, a support structure supporting the reflector and the receiver and pivotally mounted to accommodate rotation of the support structure, the reflector, and the receiver about a rotation axis parallel to the linear focus of the reflector, and a linear actuator pivotally coupled to the support structure to rotate the support structure, the reflector, and the receiver about the rotation axis. The reflective surface may be or approximate a portion of the parabolic surface from entirely on one side of the symmetry plane of the parabolic surface. The rotation axis may be oriented in an East-West or approximately East-West direction, for example.

The receiver may comprise solar cells that, in operation of the solar energy collector, are illuminated by solar radiation concentrated by the reflector onto the receiver. The receiver may additionally or alternatively comprise one or more coolant channels through which, in operation of the solar energy collector, fluid may pass to collect heat from solar radiation concentrated by the reflector onto the receiver.

The solar energy collector may optionally comprise a drive shaft extending parallel to the rotation axis and mechanically coupled to the linear actuator to transmit rotational motion of the drive shaft to drive the linear actuator. The linear actuator may be pivotally coupled to the drive shaft, and the drive shaft isolated from thrust loads on the linear actuator.

The support structure may be pivotally mounted at a plurality of pivot points, in which case the linear actuator may be one of a plurality of linear actuators each of which is located near a corresponding one of the pivot points and pivotally coupled to the support structure to rotate the support structure, the reflector, and the receiver about the linear actuator's corresponding one of the pivot points. One or more drive shafts, optionally present, may extend parallel to the rotation axis and be mechanically coupled to the linear actuators to transmit rotational motion of the drive shaft to drive the linear actuators. The linear actuators may be pivotally coupled to the drive shaft or shafts, and the drive shaft or shafts may be isolated from thrust loads on the linear actuators.

The support structure may comprises a plurality of transverse reflector supports supporting the reflector and extending transverse to the rotation axis, and a corresponding plurality of receiver supports each connected to and extending from, or approximately from, a single end of a corresponding transverse reflector support to support the receiver above the reflector. In such cases, the linear actuator may be pivotally coupled to a transverse reflector support to rotate the support structure, the reflector, and the receiver about the rotation axis. Alternatively, the linear actuator may be pivotally coupled to a receiver support to rotate the support structure, the reflector, and the receiver about the rotation axis.

The support structure may comprises a rotation shaft coincident with the rotation axis and a lever arm attached to the rotation shaft, in which case the linear actuator may be pivotally coupled to the lever arm to rotate the rotation shaft and thereby rotate the support structure, the reflector, and the receiver about the rotation axis.

The receiver may comprise upper and lower surfaces on opposite sides of the receiver, with the lower surface of the receiver located at or approximately at the linear focus of the reflector and the upper surface of the receiver comprising solar cells arranged to face the sun when the solar energy collector (e.g., the reflector and the receiver) is oriented to concentrate solar radiation on the lower surface of the receiver. The solar cells of the upper surface of the receiver may generate sufficient electricity under a solar irradiance of at least about 100 Watts per square meter ($W/m^2$) of solar cell, at least about 150 $W/m^2$ of solar cell, at least about 200 $W/m^2$ of solar cell, at least about 250 $W/m^2$ of solar cell, at least about 300 $W/m^2$ of solar cell, at least about 350 $W/m^2$ of solar cell, or at least about 400 $W/m^2$ of solar cell to power a drive system, including the linear actuator, coupled to the support structure to rotate the support structure, the reflector, and the receiver about the rotation axis. If the receiver comprises one or more coolant channels as described above, the solar cells of the upper surface may additionally, or alternatively, power one or more pumps that pump fluid through the coolant channels.

The reflector may comprise a plurality of linearly extending reflective elements oriented parallel to the linear focus of the reflector and fixed in position with respect to each other and the receiver, with the linearly extending reflective elements arranged in two or more parallel side-by-side rows with each row including two or more of the linearly extending reflective elements arranged end-to-end. In such cases, the support structure may comprise a plurality of separate longitudinal reflector supports each of which has a long axis oriented parallel to the linear focus of the reflector and each of which comprises a channel portion parallel to its long axis, a first lip portion on one side of and parallel to the channel portion, and a second lip portion parallel to and on an opposite side of the channel portion from the first lip portion. Each of the linearly extending reflective elements may be attached to and supported by the lip portions, and bridge the channel portion, of at least a corresponding one of the longitudinal reflector supports. Each row of linearly extending reflective elements may be supported by at least a first and a second of the longitudinal reflector supports arranged end-to-end with an end portion of the first longitudinal reflector support positioned within a flared end of the channel portion of the second longitudinal reflector support.

In another aspect, a concentrating solar energy collector comprises a linearly extending reflector having a linear focus, a linearly extending receiver oriented parallel to the linear focus of the reflector and fixed in position with respect to the reflector, a support structure supporting the reflector and the receiver and pivotally mounted to accommodate rotation of the support structure, the reflector, and the receiver about a rotation axis parallel to the linear focus of the reflector, and a drive system coupled to the support structure to rotate the support structure, the reflector, and the receiver about the rotation axis. The receiver comprises upper and lower surfaces on opposite sides of the receiver, with the lower surface of the receiver located at or approximately at the linear focus of the reflector and the upper surface of the receiver comprising solar cells arranged to face the sun when the solar energy collector (e.g., the reflector and the receiver) is oriented to concentrate solar radiation on the lower surface of the receiver. The solar cells of the upper surface of the receiver generate sufficient electricity under a solar irradiance of at least about 100 Watts per square meter ($W/m^2$) of solar cell, at least about 150 $W/m^2$ of solar cell, at least about 200 $W/m^2$ of solar cell, at least about 250 $W/m^2$ of solar cell, at least about 300 $W/m^2$ of solar cell, at least about 350 $W/m^2$ of solar cell, or at least about 400 $W/m^2$ of solar cell to power the drive system.

The drive system powered by the solar cells on the upper surface of the receiver may comprise, for example, one or more motors, one or more drive shafts extending parallel to the rotation axis and driven by the one or more motors, one or more linear actuators driven by the one or more drive shafts and coupled to the support structure to rotate the support structure, the reflector, and the receiver about the rotation axis, and a controller that controls the motor and/or actuators.

The rotation axis may extend, for example in an East-West or approximately (e.g., substantially) East-West direction.

If the receiver comprises one or more coolant channels as described above, the solar cells of the upper surface may additionally, or alternatively, power one or more pumps that pump fluid through the coolant channels. Alternatively, such pumps if present may be powered by an energy source external to the solar energy collector.

The reflector may comprise a plurality of linearly extending reflective elements oriented parallel to the linear focus of the reflector and fixed in position with respect to each other and the receiver, with the linearly extending reflective elements arranged in two or more parallel side-by-side rows with each row including two or more of the linearly extending reflective elements arranged end-to-end. In such cases, the support structure may comprise a plurality of separate longitudinal reflector supports each of which has a long axis oriented parallel to the linear focus of the reflector and each of which comprises a channel portion parallel to its long axis, a first lip portion on one side of and parallel to the channel portion, and a second lip portion parallel to and on an opposite side of the channel portion from the first lip portion. Each of the linearly extending reflective elements may be attached to and supported by the lip portions, and bridge the channel portion, of at least a corresponding one of the longitudinal reflector supports. Each row of linearly extending reflective elements may be supported by at least a first and a second of the longitudinal reflector supports arranged end-to-end with an end portion of the first longitudinal reflector support positioned within a flared end of the channel portion of the second longitudinal reflector support.

In another aspect, a concentrating solar energy collector comprises a linearly extending reflector having a linear focus, a linearly extending receiver oriented parallel to and located at or approximately at the linear focus of the reflector and fixed in position with respect to the reflector, a support structure supporting the reflector and the receiver and pivotally mounted at a plurality of pivot points to accommodate rotation of the support structure, the reflector, and the receiver about a rotation axis parallel to the linear focus of the reflector, and a plurality of linear actuators each of which is pivotally coupled to the support structure near a corresponding one of the pivot points to rotate the support structure, the reflector, and the receiver about its corresponding one of the pivot points.

The solar energy collector may optionally comprise a drive shaft extending parallel to the rotation axis and mechanically coupled to the linear actuators to transmit rotational motion of the drive shaft to drive the linear actuators. The linear actuators may be pivotally coupled to the drive shaft, and the drive shaft isolated from thrust loads on the linear actuators.

The receiver may comprise upper and lower surfaces on opposite sides of the receiver, with the lower surface of the receiver located at or approximately at the linear focus of the reflector and the upper surface of the receiver comprising solar cells arranged to face the sun when the solar energy collector (e.g., the reflector and the receiver) is oriented to concentrate solar radiation on the lower surface of the receiver. The solar cells of the upper surface of the receiver may generate sufficient electricity under a solar irradiance of at least about 100 Watts per square meter ($W/m^2$) of solar cell, at least about 150 $W/m^2$ of solar cell, at least about 200 $W/m^2$ of solar cell, at least about 250 $W/m^2$ of solar cell, at least about 300 $W/m^2$ of solar cell, at least about 350 $W/m^2$ of solar cell, or at least about 400 $W/m^2$ of solar cell to power a drive system, including the linear actuators, coupled to the support structure to rotate the support structure, the reflector, and the receiver about the rotation axis. If the receiver comprises one or more coolant channels as described above, the solar cells of the upper surface may additionally, or alternatively, power one or more pumps that pump fluid through the coolant channels.

The reflector may comprise a plurality of linearly extending reflective elements oriented parallel to the linear focus of the reflector and fixed in position with respect to each other and the receiver, with the linearly extending reflective elements arranged in two or more parallel side-by-side rows with each row including two or more of the linearly extending reflective elements arranged end-to-end. In such cases, the support structure may comprise a plurality of separate longitudinal reflector supports each of which has a long axis oriented parallel to the linear focus of the reflector and each of which comprises a channel portion parallel to its long axis, a first lip portion on one side of and parallel to the channel portion, and a second lip portion parallel to and on an opposite side of the channel portion from the first lip portion. Each of the linearly extending reflective elements may be attached to and supported by the lip portions, and bridge the channel portion, of at least a corresponding one of the longitudinal reflector supports. Each row of linearly extending reflective elements may be supported by at least a first and a second of the longitudinal reflector supports arranged end-to-end with an end portion of the first longitudinal reflector support positioned within a flared end of the channel portion of the second longitudinal reflector support.

In another aspect, a concentrating solar energy collector comprises a linearly extending reflector having a linear focus, a linearly extending receiver oriented parallel to and located at or approximately at the linear focus of the reflector and fixed in position with respect to the reflector, a support structure supporting the reflector and the receiver and pivotally mounted to accommodate rotation of the support structure, the reflector, and the receiver about a rotation axis parallel to the linear focus of the reflector, a linear actuator extending transverse to the rotation axis and pivotally coupled to the support structure to rotate the support structure, the reflector, and the receiver about the rotation axis, and a drive shaft extending parallel to the rotation axis and mechanically coupled to the linear actuator to transmit rotational motion of the drive shaft to drive the linear actuator. The linear actuator may be pivotally coupled to the drive shaft, and the drive shaft isolated from thrust loads on the linear actuator.

The receiver may comprise upper and lower surfaces on opposite sides of the receiver, with the lower surface of the receiver located at or approximately at the linear focus of the reflector and the upper surface of the receiver comprising solar cells arranged to face the sun when the solar energy collector (e.g., the reflector and the receiver) is oriented to concentrate solar radiation on the lower surface of the receiver. The solar cells of the upper surface of the receiver may generate sufficient electricity under a solar irradiance of at least about 100 Watts per square meter ($W/m^2$) of solar cell, at least about 150 $W/m^2$ of solar cell, at least about 200 $W/m^2$ of solar cell, at least about 250 $W/m^2$ of solar cell, at least about 300 $W/m^2$ of solar cell, at least about 350 $W/m^2$ of solar cell, or at least about 400 $W/m^2$ of solar cell to power a drive system, including the linear actuator, coupled to the support structure to rotate the support structure, the reflector, and the receiver about the rotation axis. If the receiver comprises one or more coolant channels as described above, the solar cells of the upper surface may additionally, or alternatively, power one or more pumps that pump fluid through the coolant channels.

The reflector may comprise a plurality of linearly extending reflective elements oriented parallel to the linear focus of the reflector and fixed in position with respect to each other and the receiver, with the linearly extending reflective elements arranged in two or more parallel side-by-side rows with each row including two or more of the linearly extending reflective elements arranged end-to-end. In such cases, the support structure may comprise a plurality of separate longitudinal reflector supports each of which has a long axis oriented parallel to the linear focus of the reflector and each of which comprises a channel portion parallel to its long axis, a first lip portion on one side of and parallel to the channel portion, and a second lip portion parallel to and on an opposite side of the channel portion from the first lip portion. Each of the linearly extending reflective elements may be attached to and supported by the lip portions, and bridge the channel portion, of at least a corresponding one of the longitudinal reflector supports. Each row of linearly extending reflective elements may be supported by at least a first and a second of the longitudinal reflector supports arranged end-to-end with an end portion of the first longitudinal reflector support positioned within a flared end of the channel portion of the second longitudinal reflector support.

In another aspect, a concentrating solar energy collector comprises a linearly extending reflector having a linear focus, a linearly extending receiver oriented parallel to and located at or approximately at the linear focus of the reflector and fixed in position with respect to the reflector, and a support structure supporting the reflector and the receiver and pivotally mounted to accommodate rotation of the support structure, the reflector, and the receiver about a rotation axis parallel to the linear focus of the reflector. The reflector comprises a plurality of linearly extending reflective elements oriented parallel to the linear focus of the reflector and fixed in position with respect to each other and the receiver, with the linearly extending reflective elements arranged in two or more parallel side-by-side rows with each row including two or more of the linearly extending reflective elements arranged end-to-end. The support structure comprises a plurality of separate longitudinal reflector supports each of which has a long axis oriented parallel to the linear focus of the reflector and each of which comprises a channel portion parallel to its long axis, a first lip portion on one side of and parallel to the channel portion, and a second lip portion parallel to and on an opposite side of the channel portion from the first lip portion. Each linearly extending reflective element is attached to and supported by the lip portions, and bridge the channel portion, of at least a corresponding one of the longitudinal reflector supports. Each row of linearly extending reflective elements is supported by at least a first and a second of the longitudinal reflector supports arranged end-to-end with an end portion of the first longitudinal reflector support positioned within a flared end of the channel portion of the second longitudinal reflector support.

Optionally, in each row a single one of the linearly extending reflective elements extends the length of the first longitudinal reflector support except for its flared end, and another single one of the linearly extending reflective elements extends the length of the second longitudinal reflector support and abuts an end of the linearly reflective element supported by the first longitudinal reflector support. The ordering of the first and second longitudinal reflector supports in adjacent rows may be opposite, so that gaps or joints between the reflective elements in one row are not next to gaps or joints between reflective elements in an adjacent row.

In another aspect, a concentrating solar energy collector comprises a linearly extending reflector having a linear focus and a reflective surface that is or approximates a portion of a parabolic surface from entirely on one side of a symmetry plane of the parabolic surface, a linearly extending receiver oriented parallel to and located at or approximately at the linear focus of the reflector and fixed in position with respect to the reflector, and a support structure supporting the reflector and the receiver and pivotally mounted at a plurality of pivot points to accommodate rotation of the support structure, the reflector, and the receiver about a rotation axis parallel to the linear focus of the reflector. The support structure comprises a plurality of transverse reflector supports supporting the reflector and extending transverse to the rotation axis, and a corresponding plurality of receiver supports each connected to and extending from, or approximately from, a single end of a corresponding transverse reflector support to support the receiver above the reflector. The solar energy collector also comprises a plurality of linear actuators each of which is located near a corresponding one of the pivot points and pivotally coupled to a corresponding one of the transverse reflector supports to rotate the support structure, the reflector, and the receiver about the linear actuator's corresponding one of the pivot points, and a drive shaft extending parallel to the rotation axis and mechanically coupled to the linear actuators to transmit rotational motion of the drive shaft to drive the linear actuators. The linear actuators are pivotally coupled to the drive shaft, and the drive shaft is isolated from thrust loads on the linear actuators. The rotation axis may be oriented in an East-West or approximately East-West direction, for example.

The receiver may comprise solar cells that, in operation of the solar energy collector, are illuminated by solar radiation concentrated by the reflector onto the receiver. The receiver may additionally or alternatively comprise one or more coolant channels through which, in operation of the solar energy collector, fluid may pass to collect heat from solar radiation concentrated by the reflector onto the receiver.

The receiver may comprise upper and lower surfaces on opposite sides of the receiver, with the lower surface of the receiver located at or approximately at the linear focus of the reflector and the upper surface of the receiver comprising solar cells arranged to face the sun when the solar energy collector (e.g., the reflector and the receiver) is oriented to concentrate solar radiation on the lower surface of the receiver. The solar cells of the upper surface of the receiver may generate sufficient electricity under a solar irradiance of at least about 100 Watts per square meter ($W/m^2$) of solar cell, at least about 150 $W/m^2$ of solar cell, at least about 200 $W/m^2$ of solar cell, at least about 250 $W/m^2$ of solar cell, at least about 300 $W/m^2$ of solar cell, at least about 350 $W/m^2$ of solar cell, or at least about 400 $W/m^2$ of solar cell to power a drive system, including the linear actuators, coupled to the support structure to rotate the support structure, the reflector, and the receiver about the rotation axis. If the receiver comprises one or more coolant channels as described above, the solar cells of the upper surface may additionally, or alternatively, power one or more pumps that pump fluid through the coolant channels.

The reflector may comprise a plurality of linearly extending reflective elements oriented parallel to the linear focus of the reflector and fixed in position with respect to each other and the receiver, with the linearly extending reflective elements arranged in two or more parallel side-by-side rows with each row including two or more of the linearly extending reflective elements arranged end-to-end. In such cases, the support structure may comprises a plurality of separate longitudinal reflector supports each of which has a long axis oriented parallel to the linear focus of the reflector and each of which comprise a channel portion parallel to its long axis, a first lip portion on one side of and parallel to the channel portion, and a second lip portion parallel to and on an opposite side of the channel portion from the first lip portion. Each of the linearly extending reflective elements may be attached to and supported by the lip portions, and bridge the channel portion, of at least a corresponding one of the longitudinal reflector supports. Each row of linearly extending reflective elements may be supported by at least a first and a second of the longitudinal reflector supports arranged end-to-end with an end portion of the first longitudinal reflector support positioned within a flared end of the channel portion of the second longitudinal reflector support.

In another aspect, a concentrating solar energy collector comprises a linearly extending reflector having a linear focus, a linearly extending receiver oriented parallel to and located at or approximately at the linear focus of the reflector and fixed in position with respect to the reflector, a support structure supporting the reflector and the receiver and pivotally mounted to accommodate rotation of the support structure, the reflector, and the receiver about a rotation axis parallel to the linear focus of the reflector, and a first solar radiation sensor that, when illuminated by solar radiation concentrated by the reflector, generates a signal by which rotation of the support structure, the reflector, and the receiver may be controlled to maximize concentration of solar radiation onto the receiver. The first solar radiation sensor may be located, for example, in a focal region of the reflector.

The first solar radiation sensor may optionally comprises two solar radiation detectors positioned on opposite sides of a center line of the linear focus of the reflector, each of which is optionally elongated in a direction transverse to the linear focus of the reflector.

The solar energy collector may also comprise a second solar radiation sensor positioned to be illuminated directly by solar radiation not concentrated by the reflector. The second solar radiation sensor may generate a signal by which rotation of the support structure, the reflector, and the receiver may be controlled to illuminate the first solar radiation sensor with solar radiation concentrated by the reflector. The second solar radiation sensor may, for example, be fixed in position with respect to reflector and the receiver and located in a plane oriented perpendicular to an optical axis of the reflector.

The second solar radiation sensor may comprise, for example, a linearly elongated gnomon and two linearly elongated solar radiation detectors positioned on opposite sides of the gnomon, with the long axes of the gnomon and the linearly elongated solar radiation detectors arranged parallel to the linear focus of the reflector.

In another aspect, a method of collecting solar energy comprises orienting a concentrator to maximize or substantially maximize concentration of solar radiation onto a receiver through which a fluid is flowed to collect heat, thereby shading a surface underlying the concentrator from direct solar radiation. The method further comprises reorienting the concentrator to reduce the amount of solar radiation concentrated on the receiver, while maintaining significant shading of the surface underlying the concentrator, when a temperature of the fluid exceeds a predetermined value.

The reoriented concentrator may block, for example, at least about 70%, about 80%, about 90%, or about 95% of the amount of solar radiation that the concentrator would block if oriented to maximize concentration of solar radiation onto the receiver. The predetermined temperature may be, for example, at least about 70° C., about 75° C. about 80° C., about 85° C., about 90° C., or about 95° C.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIGS. 1A-1C show an example solar energy collector.

FIGS. 3A-3D show perspective (3A), side (3B), and end (3C, 3D) views of examples of a linearly extending reflective element attached to and supported by a longitudinal reflector support.

FIG. 4A shows a side view of the example solar energy collector of FIGS. 1A-1C, absent its reflector, including details of a transverse reflector support; FIG. 4B shows the portion of the example longitudinal transverse reflector support of FIG. 3E supported by a portion of a transverse reflector support as shown, for example, in FIG. 4A.

FIGS. 5A-5C show an example arrangement for mounting a portion of a reflector-receiver arrangement (e.g., module) of a solar energy collector on a rotation shaft.

FIGS. 11A-11B show another example solar energy collector.

FIGS. 15a and 15b show, respectively, example solar energy collectors comprising five and six of the solar energy collectors of FIG. 13.

FIGS. 16A-16C show perspective, exploded, and cross-sectional views of an example gear assembly that may be used to drive linear actuators in some example solar energy collectors disclosed herein.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries rather than to require that parallel rows of reflectors, for example, or any other parallel arrangements described herein be exactly parallel.

This specification discloses apparatus, systems, and methods by which solar energy may be collected to provide electricity, heat, or a combination of electricity and heat. Solar energy collectors as disclosed herein may be used, for example, in some variations of the methods, apparatus, and systems disclosed in U.S. patent application Ser. No. 12/788,048, filed May 26, 2010, titled "Concentrating Solar Photovoltaic-Thermal System," incorporated herein by reference in its entirety.

Figure 1A:
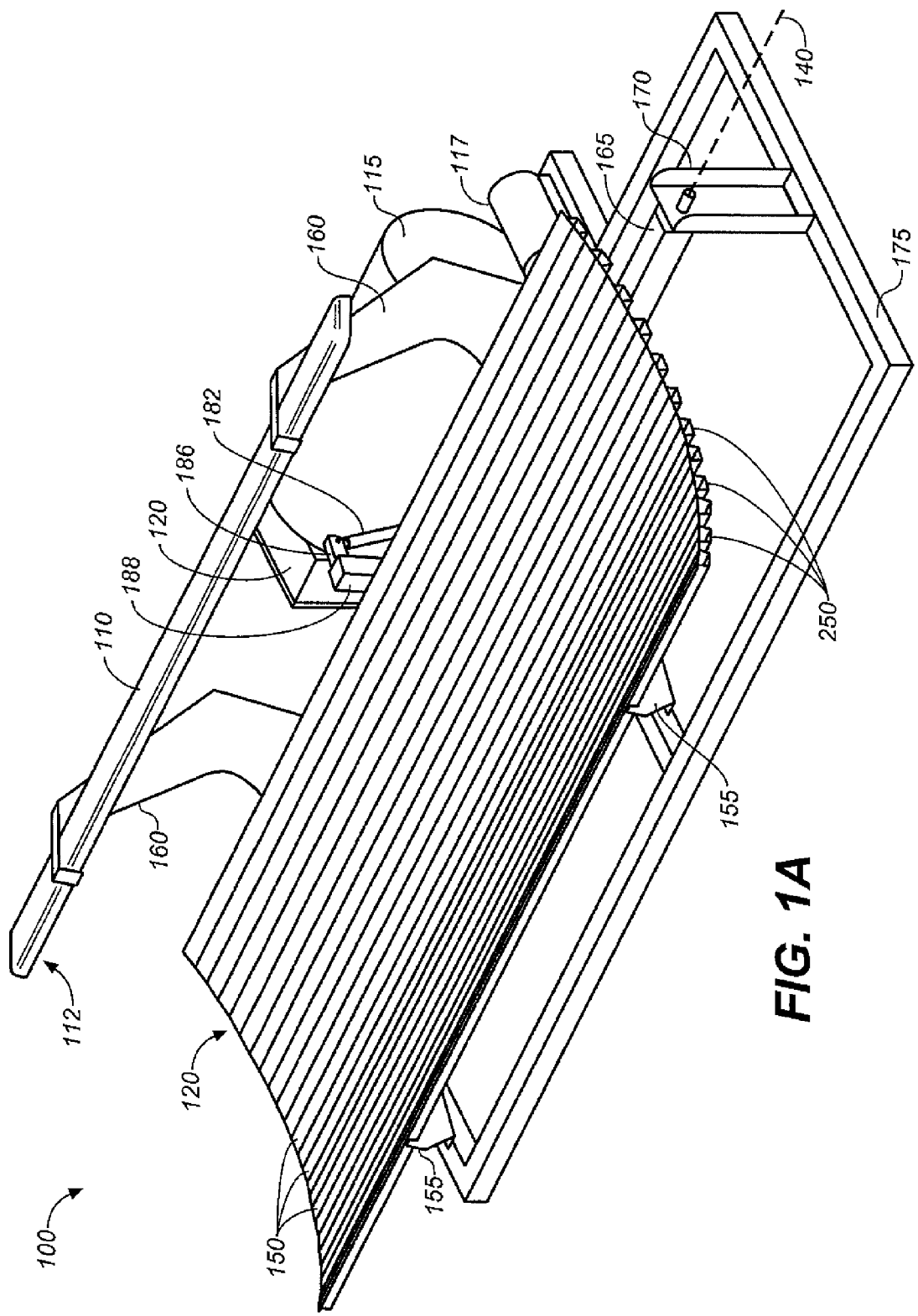
Figure 1B:
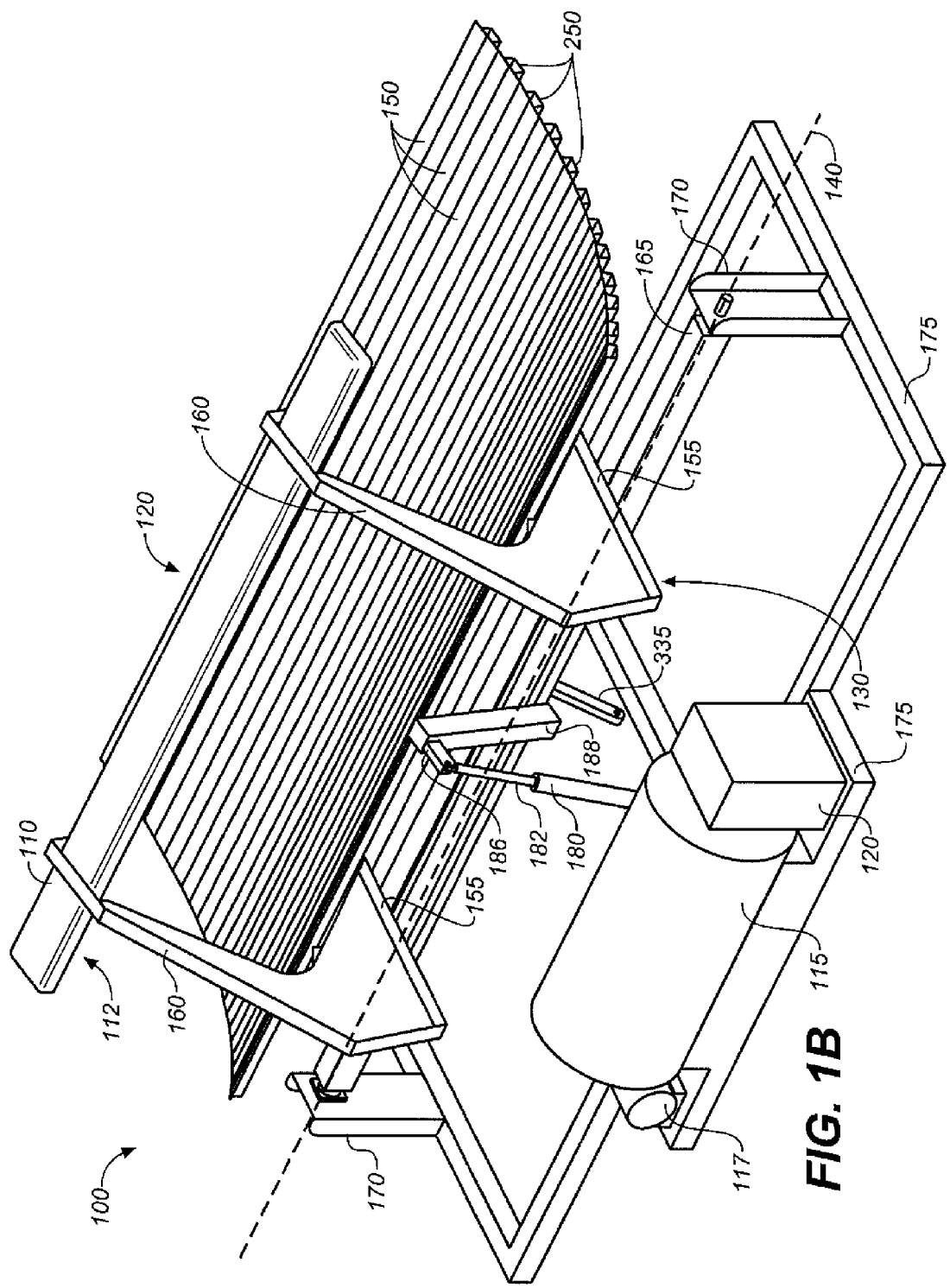

Referring now to FIGS. 1A-1C, an example solar energy collector 100 comprises a linearly extending reflector 120, a linearly extending receiver 110 comprising a surface 112 located at or approximately at the linear focus of the reflector and fixed in position with respect to the reflector, and a support structure 130 supporting the reflector and the receiver and pivotally mounted to accommodate rotation of the support structure, the reflector, and the receiver about a rotation axis 140 parallel to the linear focus of the reflector. In use, the support structure, reflector, and receiver are rotated about rotation axis 140 to track the sun such that solar radiation incident on reflector 120 is concentrated onto receiver 110, i.e., such that the optical axes of reflector 120 are directed at the sun. (Any path perpendicular to the linear focus of reflector 120 for which light rays traveling along that path are focused by the reflector onto the centerline of the receiver is an optical axis of reflector 120 and collector 100).

In the illustrated example, the reflective surface of reflector 120 is or approximates a portion of a parabolic surface. Referring now to the graph in FIG. 2, a parabolic surface 132 may be constructed mathematically (in a coordinate space spanned by axes x, y, z, as shown, for example) by translating a parabola 134 along an axis 136 (in this example, the y axis) perpendicular to the plane of the parabola (in this example, the x, z plane). Symmetry plane 137 (the y, z plane in this example) divides parabolic surface 132 into two symmetric halves 132a, 132b. The linear focus 138 of the parabolic surface is oriented perpendicular to the plane of the parabola and lies in symmetry plane 137 at a distance F (the focal length) from the parabolic surface. For parabolic reflective surfaces as in this example, the optical axes are in the symmetry plane of the surface and oriented perpendicularly to the linear focus of the surface. In this example, the z axis is an optical axis of the reflector.

Figure 2:
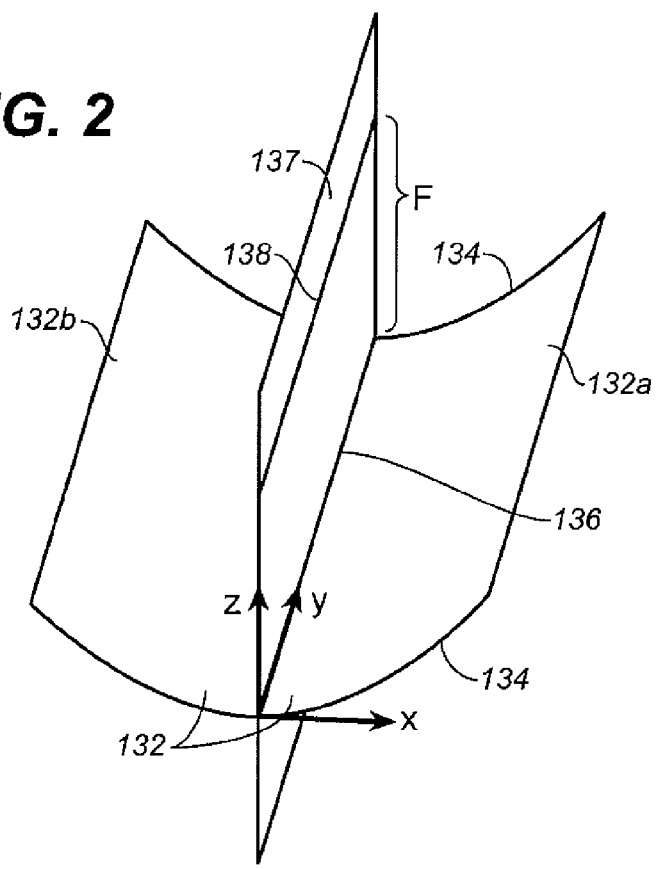
FIG. 2 shows a graph of a parabolic surface and its symmetry plane, by which features of some solar energy collectors disclosed herein may be better understood.

Referring again to FIGS. 1A-1C, in the illustrated example the reflective surface of reflector 120 is or approximates a portion of a parabolic surface taken entirely from one side of the symmetry plane of the parabolic surface (e.g., from 132a or 132b in FIG. 2, but not both). In other variations, the reflective surface of reflector 120 is or approximates a portion of a parabolic surface taken from primarily one side of the symmetry plane of the parabolic surface (e.g., more than 50%, more than 60%, more than 70%, more than 80%, more than 90%, or more than 95% of the reflective surface is from one side of the symmetry plane of the parabolic surface), but includes a portion of the parabolic surface on the other side of the symmetry plane, as well.

Although reflector 120 is parabolic or approximately parabolic in the illustrated example, reflector 120 need not have a parabolic or approximately parabolic reflective surface. In other variations of solar energy collectors disclosed herein, reflector 120 may have any curvature suitable for concentrating solar radiation onto a receiver.

In the illustrated example, reflector 120 comprises a plurality of linearly extending reflective elements 150 (e.g., mirrors) oriented parallel to the rotation axis and fixed in position with respect to each other and with respect to the receiver. Linear reflective elements 150 may each have a length equal or approximately equal to that of reflector 120, in which case they may be arranged side-by-side to form reflector 120. (Reflector 120 may have a length, for example, of about 5 meters to about 12 meters, in some variations about 11.2 meters, in some variations about 6 meters). Alternatively, some or all of linear reflective elements 150 may be shorter than the length of reflector 120, in which case two or more linearly extending reflective elements 150 may be arranged end-to-end to form a row along the length of the reflector, and two or more such rows may be arranged side-by-side to foam reflector 120.

Linearly extending reflective elements 150 may each have a width, for example, of about 8 centimeters to about 15 centimeters, and a length, for example, of about 1.2 meters to about 3.2 meters. In some variations, some or all of reflective elements 150 have a width of about 10.7 centimeters. In some variations, some or all of reflective elements 150 have a width of about 13.2 centimeters. The widths of reflective elements 150 may vary with position in reflector 120. For example, in some variations reflective elements 150 located further away from receiver 110 are wider than reflective elements 150 located closer to receiver 110 (see, e.g., FIG. 15B described below). Reflective elements 150 may be flat, substantially flat, or curved (e.g., along a direction transverse to their long axes to focus incident solar radiation).

Although in the illustrated example reflector 120 comprises linearly extending reflective elements 150, in other variations reflector 120 may be formed from a single continuous reflective element, from two or more reflective elements with a width perpendicular to the rotation axis greater than their length along the rotation axis, or in any other suitable manner.

Linearly extending reflective elements 150, or other reflective elements used to form a reflector 120, may be or comprise, for example, any suitable front surface mirror or rear surface mirror. The reflective properties of the mirror may result, for example, from any suitable metallic or dielectric coating or polished metal surface. Some variations may utilize a mirror having a laminated structure as described later in this specification. Some other variations may utilize a rear surface mirror formed with low-iron glass having a thickness of about 3 to about 4 millimeters.

Receiver 110 may comprise solar cells (not shown) located, for example, on receiver surface 112 to be illuminated by solar radiation concentrated by reflector 120. In such variations, receiver 110 may further comprise one or more coolant channels accommodating flow of liquid coolant in thermal contact with the solar cells. For example, liquid coolant (e.g., water, ethylene glycol, or a mixture of the two) may be introduced into and removed from receiver 110 through manifolds (not shown) at either end of the receiver located, for example, on a rear surface of the receiver shaded from concentrated radiation. Coolant introduced at one end of the receiver may pass, for example, through one or more coolant channels (not shown) to the other end of the receiver from which the coolant may be withdrawn. This may allow the receiver to produce electricity more efficiently (by cooling the solar cells) and to capture heat (in the coolant). Both the electricity and the captured heat may be of commercial value.

FIGS. 1A and 1B also show optional coolant storage tank 115, pump 117, and controller 120. Coolant may be stored in tank 115 and pumped by pump 117 from tank 115 to receiver 110 (through coolant conduits, e.g., not shown), through receiver 110, and back to tank 115. Pump 115 may be controlled by controller 120 based, for example, on temperature measurements of coolant entering and/or leaving receiver 110.

In some variations, the receiver comprises solar cells but lacks channels through which a liquid coolant may be flowed. In other variations, the receiver may comprise channels accommodating flow of a liquid to be heated by solar energy concentrated on the receiver, but lack solar cells.

Solar energy collector 100 may comprise any suitable receiver. In addition to the examples illustrated herein, suitable receivers may include, for example, those disclosed in U.S. patent application Ser. No. 12/622,416, filed Nov. 19, 2009, titled "Receiver For Concentrating Photovoltaic-Thermal System;" and U.S. patent application Ser. No. 12/774,436, filed May 5, 2010, also titled "Receiver For Concentrating Photovoltaic-Thermal System;" both of which are incorporated herein by reference in their entirety.

Figure 8A:
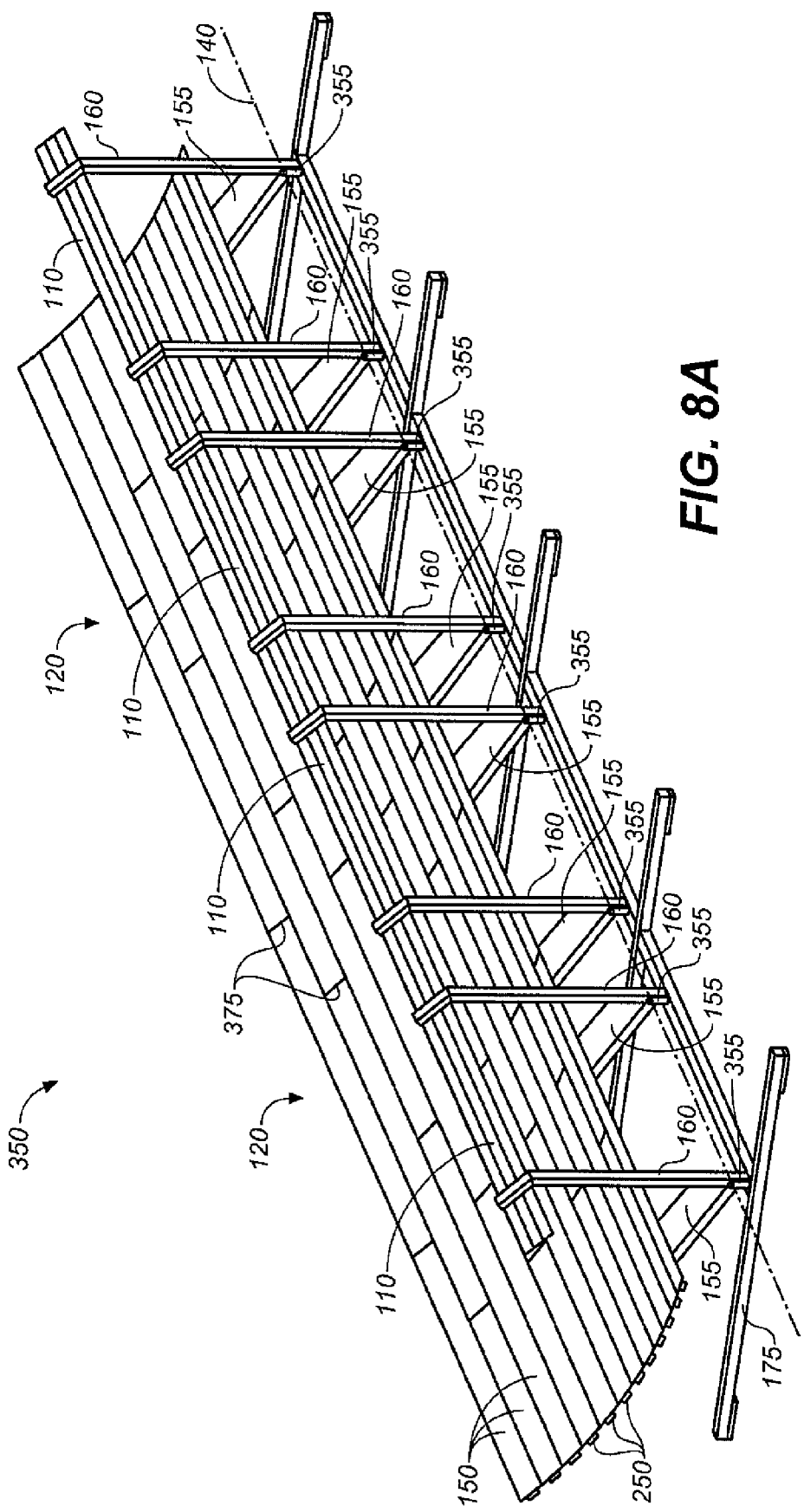
FIGS. 8A-8B show another example solar energy collector.

In some variations, receiver 110 is the same length, or approximately the same length, as reflector 120 and centered length-wise over reflector 120 (e.g., the examples of FIGS. 8A and 11A). In some variations, receiver 110 is shorter than reflector 120 and centered length-wise over reflector 120 (e.g., the examples of FIGS. 6A and 6B). In some variations receiver 110 is the same length, or approximately the same length, as reflector 120 and positioned length-wise with respect to reflector 120 such that one end of receiver 110 extends beyond a corresponding end of reflector 120 (not shown). In some variations, receiver 110 is shorter than reflector 120, and positioned with one end approximately in line with a corresponding end of reflector 120 (not shown). In the latter variations, the other end of receiver 110 does not extend to the other end of reflector 120.

In some variations, surface 112 of receiver 110 is tilted to face reflector 120. In the illustrated example, the reflective surface of reflector 120 is or approximates a portion of a parabolic surface, and receiver surface 112 is tilted away from an orientation that would make it perpendicular to the symmetry plane of that parabolic surface by about 45 degrees. In other variations, surface 112 may be tilted, for example, at an angle of about 30 degrees to about 60 degrees from an orientation perpendicular to the symmetry plane. Surface 112 may also be tilted to face reflector 120 in variations in which reflector 120 is not parabolic or approximately parabolic. In the illustrated example, the periphery (edges) of surface 112 defines the optical aperture of receiver 110. In some variations, receiver 110 may absorb solar radiation on an internal surface, after the solar radiation passes through an optical aperture of the receiver. In such variations, the optical aperture of receiver 110 (though not defined by an external surface as in the illustrated example) may be tilted to face reflector 120 as just described for surface 112.

In some variations, support structure 130 supports receiver 110 above and off-center of reflector 120. In the illustrated example, the reflective surface of reflector 120 is or approximates a portion of a parabolic surface, and receiver 110 is located closer to the edge of reflector 120 nearest the symmetry plane of the parabolic surface. In other variations, receiver 110 may be supported above reflector 120 in a different location.

In some variations, in use, the receiver is illuminated by concentrated solar radiation that under-fills the receiver. For example, more than about 80%, more than about 85%, more than about 90%, or more than about 95% of the energy of the concentrated solar radiation may be incident on the receiver in a region having a width (transverse to the long axis of the receiver) that is about 75%, about 80%, about 85%, about 90%, or about 95% of the overall width of the receiver (or of that portion of the receiver comprising solar cells). In some variations at least about 90%, or at least about 95% of the solar energy incident on the solar cells is concentrated on a central portion of the linear array of solar cells having a width, perpendicular to the long axis of the array of solar cells, of less than about 80% of the corresponding width of the linear array of solar cells. Under-filling the receiver in this manner may increase the efficiency with which concentrated solar radiation is collected and converted to useful electricity or heat.

Such under-filling may be accomplished, for example, by selecting the width of linearly extending reflective elements 150 (and their transverse curvature, if they are not flat or substantially flat) to provide the desired concentrated solar radiation intensity distribution on the illuminated receiver surface.

Referring again to FIGS. 1A-1C, in the illustrated example support structure 130 comprises a plurality of transverse reflector supports 155 supporting the reflector and extending transverse to rotation axis 140 and/or to a long axis of the reflector, and a plurality of receiver supports 160 each connected to and extending from an end, or approximately an end, of a transverse reflector support to support the receiver over the reflector. In the illustrated example, a single unitary support structure comprises a transverse reflector support 155 portion and a receiver support portion 160. In other variations, including examples described later in this specification (e.g., FIGS. 8A-15B), a transverse reflector support and a receiver support may be separate pieces attached to each other at, or approximately at, an end of the transverse reflector support. In yet other variations, any other suitable structure may be used to support the reflector and the receiver.

In the illustrated example, transverse reflector supports 155 in combination with receiver supports 160 faun "C" shapes. In other variations, transverse reflector supports 155 in combination with receiver supports 160 may form, for example, "V" shapes, "L" shapes, or any other suitable geometry.

In the illustrated example, transverse reflector supports 155 are attached to a shaft 165 (also shown separately in FIG. 5C) pivotally supported by bearings on support posts 170. Support posts 170 support the shaft 165 and other components of support structure 130 above a base 175. Base 175 may be installed, for example, at ground level, on a rooftop, or in any other suitable location. Base 175 is optional. For example, in some variations posts 170 may directly support components of support structure 130 at or above ground level or on a rooftop, for example.

In the illustrated example, rotation axis 140 is coincident with shaft 165, which is located approximately under and parallel to an edge of reflector 120 nearest receiver 110. In some variations, the reflective surface of reflector 120 is or approximates a portion of a parabolic surface, and rotation axis 140 lies in the symmetry plane of the parabolic surface. In other variations, rotation axis 140 may be located elsewhere.

In the illustrated example, a linear actuator 180 comprising an extensible shaft 182 is mechanically coupled between a pivotal connector 184 on base 175 and a pivotal connector 186 on a vertically extending lever arm 188 attached to shaft 165. Linear actuator 180 may rotate shaft 165 (and hence reflector 120 and receiver 110) around rotation axis 140 to track the motion of the sun by extending or retracting extensible shaft 182. In the absence of base 175, linear actuator 180 may be coupled, for example, to a pivotal connector on or attached to the ground, a rooftop, or a separate support structure. In some variations, linear actuator 180 may be controlled, for example, by a locally positioned controller such as controller 120 shown in FIGS. 1A and 1B.

Other variations, some of which are described below (e.g., FIGS. 8A-17), may utilize a differently positioned linear actuator to rotate reflector 120 and receiver 110 around rotation axis 140. In some variations described below (e.g., FIGS. 13-17), the linear actuators are or comprise lead screws driven by a shared drive shaft to rotate reflector 120 and receiver 110 around rotation axis 140. Any other suitable actuators or mechanisms and mounting arrangements that allow receiver 110, reflector 120, and support structure 130 to be rotated around a rotation axis parallel to a linear focus of reflector 120 to track the sun may also be used.

Solar energy collector 100 as illustrated, and its variations as described throughout this specification, may be arranged with rotation axis 140 oriented in an East-West, or approximately East-West, direction. The solar energy collector may be positioned with the receiver side of reflector 120 positioned closest to the earth's equator or, in other variations, with the receiver side of reflector 120 positioned away from the equator and closest to the earth's (North or South, depending on hemisphere) pole.

In such East-West orientations, the daily motion of the sun in the sky may require a rotation of reflector 120 and receiver 110 around rotation axis 140 of, for example, less than about 90 degrees (e.g., less than about 70 degrees) to collect a valuable quantity of incident solar radiation during the course of a day. A rotation mechanism utilizing a linear actuator as illustrated, for example, may effectively and inexpensively accomplish such a range of motion. Utilizing a reflective surface that is or approximates a portion of a parabolic surface taken entirely or primarily from one side of the symmetry plane of the parabolic surface may provide a compact reflector that may be rotated about a rotation axis located close to supporting surfaces, particularly in variations in which the rotation axis is near an edge of the reflector.

As described in more detail below, support structure 130 may comprise longitudinal reflector supports each of which has a long axis oriented parallel to the rotation axis 140 and each of which supports a linearly extending reflective element 150, or a single row of linearly extending reflective elements 150 arranged end-to-end. The linearly extending reflective element or elements may be attached, for example, to an upper surface of the longitudinal reflector support. Transverse reflector supports 155, if present, may support such longitudinal reflector supports, directly support mirrors or other reflective elements, or support some other intermediate structure that in turn supports mirrors or other reflective elements.

Figure 3A:
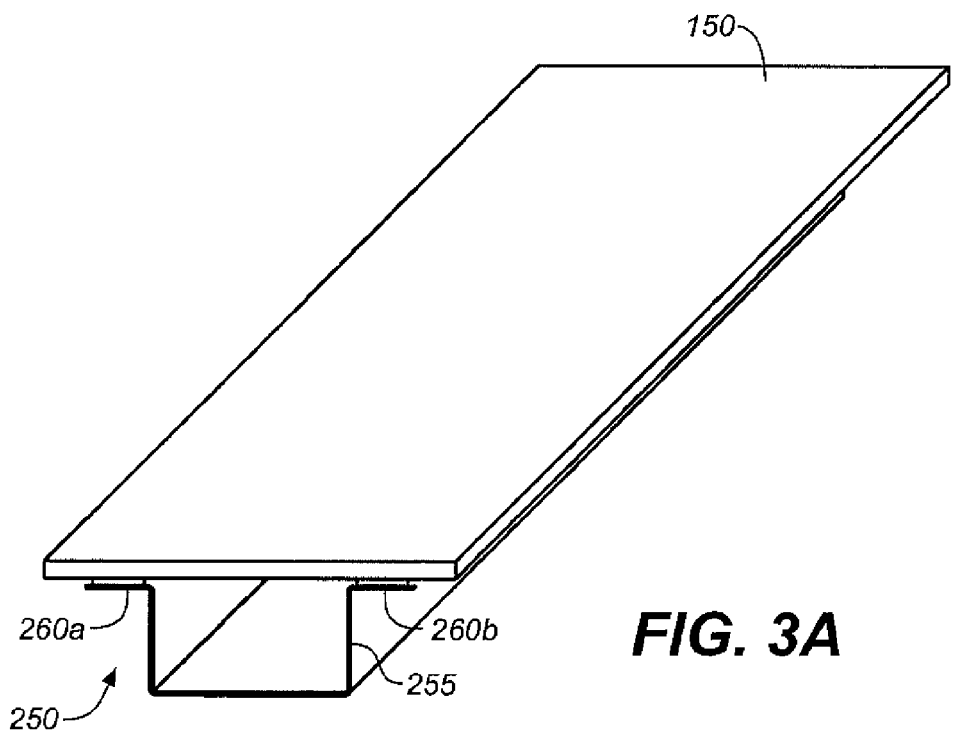

Referring now to FIGS. 3A (perspective view), 3B (side view), and 3C (end or cross-sectional view), an example longitudinal reflector support 250 comprises a channel portion 255 parallel to its long axis, a first planar lip portion 260a on one side of and parallel to channel portion 255, and a second planar lip portion 260b parallel to and on an opposite side of channel portion 255 from the first lip portion 260a. Linearly extending reflective elements 150 are attached to and supported by lip portions 260a, 260b, and bridge channel portion 255, of longitudinal reflector support 250. In other variations, lip portions 260a and 260b need not be planar, as illustrated. Any suitable profile or shape for lip portions 260a, 260b may be used.

In the example illustrated in FIGS. 3A-3C, linearly extending reflective elements 150 are attached to lip portions 260a, 260b by adhesive or glue pads 265. The adhesive or glue pads may be spaced, for example, at intervals of about 0.2 meters under the reflective elements. In some other variations, linearly extending reflective elements 150 are attached to longitudinal reflector supports with a silicone adhesive such as, for example, DOW Corning® 995 Silicone Structural Sealant. Any other suitable method of attaching the reflective elements to the longitudinal reflector support may be used, including other adhesives or glues deployed in any other suitable manner, screws, bolts, rivets and other similar mechanical fasteners, and clamps or spring clips.

In the illustrated example, longitudinal reflector support 250 is about 11.2 meters long, channel portion 255 extends the length of longitudinal reflector support 250 and is about 10.5 centimeters wide and about 3.5 centimeters deep, and lip portions 260a and 260b extend the length of longitudinal reflector support 250 and are about 2.0 centimeters wide. Linearly extending reflective elements 150 are about 10.7 centimeters wide in this example. In the example illustrated in FIGS. 1A-1C, each linearly extending reflective element is as long as reflector 120. In other variations (e.g., the examples of FIGS. 3B, 8A, and 11A further described below), two or more linearly extending reflective elements are attached end-to-end along a longitudinal reflector support with, for example, a spacing of about 1 millimeter between reflective elements.

Individual longitudinal reflector supports as disclosed herein may extend the length of the reflector. Alternatively, some or all of the longitudinal reflector supports may be shorter than the overall length of the reflector, in which case two or more longitudinal reflector supports may be arranged end-to-end to form a row along the length of the reflector. Longitudinal reflector supports may have lengths that allow them, for example, to be easily handled by an individual person and/or easily transported to, for example, a roof top on which a solar energy collector is being assembled. Longitudinal reflector supports may have lengths, for example, of about 1.0 meters to about 3 meters, about 1 meters to about 5 meters, about 1 meters to about 12.0 meters, about 3.0 meters to about 5.0 meters, about 3 meters to about 12 meters, about 5 meters to about 12 meters, about 2.8 meters, about 3.2 meters, and about 6.0 meters. Channel portions 255 may be, for example, about 8 centimeters to about 15 centimeters wide and about 2.0 centimeters to about 8.0 centimeters deep. Lip portions 260a, 260b may be, for example, about 1.0 centimeters to about 4.0 centimeters wide.

Referring now to FIG. 3D, in another example a longitudinal reflector support 265 is substantially similar to longitudinal reflector support 250 just described, except that longitudinal reflector support 265 further comprises slot portions 270a, 270b at the ends of lip portions 260a, 260b. In this example, linearly extending reflective elements 150 may be loaded onto longitudinal reflector support 265 by sliding the reflective elements in from the end of the reflector support. Slot portions 270a, 270b help maintain linearly extending reflective elements 150 in position. Adhesives, glues, clamps, or mechanical fasteners, for example, may be used to further secure the reflective elements to the reflector supports.

In the examples illustrated in FIGS. 3A-3D, the longitudinal reflector supports 250, 265 are trough shaped with a cross section having a flat-bottomed "U" shape. In other variations, the longitudinal reflector supports may be trough shaped with, for example, a rounded bottom "U" shape cross-section, a "V" shape cross-section, or an upside-down Ω (Greek letter Omega) cross-section. In other variations, the longitudinal reflector support may comprise multiple channel portions (e.g., 2, 3, or more than 3), side-by-side in parallel, between lip portions 260a and 260b. In such variations, the longitudinal reflector support may have, for example, a W shaped cross section or a cross-section that may be viewed as composed of multiple V or U shapes side-by-side.

Figure 3E:
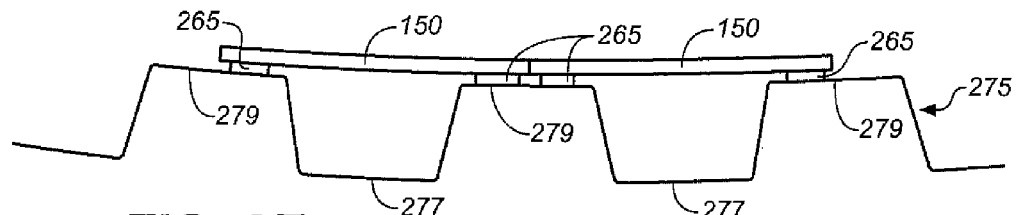
FIG. 3E shows an end view of linearly extending reflective elements attached to and supported by a portion of another example longitudinal reflector support.

Referring now to FIG. 3E (end or cross-sectional view), another example longitudinal reflector support 275 has the form of a corrugated sheet of material (e.g. a corrugated sheet of metal) comprising troughs 277 and crests 279. Longitudinal reflector support 275 supports two or more parallel rows of reflective elements 150. Reflective elements 150 may be attached to crests 279 with glue pads 265, for example. Each row of reflective elements 150 may comprise a plurality of reflective elements arranged end-to-end (e.g., as described above), or a single reflective element extending the length of longitudinal reflector support 275. In solar energy collectors 100 as described herein, a longitudinal reflector support 275 may be substituted, for example, for two or more longitudinal reflector supports 250 or 265 supporting an equivalent total number of rows of reflective elements 150. Longitudinal reflector supports 275 may have lengths similar or the same as longitudinal reflector supports 250 and 265. The depth and width of troughs 270 may be similar or equivalent to corresponding dimensions in longitudinal reflector supports 250 and 265.

Longitudinal reflector support 275 may comprise sufficient troughs 277 and crests 279 to support all rows of reflective elements 155 in a particular solar energy collector 100. Alternatively, a solar energy collector 100 may comprise two or more longitudinal reflector supports 275. In the latter case, different longitudinal reflector supports 275 may have troughs and crests dimensioned to accommodate linear reflective elements of different widths. A single longitudinal reflector support 275 may, in some variations, include troughs of two or more sizes and crests of two or more sizes to accommodate linear reflective elements of two or more different widths.

Figure 3F:
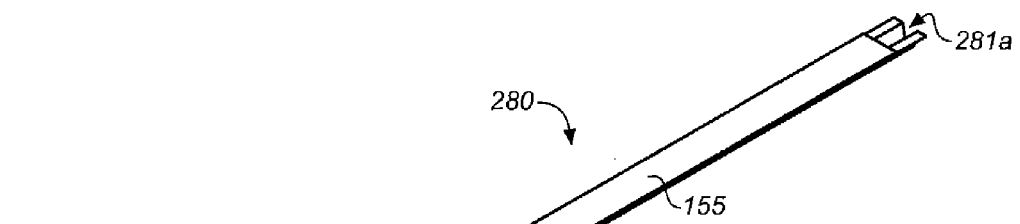
FIGS. 3F and 3G show perspective views of reflectors attached to additional example longitudinal reflector supports.
Figure 3G:
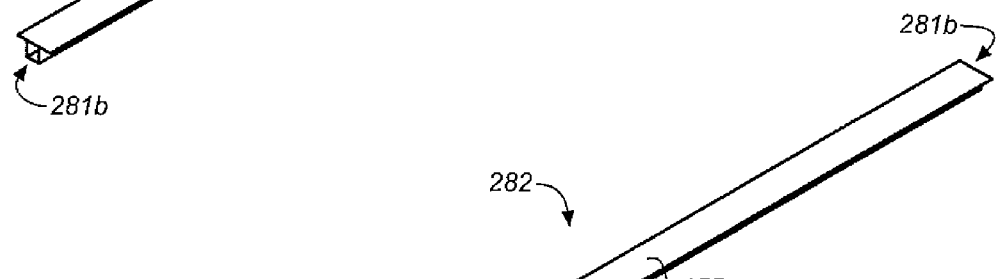
Figure 3H:
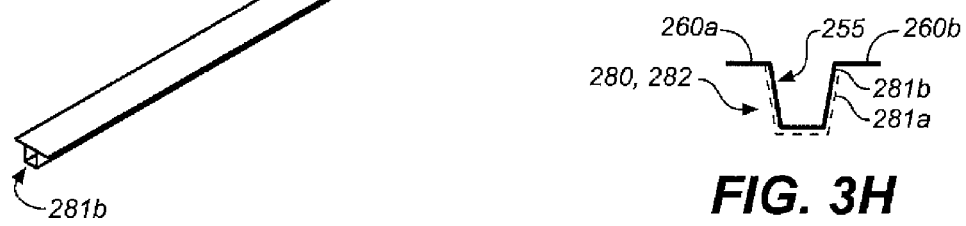
FIG. 3H shows a cross-sectional view of the longitudinal reflector supports of FIGS. 3F and 3G.

Referring now to FIGS. 3F-3H, some variations comprise one or more longitudinal reflector supports 280 differing from those described so far. Longitudinal reflector support 280 comprises a channel portion 255 and lip portions 260a, 260b similar to previously described variations. However, longitudinal reflector support 280 differs from previously described variations in that at one end 281a the channel portion 255 is flared outward compared to its dimensions along the rest of its length and at its other end 281b. One or more linearly extending reflective elements 155 are attached to longitudinal reflector support 280 similarly to as described above for other variations, except that flared end portion 281a is left uncovered by the reflective elements. As further described below with reference to FIG. 4C, two or more such assemblies of longitudinal reflector support 280 and reflective elements 155 may be arranged end to end with unflared end portions 281b of longitudinal support structures 280 positioned within flared end portions 281a of adjacent longitudinal reflector supports 280. The flared 281a and unflared 281b end portions of channels 255 may be dimensioned so that the outer surface of an unflared end portion 281b fits closely within the inner surface of a flared end 281a to allow for easy mechanical coupling of adjacent in-line longitudinal reflector supports. In such an arrangement, the edges of linearly extending reflective elements 155 supported by adjacent in-line longitudinal supports 280 may abut (with an optional gap, for example, of about 1 millimeter) to form a substantially continuous reflective surface.

Such variations may further include a longitudinal reflector support 282 having the same general configuration as longitudinal reflector support 280, except that both of its ends 281b are unflared and one or more linearly extending reflective elements 155 extend its full length. Either end 281b of longitudinal reflector support 282 may be positioned within the flared end portion 281a of an adjacent in-line longitudinal reflector support 280. A row of longitudinal reflector supports may thus include, for example, one or more longitudinal reflector supports 280 arranged end-to-end followed by one longitudinal reflector support 282 ending the row (see, e.g., FIG. 4C).

Longitudinal reflector supports 280, 282 may have lengths similar or the same as longitudinal reflector supports 250 and 265 described above. The depth and width of channel portions 255 of longitudinal reflector supports 280, 282 may be similar or equivalent to corresponding dimensions in longitudinal reflector supports 250 and 265. Longitudinal reflector supports 280 and 282 as used in the same collector may be of the same length or of different lengths.

Longitudinal reflector supports may be formed, in some variations, from sheet steel, sheet aluminum, or other sheet metals. In some variations, the lips and channel portion (and slot portions, if present) of a longitudinal reflector support as illustrated in FIGS. 3A-3D and 3F-3H, for example, may be rolled, folded, or otherwise formed from a continuous piece of sheet metal. In some variations, the corrugated structure (e.g., troughs and crests) of a longitudinal reflector support as illustrated in FIG. 3E, for example, may be rolled, folded, or otherwise formed from a continuous piece of sheet metal. In some variations, longitudinal reflector supports as illustrated are formed from a continuous sheet of steel having a thickness of about 1 millimeter.

Longitudinal reflector supports as disclosed herein may also be utilized as suitable in any other solar energy collectors. For example, longitudinal reflector supports as disclosed herein may be used in solar energy collectors as disclosed in U.S. patent application Ser. No. 12/781,706, filed May 17, 2010, and titled "Concentrating Solar Energy Collector," which is incorporated herein by reference in its entirety.

As noted above, support structure 130 may comprise a plurality of transverse reflector supports that extend away from the rotational axis 140 and directly support mirrors or other reflective elements or, alternatively, support mirrors or reflective elements via longitudinal reflector supports as disclosed herein or via any other suitable additional reflector support structure.

Figure 4C:
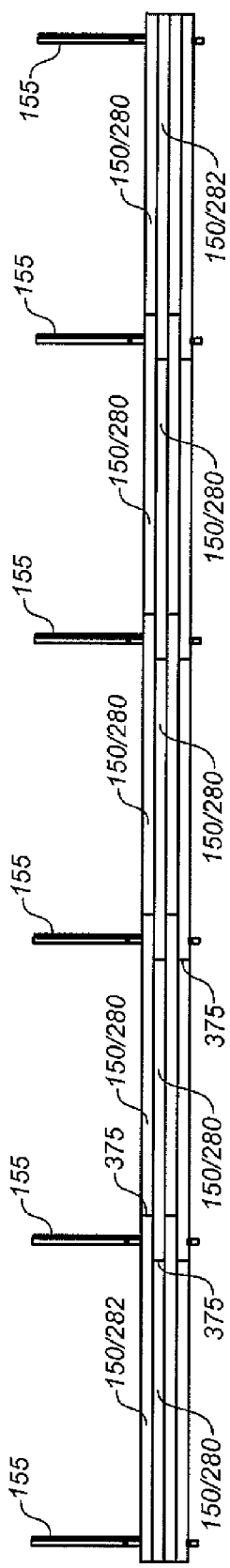
FIG. 4C shows a top view of reflector/longitudinal reflector support assemblies of FIGS. 3F and 3G attached to transverse reflector supports.

Referring now to FIGS. 1A-1C, and particularly to FIGS. 4A-4C, in the illustrated example transverse reflector supports 155 in solar energy collector 100 each comprise a notched, edge 285. Portions of surfaces 300 adjacent to the notches in transverse reflector supports 155 may be cut to define desired orientations of linearly extending reflective elements to be supported by the transverse reflector supports. Each notch in an upper surface of a transverse reflector support 155 (e.g., FIGS. 4A-4C) corresponds to a separate row of one or more longitudinal reflector supports (e.g., 250, 265, 280, 282; FIGS. 3A-3D, 3F-3H) or to a separate trough 277 or row of troughs 277 in one or more longitudinal reflector supports 275. Each notch in a transverse reflector support 155 is aligned with a similarly or identically placed notch (corresponding to the same row of longitudinal reflector supports or troughs) in the other transverse reflector support (or supports) in solar energy collector 100. The channel portions 255 of the longitudinal reflector supports 250, 265, 280, 282 (or the troughs 277 in longitudinal reflector supports 275) are positioned in corresponding notches of the transverse reflector supports 155. The lip portions 260a, 260b of the longitudinal reflector supports 250, 265, 280, 282 (or the crests 279 of the longitudinal reflector supports 275) are then in contact with and supported by portions of surfaces 300 of the transverse reflector supports adjacent to the corresponding notches. Surfaces 300 may orient the longitudinal reflector supports, and thus the linearly extending reflective elements 150 they support, in a desired orientation with respect to receiver 110 with a precision of about 0.5 degrees, for example, or better (i.e., tolerance less than about 0.5 degrees). In other variations, this tolerance may be, for example, greater than about 0.5 degrees.

In the example of FIG. 4C, each longitudinal reflector support 280 or 282 supports a single linearly extending reflective element 155, reflective elements supported by longitudinal reflector supports 282 are longer than those supported by longitudinal reflector supports 280, and the ordering of longitudinal reflector supports 280 and 282 reverses in adjacent rows. As a consequence, gaps or joints 375 between the reflective elements in one row are not next to gaps or joints between reflective elements in an adjacent row. Such staggering of gaps or joints 375 may produce a more uniform illumination of the receiver by solar radiation concentrated by reflector 120 than would occur if such gaps or joints were generally next to gaps or joints in adjacent rows, because in the latter case such gaps or joints might cast shadows that were superimposed on each other on the receiver. Staggering of gaps or joints 375, or of ends of rows of linearly extending reflective elements 155, is further described at several points below.

Longitudinal reflector supports (e.g., 250, 265, 275, 280, 282) may be attached to transverse reflector supports 155 or to other portions of support structure 130, for example, by welding, gluing, or use of any suitable clamp, screw, bolt, rivet or other mechanical fastener. In some variations, the longitudinal reflector supports are clamped at their ends (e.g., only at their ends) to another portion of support structure 130.

As noted above, in the example illustrated in FIGS. 1A-1C and FIG. 4A, a single unitary piece comprises a transverse reflector support 155 and a receiver support 160. In such variations, the unitary piece may be formed, for example, from continuous metal (e.g., steel, aluminum) sheets or plates into which the notches are cut or otherwise formed. The transverse reflector supports may be similarly fabricated in other variations (e.g., FIGS. 8A-15B) in which the transverse reflector support and receiver support are not parts of a unitary piece.

Although particular examples of longitudinal reflector supports and transverse reflector supports are illustrated and described herein, any other suitable reflector supports may be used in combination with the other elements of the solar energy collectors disclosed herein.

Figure 5C:
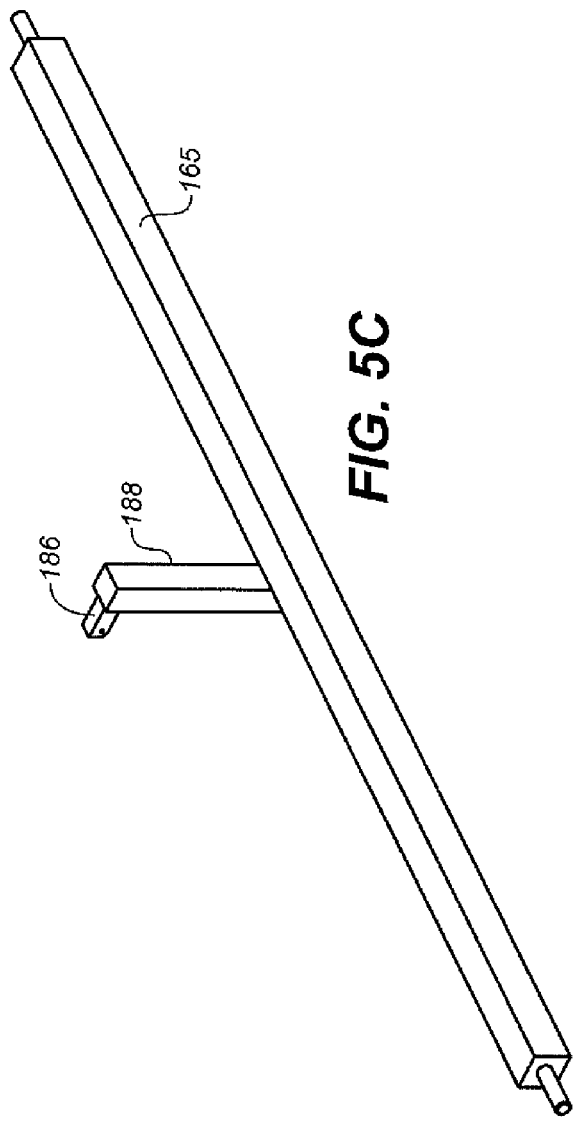
Figure 5A:
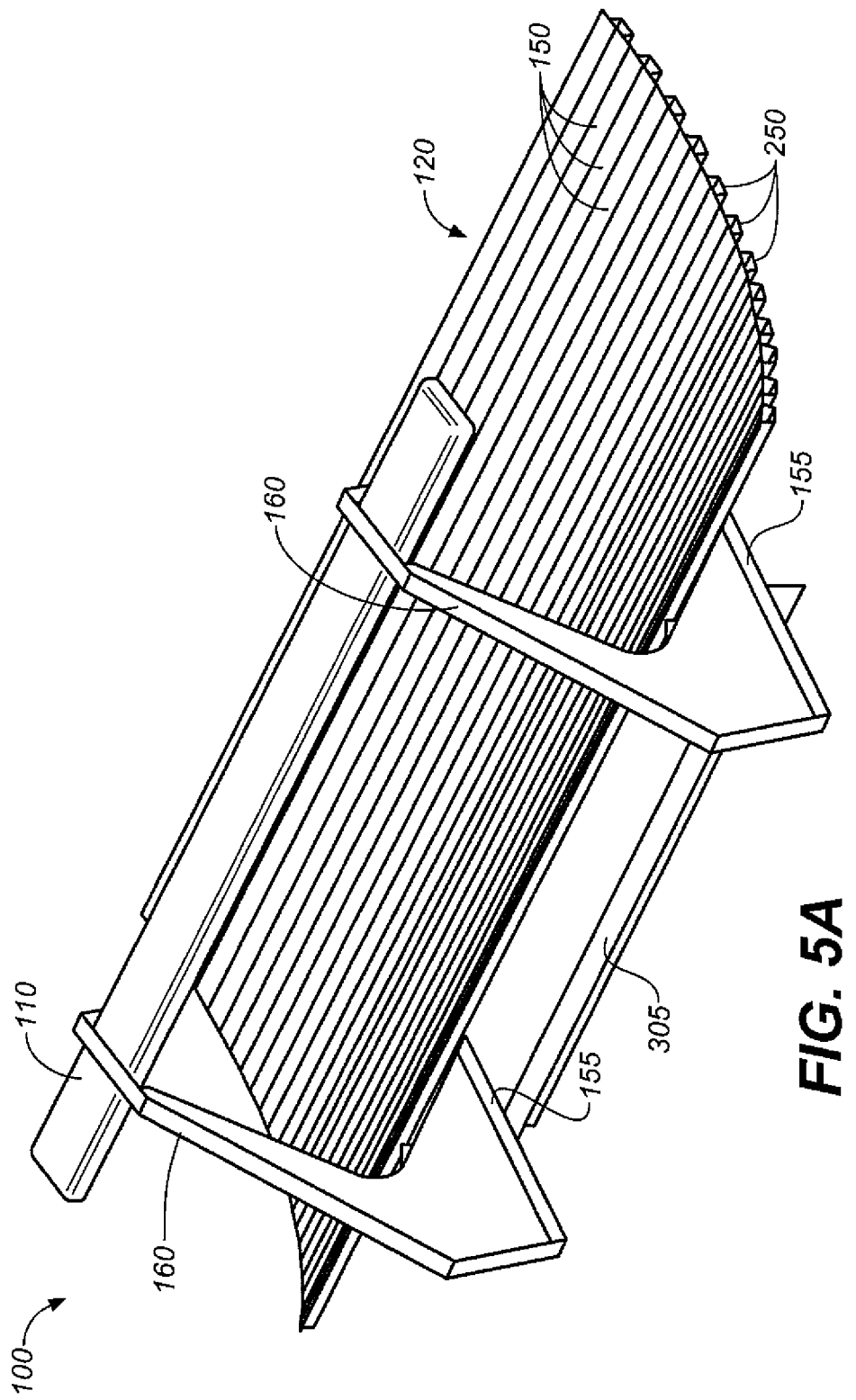

FIGS. 5A-5C show an example arrangement for pivotally mounting a portion of a reflector-receiver arrangement (e.g., a module) to a rotation shaft. In the illustrated example, longitudinal support bracket 305 extends parallel to the linear focus of reflector 120 between transverse reflector supports 155, to which it is attached. Longitudinal support bracket 305 has, for example, an approximately 90 degree angled cross-section configured to complement a portion of a square cross-section of shaft 165, to which it may be attached.

In addition, FIG. 5B shows an example in which linearly extending reflective elements 150 are arranged so that their ends are staggered, i.e., lie at varying positions at the ends of reflector 120, as measured parallel to the linear focus of the reflector. Such staggering may blur the edges, created by the ends of reflector 120, of the linearly extending concentrated solar radiation pattern focused on receiver 110 by reflector 120, and consequently produce a more uniform illumination of the receiver. In the illustrated example, the pattern at one end of reflector 120 made by the staggered positions of reflective elements 150 complements the pattern at the other end of reflector 120. This may allow two or more identical or substantially identical such solar energy collectors to be aligned in parallel and adjacent to each other with adjacent staggered ends interleaved to form an approximately continuous reflective surface. In such cases, the gaps between linearly extending reflective elements 150 from adjacent reflector structures will lie at varying positions along the length of the reflector. This also may produce a more uniform illumination of the receivers. As evidenced by the example of FIG. 5A, staggering of the ends of linearly extending reflective elements is optional.

Figure 6A:
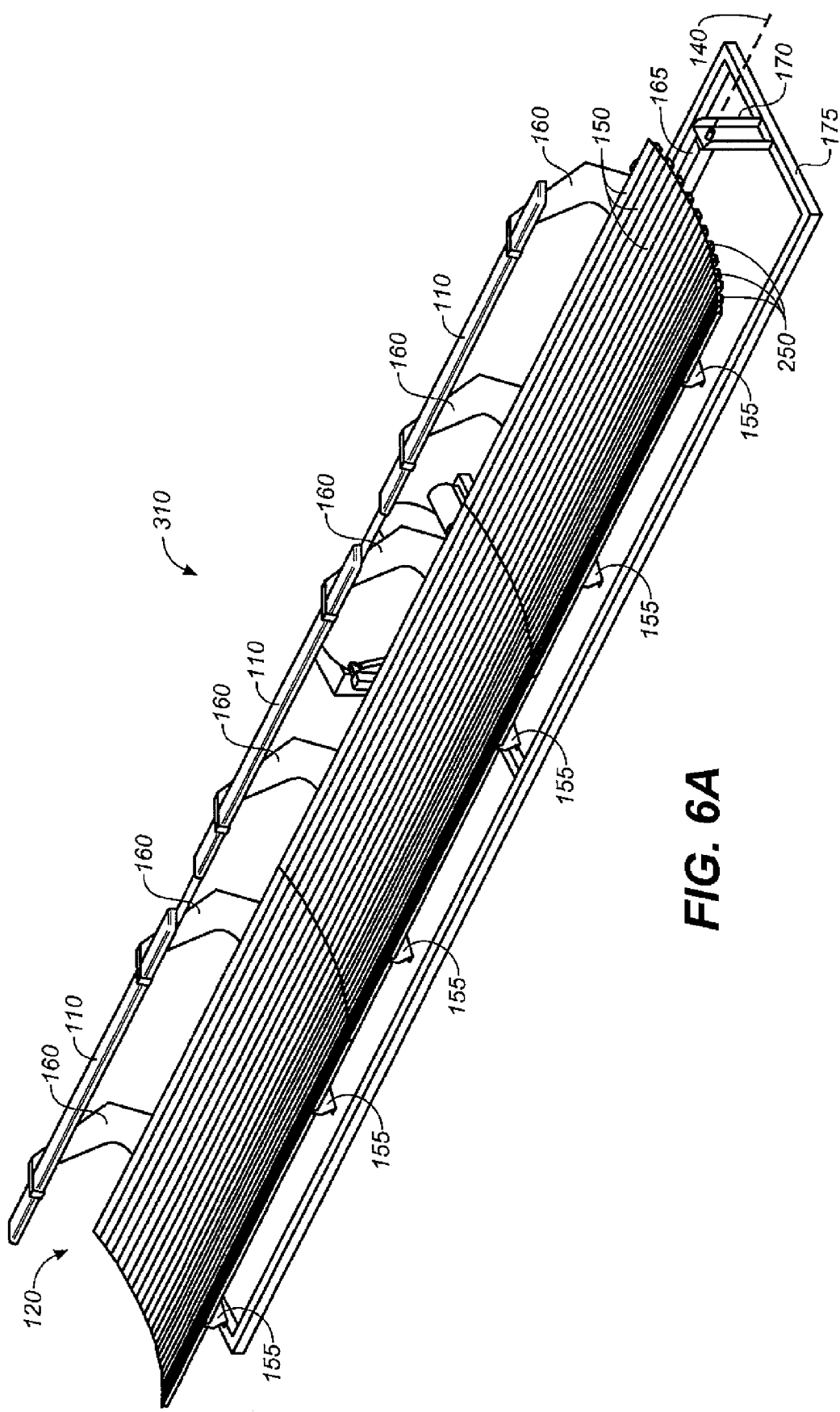
FIGS. 6A and 6B show an example solar energy collector comprising three reflector-receiver modules sharing a rotation shaft.
Figure 6B:
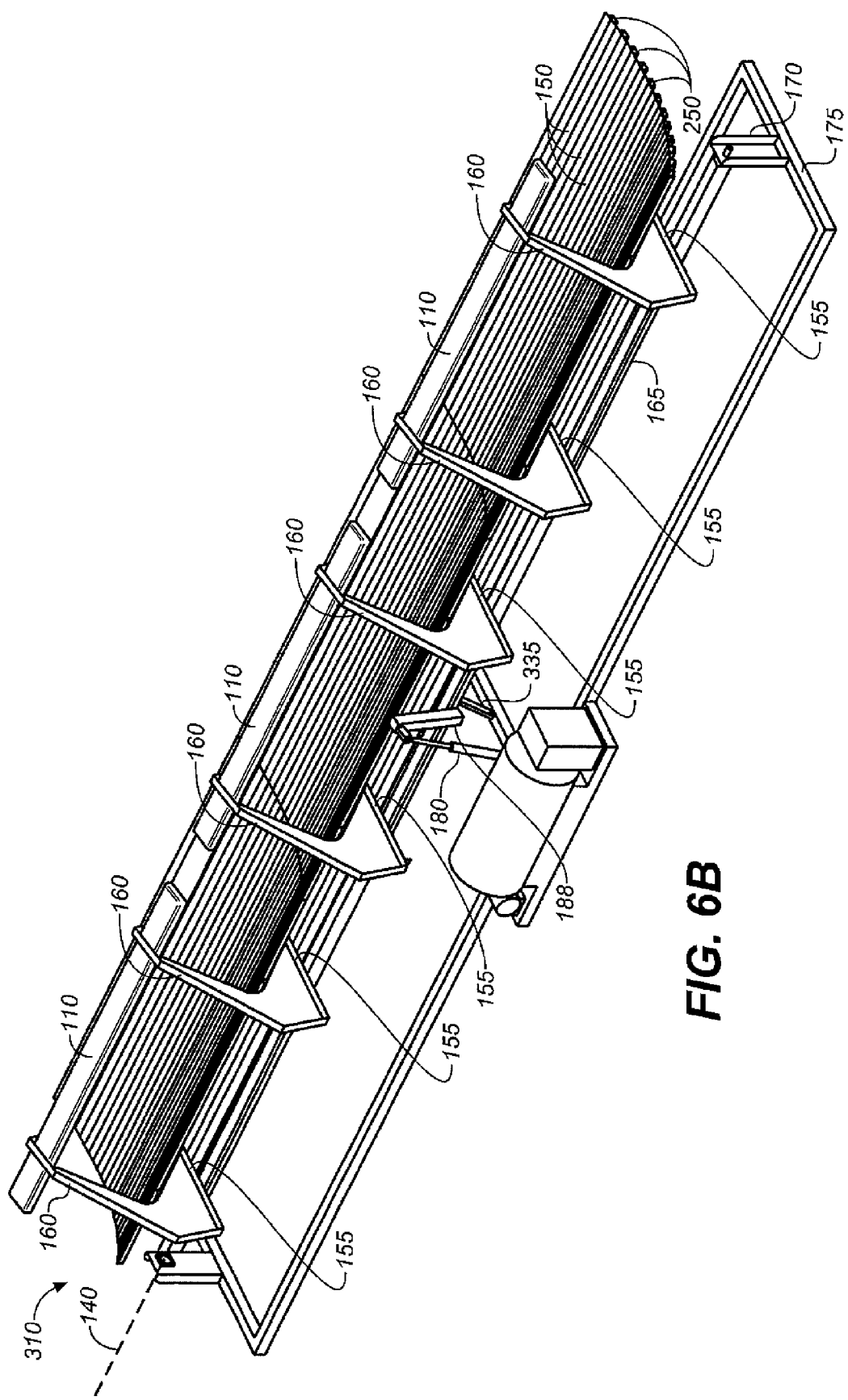

Solar energy collectors as disclosed herein may be modular, with two or more identical or substantially similar modules, which might be independent solar energy collectors, arranged to form a larger solar energy collector. In the example of FIGS. 6A and 6B, a solar energy collector 310 comprises three of the example reflector-receiver arrangement (module) depicted in FIG. 5A (and utilized as well in the example solar energy collectors of FIGS. 1A and 1B) arranged in line and adjacent to each other on a shared rotation shaft 165. In other variations, two, or more than three, reflector-receiver modules may be similarly arranged in line and adjacent to each other on a shared rotation shaft.

Figure 7A:
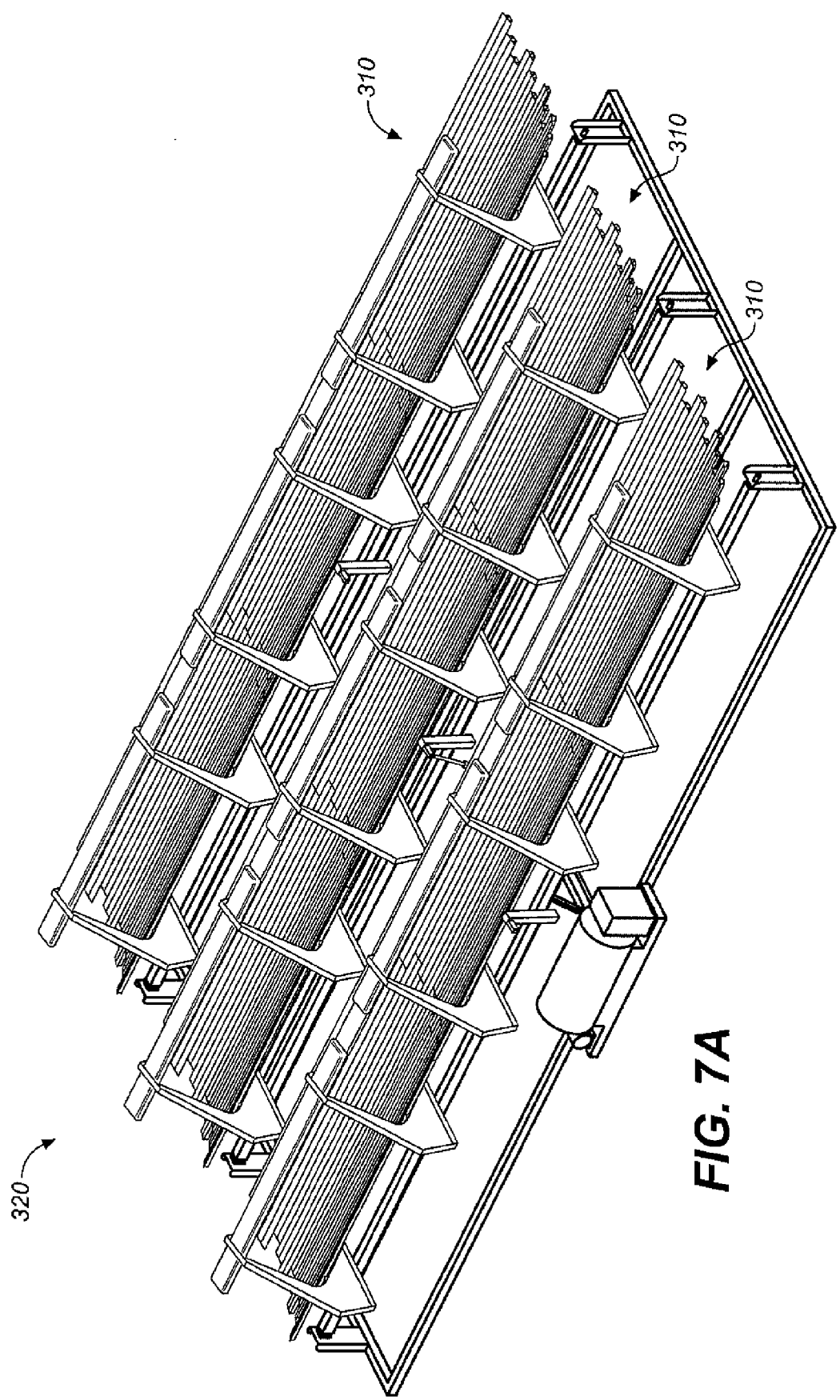
FIGS. 7A and 7B show an example of three solar energy collectors ganged to be driven by a single actuator.
Figure 7B:
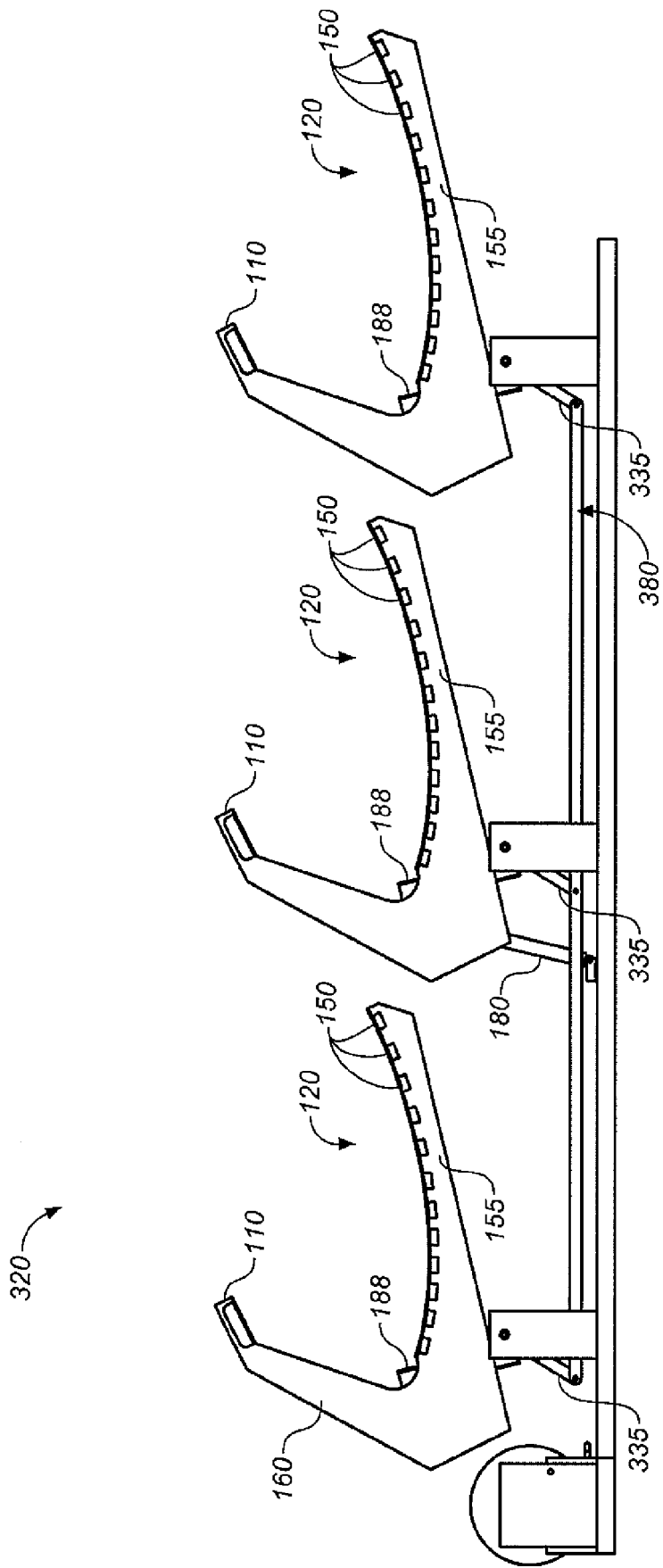

Solar energy collectors as disclosed herein may also be arranged side-by-side in parallel and ganged, i.e., driven by a shared drive (e.g., a linear actuator) to rotate around their respective rotation axes to track the sun. Referring now to FIGS. 7A and 7B, for example, a solar energy collector 320 comprises three of the solar energy collectors of FIGS. 6A and 6B arranged side-by-side and in parallel and driven by a single linear actuator 180. In the illustrated example, a linkage comprising push-pull bar 330 and lever arms 335 (a separate one of which is coupled between the push-pull bar and each of the ganged solar energy collectors) transfers the rotational motion of the solar energy collector directly driven by the linear actuator to the other solar energy collectors. In other variations two, three, or more than three solar energy collectors may be ganged in this or a similar manner.

FIGS. 8A-17 show several more examples of solar energy collectors and their components. Similarly to the previously illustrated examples, these additional example solar energy collectors comprise one or more linearly extending receivers 110 comprising a surface 112 located at or approximately at a linear focus of the reflector and fixed in position with respect to the reflector, and a support structure supporting the reflector and the receiver and pivotally mounted to accommodate rotation of the support structure, the reflector, and the receiver about a rotation axis 140 parallel to the linear focus of the reflector. The support structure, reflector, and receiver may be rotated about rotation axis 140 to track the sun such that solar radiation incident on reflector 120 is concentrated onto receiver 110. Also similarly to the example solar energy collectors described above, in these additional examples the reflective surface of the reflector may be or approximate a parabolic surface taken entirely, or primarily, from one side of the symmetry plane of the parabolic surface. Receiver 110 may be tilted to face reflector 120, and may be positioned with respect to reflector 120, as in the solar energy collectors described above.

Generally, the individual components of the additional example solar energy collectors, and their structure and arrangement, may be varied similarly or identically to as described above with respect to the previously illustrated examples. Some of the additional example solar energy collectors (e.g., those shown in FIGS. 8A-12C) may be ganged as previously described, to allow a single actuator to simultaneously drive (rotate) two or more side-by-side rows of solar energy collectors. In use, the additional example solar energy collectors may be advantageously oriented with rotation axis 140 along an East-West direction.

Figure 8B:
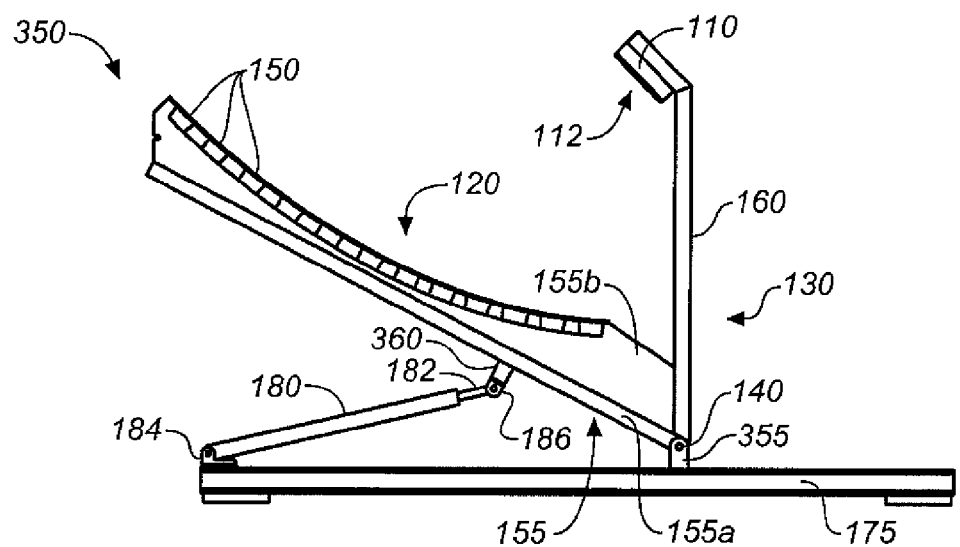
Figure 9:
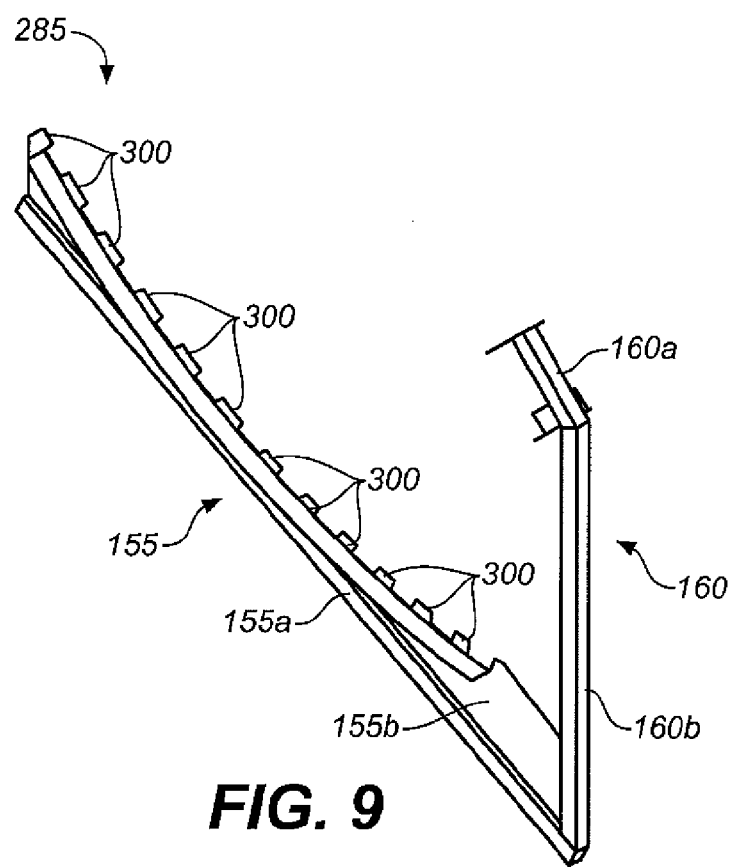
FIG. 9 shows an example arrangement of a transverse reflector support and a receiver support used in the example solar energy collector of FIGS. 8A, 8B, 11A, and 11B.

Referring now to FIGS. 8A and 8B, and also to FIG. 9, an example solar energy collector 350 differs from the examples previously described herein primarily in the structure and arrangement of transverse reflector support 155 and receiver support 160, and in its rotation mechanism. Referring now to FIG. 9 in particular, in this example transverse reflector support 155 and receiver support 160 are formed as separate pieces, rather than as parts of a single unitary piece as previously illustrated. Transverse reflector support 155 comprises a transverse support member 155a supporting a plate 155b. Plate 155b comprises a notched edge 285, with portions of surfaces 300 adjacent to the notches cut (or otherwise formed) to define desired orientations of linearly extending reflective elements to be supported by the transverse reflector support. Receiver support 160 comprises a receiver mount (or bracket) 160a at one end of a support member 160b. The other end of support member 160b is attached to an end of transverse support member 155b.

As described with respect to previous examples, transverse reflector support 155 may support longitudinal reflector supports 250 (as in FIG. 8A), directly support mirrors or other reflective elements, or support some other intermediate structure that in turn supports mirrors or other reflective elements.

Referring again to FIGS. 8A and 8B, each assembly of a transverse reflector support 155 and a receiver support 160 is pivotally mounted, near the joint between support members 155a and 160b, to a support 355. These pivot points are aligned to define rotation axis 140. A linear actuator 180 comprising an extensible shaft 182 is mechanically coupled between a pivotal connector 184 on base 175 and a pivotal connector 186 attached to transverse support member 155a of a transverse reflector support 155. Linear actuator 180 may rotate transverse reflector support 155, receiver support 160, and hence reflector 120 and receiver 110 around rotation axis 140 to track the motion of the sun by extending or retracting extensible shaft 182. In the absence of base 175, linear actuator 180 may be coupled, for example, to a pivotal connector on or attached to the ground, a rooftop, or a separate support structure. Some variations utilize a single actuator configured as illustrated to rotate reflector 120 and receiver 110 around rotation axis 140, with the rotational motion transferred to other transverse reflector supports 155 by a longitudinal member 360 extending parallel to the long axis of the reflector and attached to each of the transverse reflector supports. Other variations may utilize several such linear actuators, each coupled to a separate one of the transverse reflector supports.

Figure 10A:
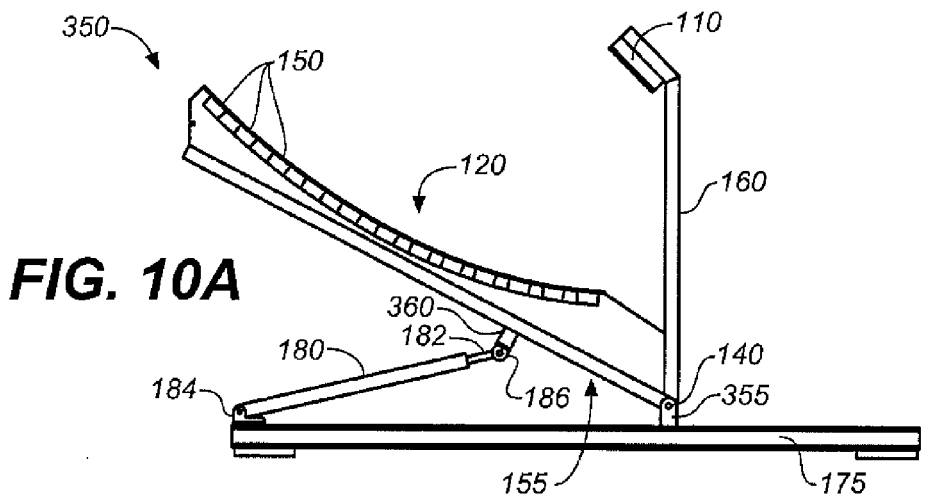
FIGS. 10A-10C show the example solar energy collector of FIGS. 8A and 8B oriented to concentrate solar radiation onto its receiver when the sun is directly overhead (10A), at −5 degrees from the vertical (in the direction of the earth's equator), and at +60 degrees from the vertical (away from the equator).
Figure 10B:
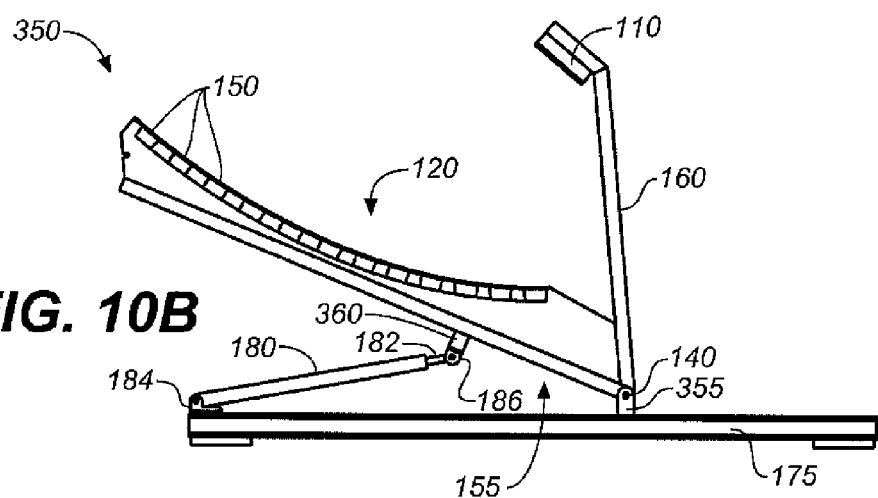
Figure 10C:
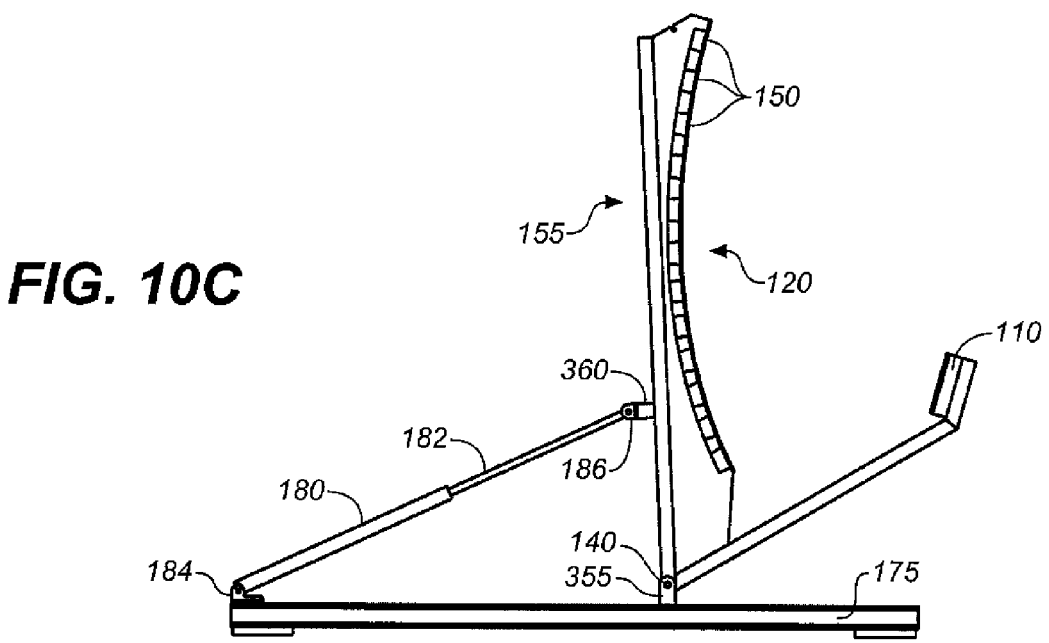

FIGS. 10A-10C show the example solar energy collector of FIGS. 8A and 8B oriented to concentrate solar radiation when the sun is directly overhead (FIG. 10A), at −5 degrees from the vertical in the direction of the earth's equator (FIG. 10B), and at +60 degrees from the vertical away from the equator (FIG. 10C).

Figure 11B:
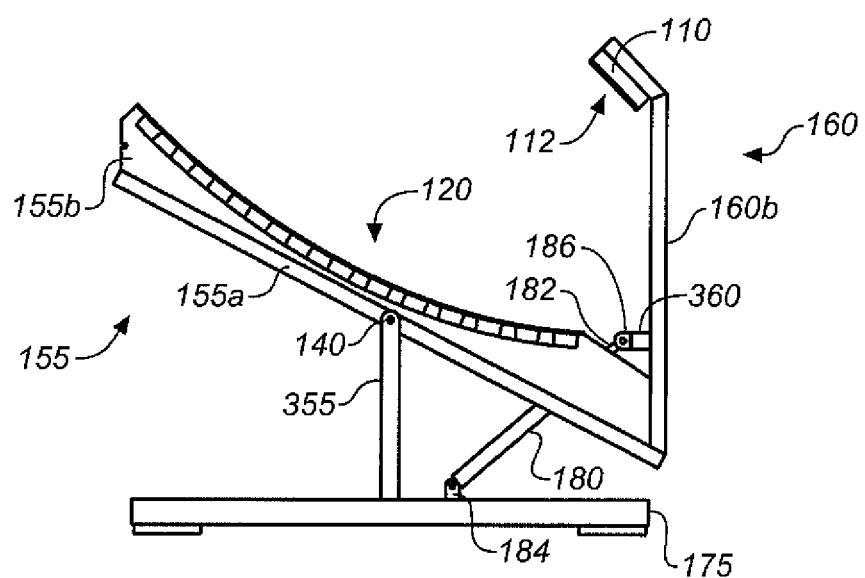

Referring now to FIGS. 11A and 11B, another example solar energy collector 370 differs from the example described in FIGS. 8A-10C primarily in its rotation mechanism. In this example, each assembly of a transverse reflector support 155 and a receiver support 160 is pivotally mounted, in a central region of support member 155a, to a support 355. These pivot points are aligned to define rotation axis 140. A linear actuator 180 comprising an extensible shaft 182 is mechanically coupled between a pivotal connector 184 on base 175 and a pivotal connector 186 attached to a receiver support member 160b of a receiver support 160. Linear actuator 180 may rotate receiver support 160, transverse reflector support 155, and hence reflector 120 and receiver 110 around rotation axis 140 to track the motion of the sun by extending or retracting extensible shaft 182. In the absence of base 175, linear actuator 180 may be coupled, for example, to a pivotal connector on or attached to the ground, a rooftop, or a separate support structure. Some variations utilize a single actuator configured as illustrated to rotate reflector 120 and receiver 110 around rotation axis 140, with the rotational motion transferred to other receiver support members 160b by a longitudinal member 360 extending parallel to the long axis of reflector 120 and attached to each of the receiver support members. Other variations may utilize several such linear actuators, each coupled to a separate one of the receiver support members.

Figure 12A:
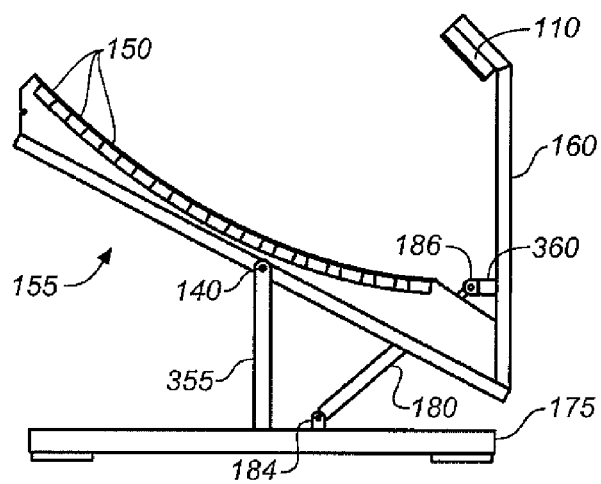
FIGS. 12A-12C show the example solar energy collector of FIGS. 11A and 11B oriented to concentrate solar radiation when the sun is directly overhead (10A), at −5 degrees from the vertical (in the direction of the earth's equator), and at +60 degrees from the vertical (away from the equator).
Figure 12B:
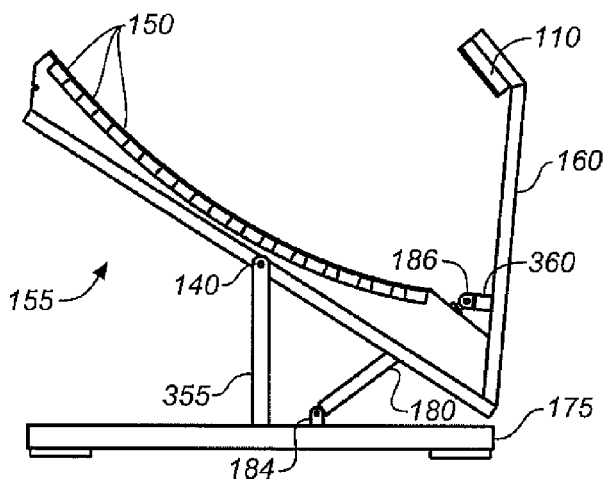
Figure 12C:
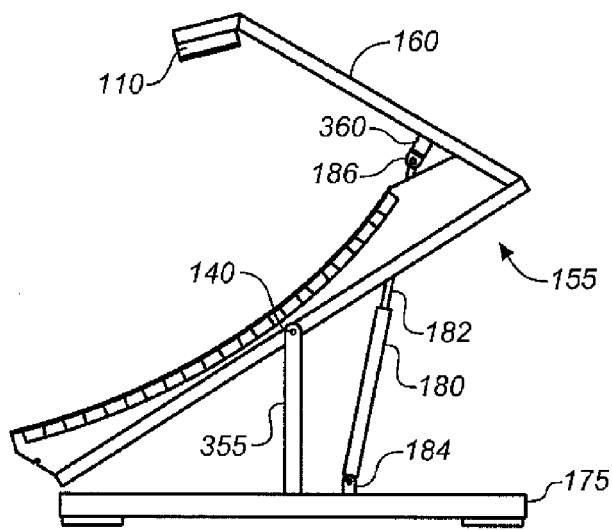

FIGS. 12A-12C show the example solar energy collector of FIGS. 11A and 11B oriented to concentrate solar radiation when the sun is directly overhead (FIG. 12A), at −5 degrees from the vertical in the direction of the earth's equator (FIG. 12B), and at +60 degrees from the vertical away from the equator (FIG. 12C).

Figure 13:
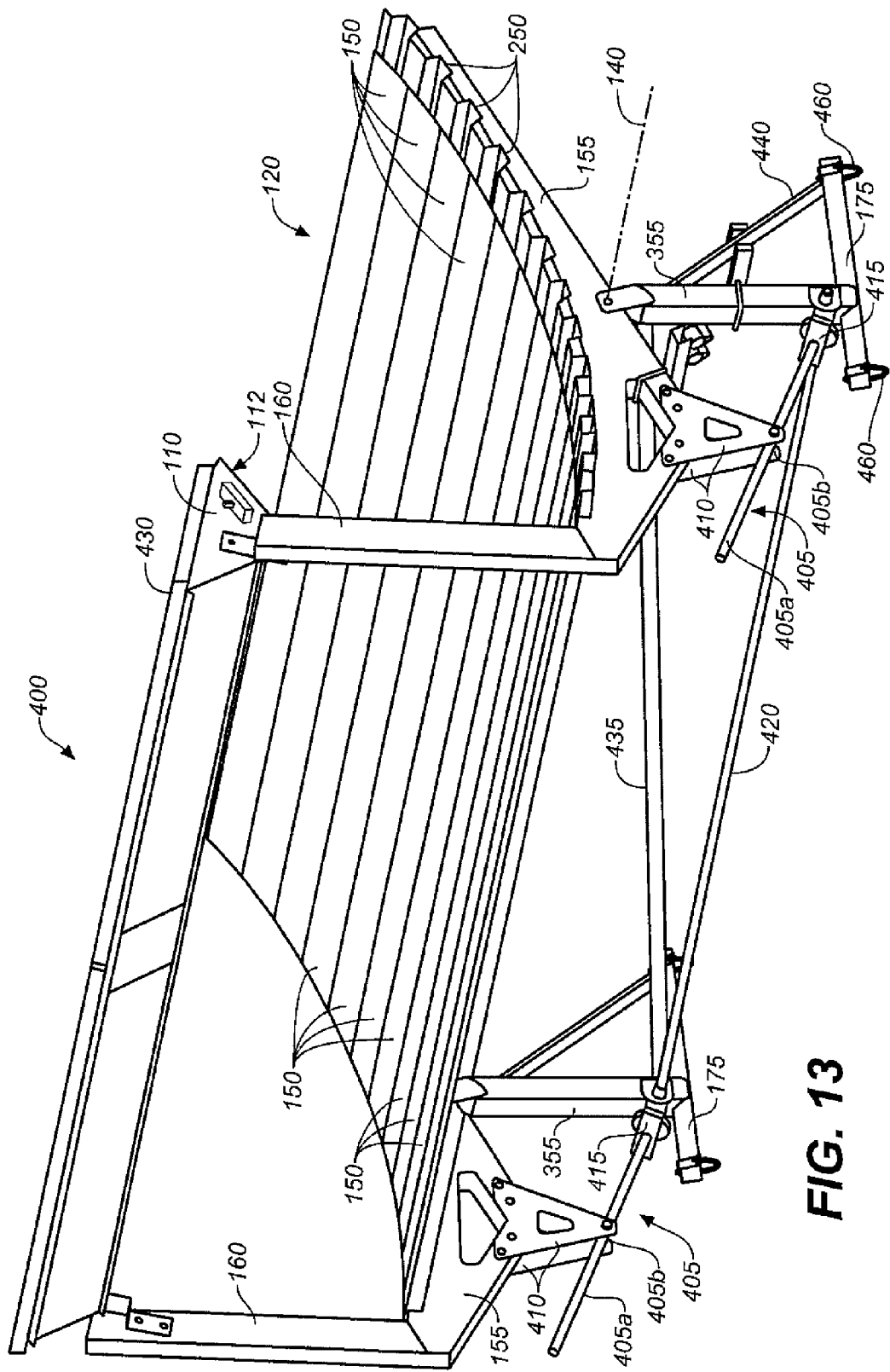
FIG. 13 shows another example solar energy collector.

Referring now to FIG. 13, another example solar energy collector 400 differs from the examples of FIGS. 8A-12C primarily in its rotation mechanism. In this example, each assembly of a transverse reflector support 155 and a receiver support 160 is pivotally mounted, in a central region of transverse reflector support 155, to a vertical support 355. These pivot points are aligned to define rotation axis 140. Linear actuators 405 each comprise a threaded rod 405a and a threaded pivotal connector 405b. Each threaded pivotal connector 405b is pivotally mounted to a lever arm 410 attached to a transverse reflector support 155. One end of each threaded rod 405a engages its corresponding threaded pivotal connector 405b. The other end of each threaded rod 405a is mechanically coupled to a corresponding gear assembly 415 pivotally connected to a lower portion of vertical support 355. A drive shaft 420 extending parallel to the long axis of reflector 120 drives each threaded rod 405a via its corresponding gear assembly 415. Threaded rods 405a may be driven to move threaded pivotal connectors 405b either toward or away from vertical supports 355 and thereby rotate transverse reflector supports 155, receiver supports 160, and hence reflector 120 and receiver 110 around rotation axis 140 to track the motion of the sun.

Figure 14A:
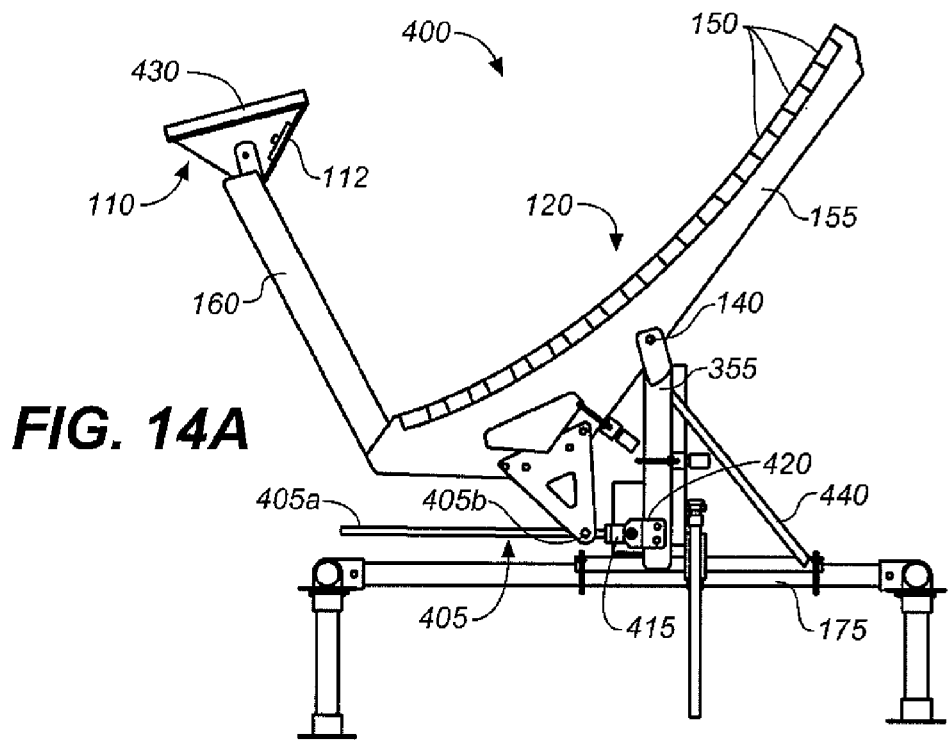
FIGS. 14A-14B show the example solar energy collector of FIG. 13 oriented to concentrate solar radiation onto its receiver when the sun is at −15 degrees from the vertical (in the direction of the earth's equator), and at +65 degrees from the vertical (away from the equator).
Figure 14B:
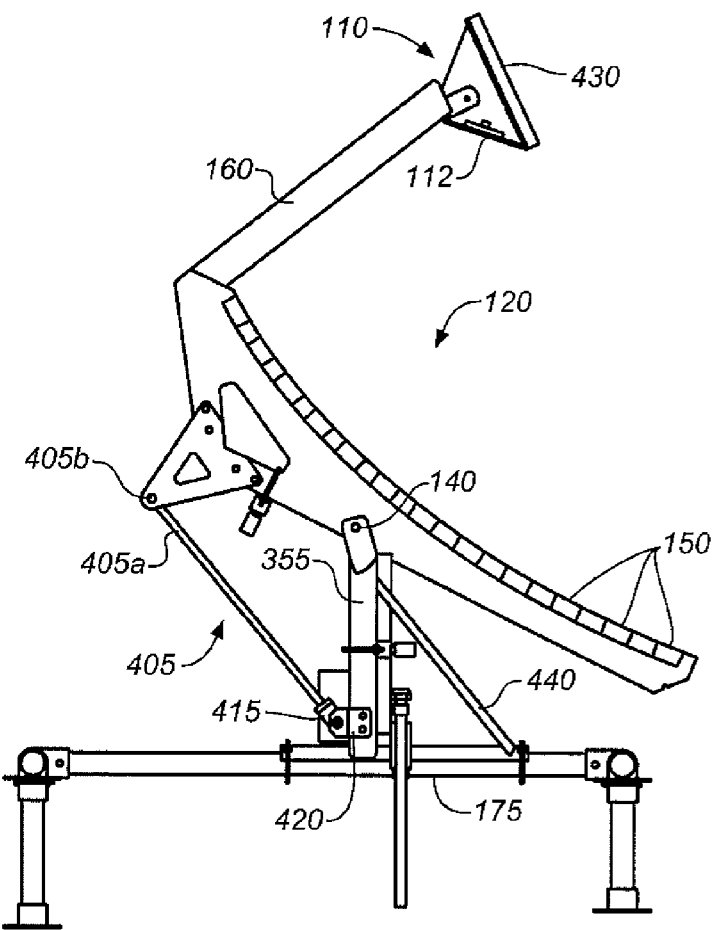

FIGS. 14A-14B (end views) show the example solar energy collector of FIG. 13 oriented to concentrate solar radiation when the sun is at −15 degrees from the vertical in the direction of the earth's equator (FIG. 14A) and at +65 degrees from the vertical away from the equator (FIG. 14B). In the illustrated example, these orientations represent the ends of the travel range for linear actuators 405, with all angular orientations in between accessible. In other variations, linear actuators 405 may be arranged to provide rotation over different (e.g., greater or lesser) angular ranges as desired.

Figure 15A:
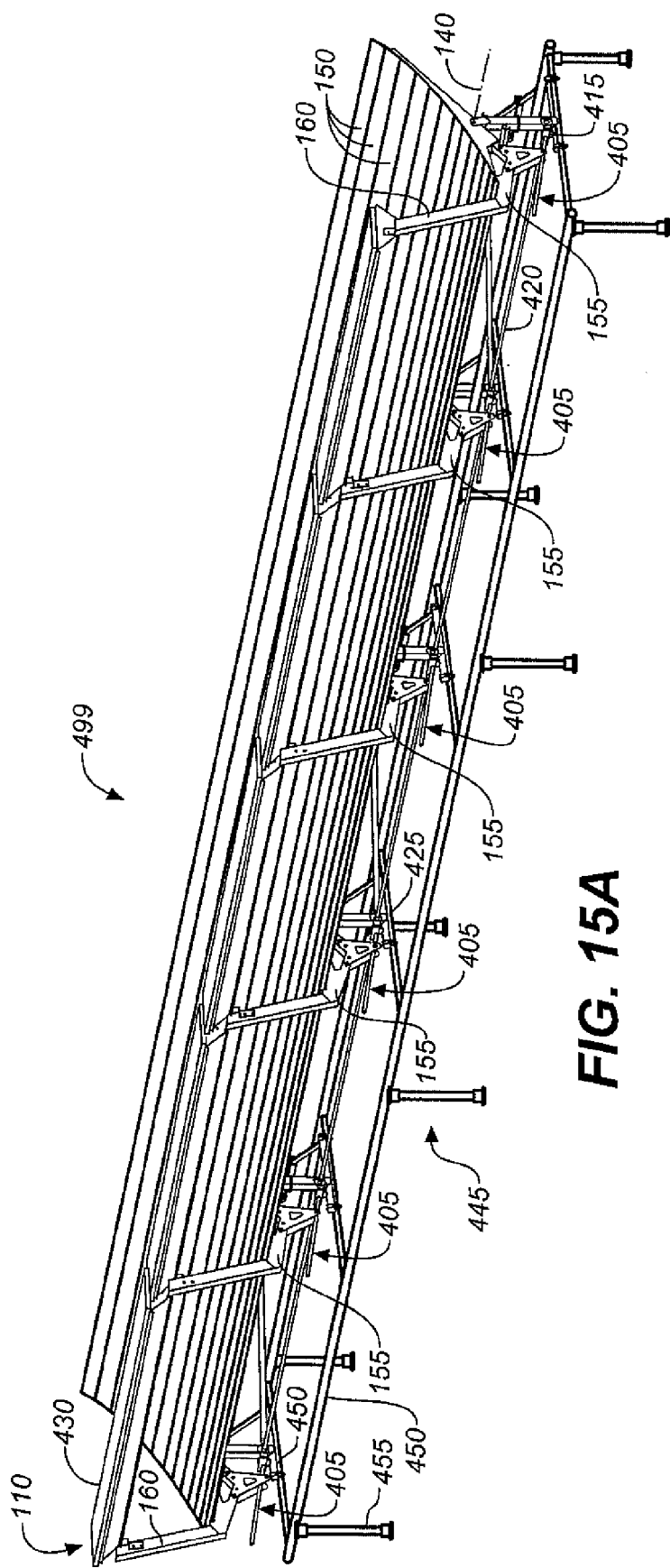

As with other solar energy collectors previously described herein, solar energy collectors 400 shown in FIG. 13 and FIGS. 14A-14B may be used as modules from which larger solar energy collectors may be assembled. In the example of FIG. 15a, a solar energy collector 499 comprises five of the solar energy collectors 400 arranged in line and adjacent to each other, mechanically coupled, and sharing a single drive shaft 420 that drives all of linear actuators 405. Other variations may comprise two, three, four, or more than five of the solar energy collectors 400 so arranged. In the illustrated example, drive shaft 420 is in turn driven by a motor 425 centrally located along solar energy collector 499. In some variations, solar energy collector 499 comprises two drive shafts, each driven by motor 425, extending in opposite directions from motor 425 along the long axis of solar energy collector 499 to drive different sets of linear actuators 405.

FIG. 15B similarly shows a solar energy collector 498 comprising six of the solar energy collectors 400 arranged in line and adjacent to each other, mechanically coupled, and sharing a drive shaft that drives linear actuators 405.

In the examples illustrated in FIGS. 13-15b, solar energy collectors 400, 498, and 499 each comprise a linear actuator 405 (arranged to rotate reflector 120 and receiver 110) for each pivot point defined by the pivotal connection between a transverse reflector support 155 and a vertical support 355, with all of the linear actuators 405 in a solar energy collector driven by a shared drive shaft 420. In other variations, however, more or fewer linear actuators than pivot points may be used. Also, in other variations more than one drive shaft may be used, with each drive shaft driving a different set of linear actuators.

More generally, in some variations a solar energy collector (e.g., solar energy collector 498 or 499) is assembled from two or more (e.g., identical or substantially identical) modules, each of which includes a transverse reflector support 155 and associated longitudinal reflector support or supports. In some such variations, where the solar energy collector includes N modules, it may include N+1 pivot points (i.e., one between each module and one at each end of the solar energy collector), with a linear actuator associated with each pivot point to rotate the reflector and receiver around the solar energy collector's rotation axis. The number of modules N may be, for example, 1, 2, 3, 4, 5, 6, 7, 8, 9, 10, or more than 10. The linear actuators may be driven by one or more shared drive shafts extending along the long axis of the solar energy collector.

One advantage to associating a separate linear actuator with each pivot point is that the solar energy collector need not be as resistant to torsion (twisting around its long axis) as would be necessary if fewer drive mechanisms than pivot points were used. Hence the solar energy collector may be of lighter construction than otherwise, and more suitable for rooftop deployment, for example. In addition, as explained in more detail below, gear assemblies 415 (e.g., as shown in FIGS. 13-15a) may be arranged so that the thrust load from the linear actuators 405, resulting from forces exerted to rotate the reflector and receiver assembly, is decoupled from drive shafts 420 and instead borne by vertical supports 355. This allows the load resulting from rotation of the reflector and receiver assembly to be easily distributed across a large area beneath the solar energy collector, through the (e.g., N+1) vertical supports 355, rather than concentrated at only a small number of locations (e.g., at the ends of a long rotation shaft). Such a broad load distribution beneath the solar energy collectors may also be advantageous, for example, when the solar energy collectors are installed on rooftops or similar locations.

Solar energy collectors 400, 498, and 499 differ from example solar energy collectors previously described herein by including (optional) angled cross brace 435 extending between an upper portion of one vertical support 355 and a lower portion of an adjacent vertical support 435. Solar energy collector 400, 498, and 499 further differ from example solar energy collectors previously described herein by including (optional) angled cross brace 440 extending transversely to the long axis of the solar energy collector between an upper portion of vertical support 355 and base 175, on the opposite side of vertical support 355 from its associated linear actuator 405.

In FIG. 15a, solar energy collector 499 is shown attached to and supported by an (optional) support structure 445 comprising horizontally oriented cross members 450 supported by vertical supports 455. Base portions of solar energy collectors 400 and 499 may be attached to cross member portions of support structure 445 using U-bolts 460 (FIG. 13), for example, or any other suitable connectors. Support structure 445 may be arranged such that its vertical supports 455 align with or are otherwise appropriately located with respect to load bearing elements of an underlying structure such as a roof, for example. Support structure 445 thus serves as an adaptor between any underlying structure and the solar energy collector it supports. Similar support structures may be used in combination with the other example solar energy collectors described herein.

Figure 16A:
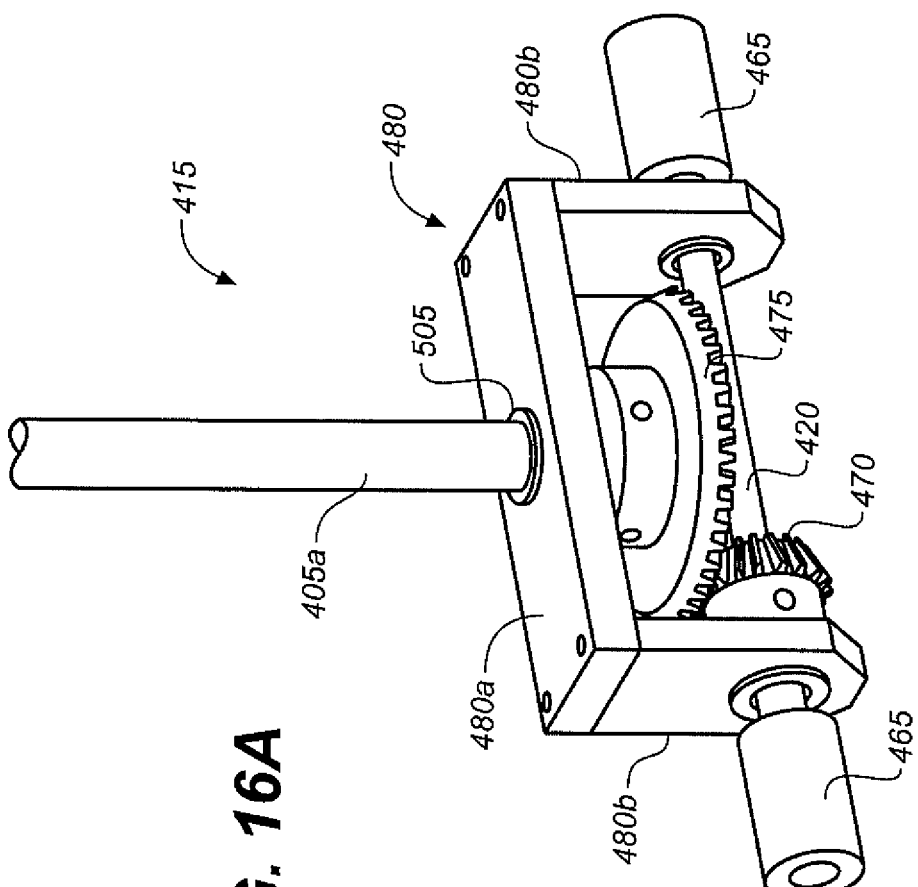
Figure 16C:
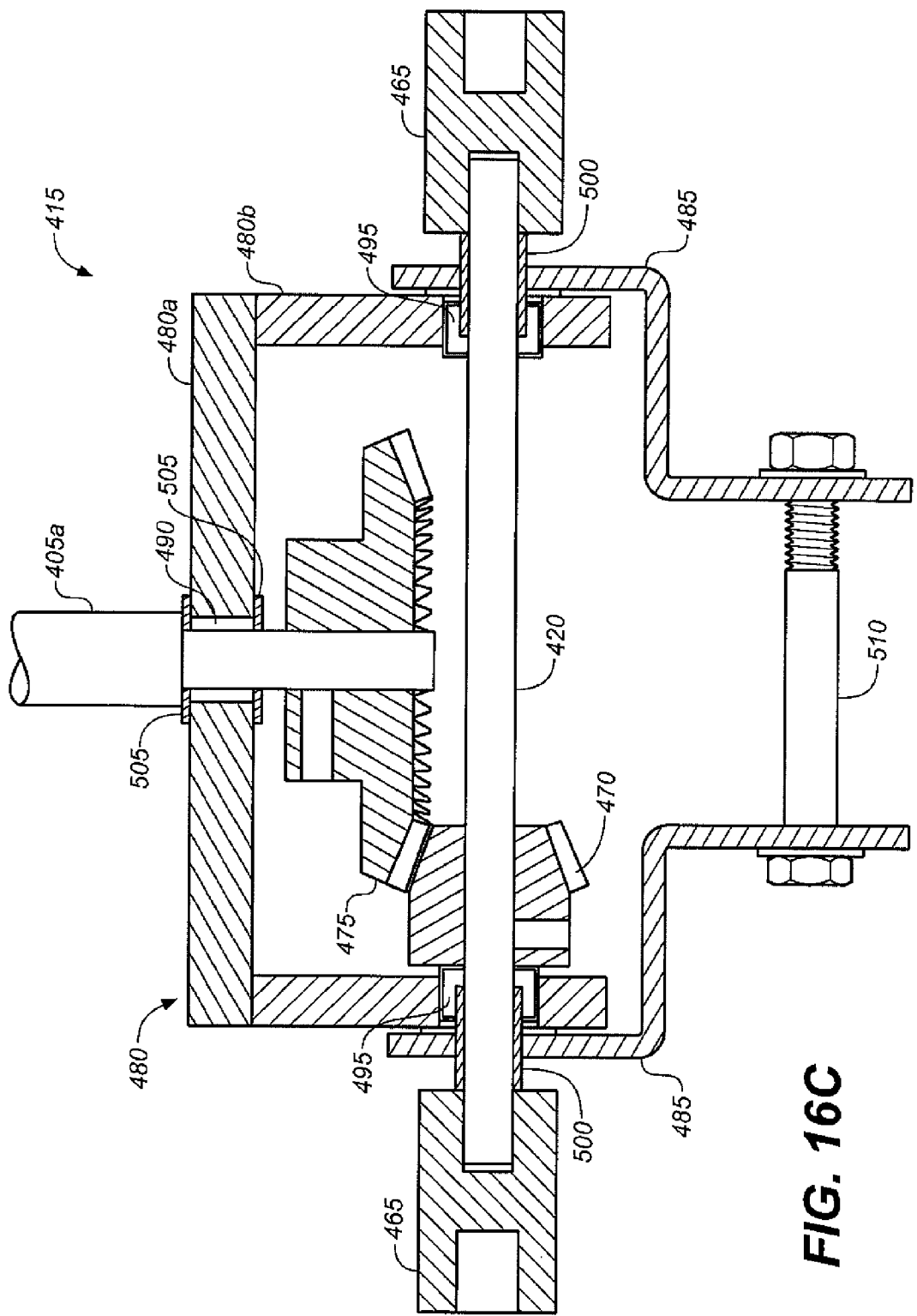

FIGS. 16A-16C illustrate details of an example gear assembly 415 that may be employed in some variations of solar energy collectors disclosed herein (e.g., FIGS. 13-15*b*) to drive linear actuators that rotate a reflector/receiver assembly around a rotation axis to track the sun. As explained below, in operation a portion of gear assembly 415 pivots around drive shaft 420 to accommodate rotation of the reflector/receiver assembly to which it is mechanically coupled by lead screw 405*a*. As also explained below, gear assembly 415 decouples the thrust load on lead screw 405*a* from drive shaft 420 and may instead transmit that thrust load directly to stationary support structure of the solar energy collector. FIGS. 16A-16C illustrate one example of a gear assembly 415 providing these functions. Other variations of gear assembly 415 providing such functions may also be advantageously employed in the solar energy collectors described herein.

Referring now to FIGS. 16A-16C, a portion of drive shaft 420 internal to gear assembly 415 is coupled via couplers 465 to external portions of drive shaft 420 (not shown in FIGS. 16A-16C). Pinion gear 470 of gear assembly 415 is mounted coaxially on and rotates with drive shaft 420. Bevel gear 475 is mounted coaxially on the end of and rotates with lead screw 405*a*, which is arranged at a 90 degree angle to drive shaft 420. Pinion gear 470 engages bevel gear 475 to transmit rotational motion of drive shaft 420 to lead screw 405*a*. Lead screw 405*a* engages a threaded pivotal connector (e.g., 405*b* shown in FIG. 13) attached to a reflector/receiver assembly in the solar energy collector to transmit forces collinearly with the axis of lead screw 405*a* to the reflector/receiver assembly and thereby rotate the reflector/receiver assembly about one or more coaxial pivot points (see, e.g., FIG. 13). Rotation of drive shaft 420 in one direction or the other about its axis thus drives rotation of the reflector/receiver assembly in one direction or the other about its pivot points.

In the illustrated example, gear assembly 415 comprises a front bracket 480 (including front wall 480*a* and side walls 480*b*) and rear brackets 485 enclosing gears 470, 475, and a portion of drive shaft 420. Lead screw 405*a* is laterally supported by bushing 490 as it passes through an opening in the front wall of bracket 480. Similarly, drive shaft 420 is laterally supported in the side walls 480*b* of bracket 480 by bearings 495 rotatably contacting bushings 500. In addition to supporting bearings 495, bushings 500 also laterally support drive shaft 420 as it passes through openings in rear brackets 485.

Thrust loads on lead screw 405*a* are transmitted by thrust bearings 505 from lead screw 405*a* to the front wall 480*a* of bracket 480 and thence to the side walls 480*b* of bracket 480. Thrust loads carried by side walls 480*b* of bracket 480 are transmitted via bearings 495 and bushings 500 to rear brackets 485. The thrust loads on lead screw 405*a* are thus isolated from drive shaft 420 by thrust bearings 505, bushings 500, and brackets 480 and 485. Rear brackets 485 may be mounted on stationary support structure of the solar energy collector using optional bolts 510, for example.

In operation, bearings 495 rotatably contacting bushings 500 allow front bracket 480, lead screw 405*a*, and bevel gear 475 to pivot around drive shaft 420 as drive shaft 420 drives rotation of a reflector/receiver assembly around its pivot points.

Figure 17:
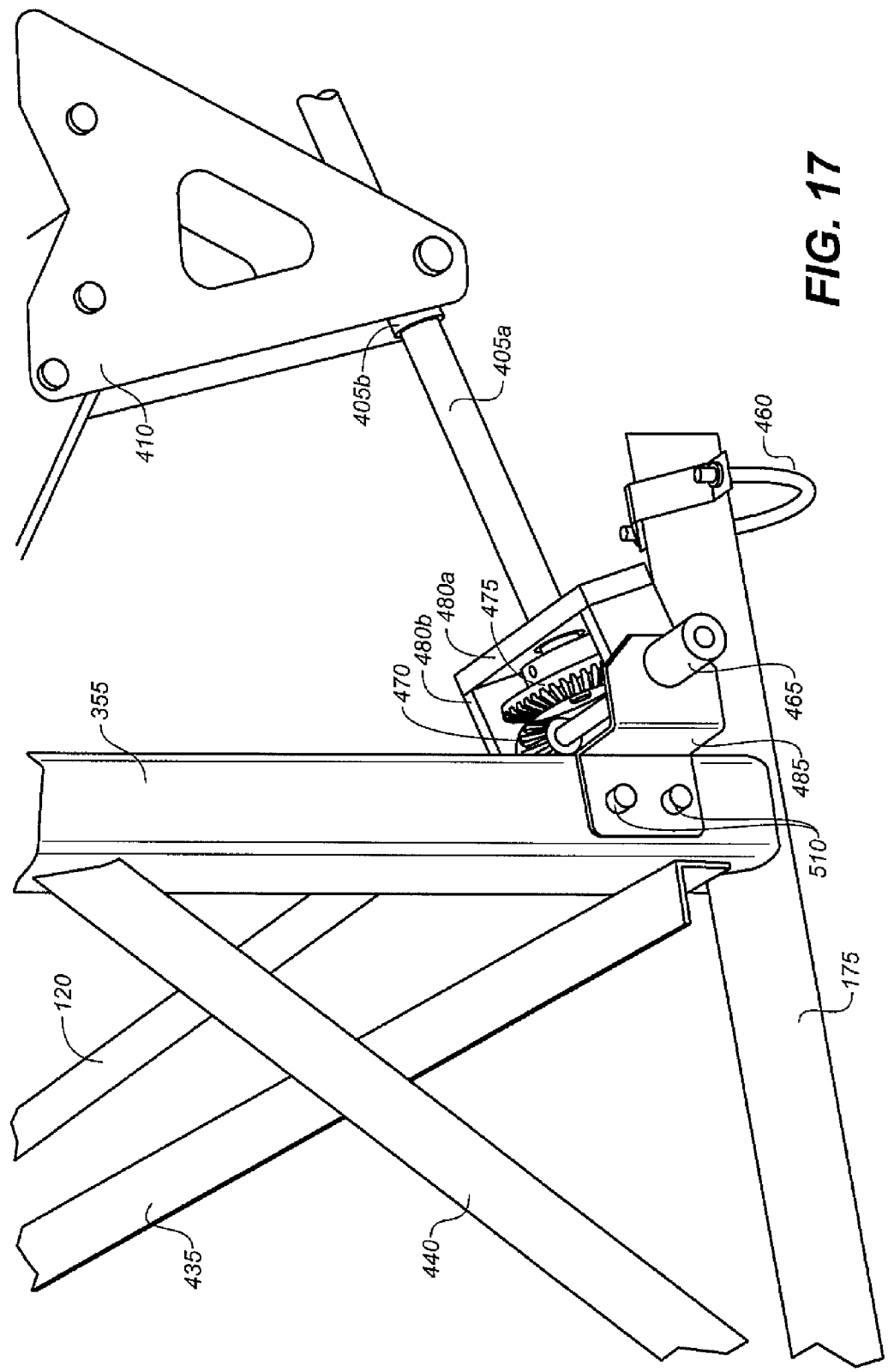
FIG. 17 shows a portion of an example solar energy collector comprising the example gear assembly of FIGS. 16A-16C.

FIG. 17 shows gear assembly 415 as just described in position in an example solar energy collector.

Referring again to FIGS. 13-15B, solar energy collectors 400, 498, and 499 differ from example solar energy collectors previously described herein by including (optional) solar cells 430 on an upper surface of receiver 110. Solar cells 430 are arranged so that they face the sun when reflector 120 and receiver 110 are oriented to concentrate solar radiation on lower surface 112 of receiver 110. Solar cells 430 generate electric power from solar radiation directly incident on them rather than concentrated on them by reflector 120. Other solar energy collectors described herein, as well as solar energy collectors described in U.S. patent application Ser. No. 12/788,048, filed May 26, 2010, titled "Concentrating Solar Photovoltaic-Thermal System," may also optionally include similarly arranged solar cells to generate electric power from solar radiation not concentrated by the reflectors. Alternatively, or in addition, solar cells may be similarly arranged on or attached to portions of the support structure of such solar energy collectors to generate electric power from solar radiation not concentrated by the reflector.

Electric power generated by solar cells 430 may be used, for example, to augment an electric power output from receiver 110 generated using concentrated solar radiation. Alternatively, or in addition, electric power generated by solar cells 430 may be used to power or partially power the solar energy collector's control systems, drive motors, or both. In the latter cases, solar cells 430 may allow the solar energy collector to operate autonomously, i.e., to power itself rather than draw power from the grid.

In some such autonomous variations of solar energy collectors, the number, efficiency, and/or area of solar cells 430 is sufficient to generate sufficient electricity under a solar irradiance of at least about 100 Watts per square meter ($W/m^2$) of solar cell, at least about 150 $W/m^2$ of solar cell, at least about 200 $W/m^2$ of solar cell, at least about 250 $W/m^2$ of solar cell, at least about 300 $W/m^2$ of solar cell, at least about 350 $W/m^2$ of solar cell, or at least about 400 $W/m^2$ of solar cell to power the solar energy collector's drive system. The drive system may include, for example, linear actuators, drive shafts, and or motors that rotate the reflector and receiver, a control system that controls such motors and actuators, and an optional sun tracking system (e.g., see below) that provides information to the control system to allow the control system to orient the reflectors and receivers to collect solar energy. In some variations, solar cells 430 generate sufficient electricity to also power one or more pumps (and any associated control system including, e.g., temperature sensors) that circulate coolant through the receiver. In other variations, the drive system is powered by solar cells 430, but coolant pumps and associated pump control systems are powered by an external source of electricity. In the latter variations, the pumps may be controlled and powered, for example, by an application or user of the heated coolant.

Such autonomous systems may include solar cells on the lower surface of the receiver and thus generate electricity and collect heat (in the coolant) from concentrated solar radiation. Alternatively, such autonomous systems may be thermal-only. That is, some such autonomous systems may lack solar cells on the lower surface of the receiver, use the output of solar cells 430 primarily or only to power the drive systems and (optionally) pumps and pump controllers, and provide only collected heat (in the form of heated coolant) as an output. In such thermal-only variations, lower surface 112 of receiver 110 may be coated, painted (e.g., black), or otherwise treated to increase its absorption of solar radiation.

Any of the autonomous solar energy collectors just described may be optionally configured to receive electric power from an external power source as necessary for maintenance, repair, or other service of the solar energy collector, or as backup power in the event the solar cells fail or otherwise provide insufficient power, while still relying exclusively on power from solar cells 430 for routine operation. Alternatively, any of the autonomous solar energy collectors just described may be optionally configured to receive electric power from an external power source for routine operation, and rely on the solar cells for back-up power in the event the external power source fails or otherwise delivers insufficient power. In the latter cases, autonomous operation occurs when the external primary source of power fails.

Autonomous solar energy collectors as just describe may be advantageously implemented with an East-West rotation axis. In such configurations, the reflector/receiver orientation used at the end of one day's collection of concentrated solar radiation is near to the orientation required at the beginning of the next day. Consequently, at the end of one day of autonomous operation solar cells 430 will be left in position to approximately face the sun at the beginning of the next day's operation, reducing the number and efficiency of solar cells 430 required to power the solar energy collector at start-up and through the day.

Any of the solar energy collectors disclosed herein may (but need not necessarily) include one or more sun sensors used to determine the orientation of the reflector in the solar energy collector (e.g., of its optical axis) with respect to the position of the sun. This information may be used to control the orientation of the reflector to optimize or otherwise adjust the amount of solar radiation concentrated by the reflector onto the solar energy collector's receiver. Examples of such sun sensors are described next.

Figure 18A:
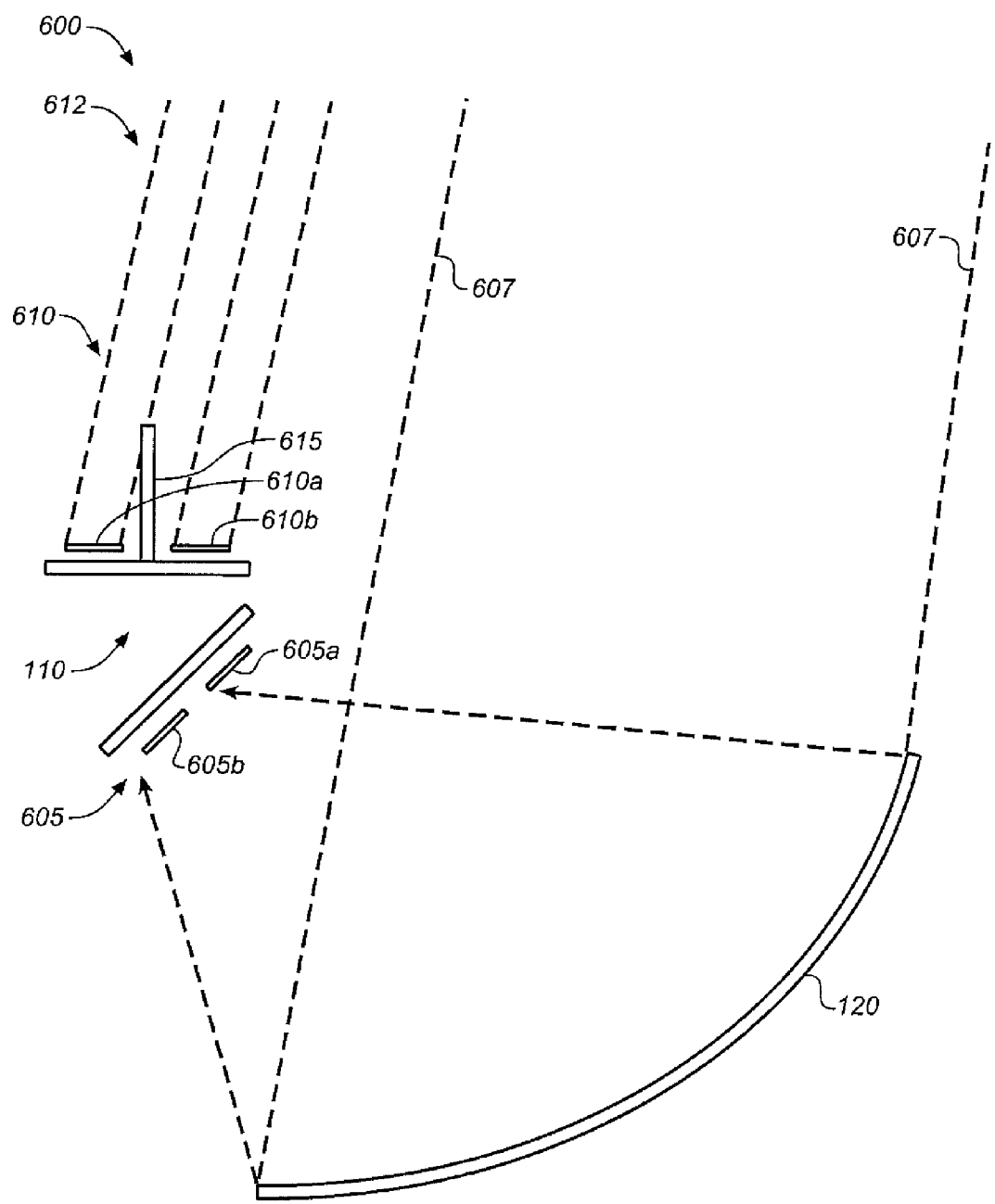
FIGS. 18A-18B show example arrangements of sun sensors that may be used to control the orientation of some example solar energy collectors disclosed herein.
Figure 18B:
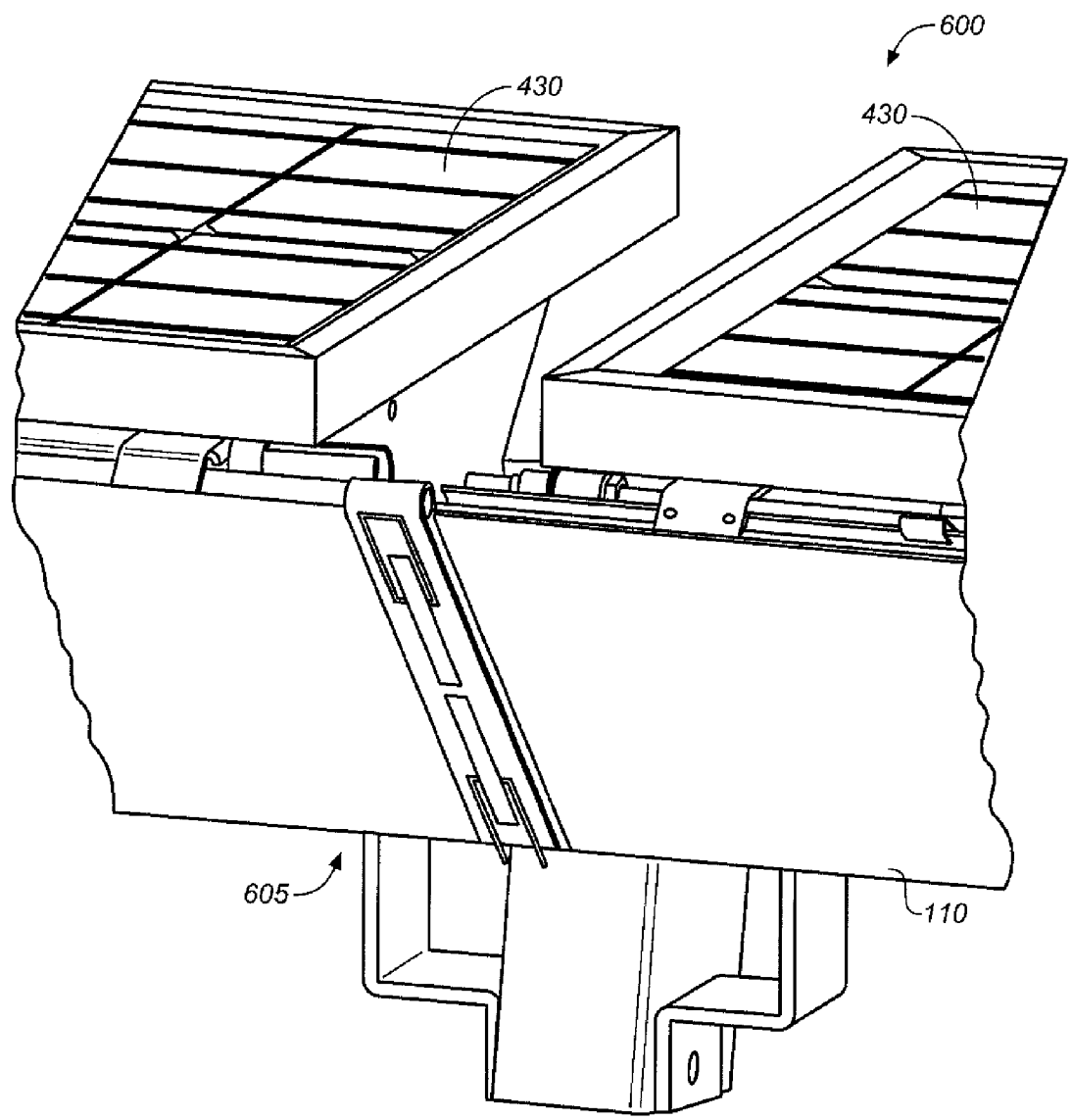

In the schematic illustration of FIG. 18A, solar energy collector 600 may be identical or similar, for example, to any of the solar energy collectors described above. In addition to components previously described, however, solar energy collector 600 comprises a fine sun sensor 605 positioned in the focal region of reflector 120. Fine sun sensor 605 may be positioned in the plane of the front surface of a receiver 110 for example, as shown in FIG. 18B. When illuminated by solar radiation (indicated by rays 607) concentrated by reflector 120, fine sun sensor 605 produces a signal or signals from which the orientation of the reflector 120/receiver 110 assembly can be determined with respect to the sun with sufficient precision to allow that orientation to be adjusted as desired. In some variations, fine sun sensor 605 allows determination of the orientation of the reflector 120/receiver 110 assembly with respect to the position of the sun with a precision, for example, of or within about ±0.1 degrees.

Referring again to FIG. 18B as well as to FIG. 18A, in some variations fine sun sensor 605 comprises two solar radiation detectors 605a, 605b positioned in the plane of the front surface of receiver 110. Detectors 605a, 605b are positioned on opposite sides of the center of the linear focus of the reflector, each extending transversely with respect to the long axis of the receiver and the linear focus of the reflector. Detectors 605a, 605b may be, for example, linearly elongated transversely with respect to the long axis of the receiver. In this arrangement, if the reflector 120/receiver 110 assembly is optimally aligned with the sun to maximize collection of solar radiation (i.e., with the optical axis of reflector 120 directed at the sun), detectors 605a, 605b will detect solar radiation of particular magnitudes and produce signals indicating those magnitudes. If the reflector 120/receiver 110 assembly is misaligned with respect to optimal orientation but one or both of detectors 605a, 605b are still illuminated by concentrated solar radiation, the signals provided by detectors 605a, 605b will indicate the magnitude and direction of misalignment. For example, misalignment in one direction may increase the signal provided by one of the detectors and decrease the signal provided by the other. Hence the orientation of the reflector 120/receiver 110 assembly with respect to the sun can be determined by comparing signals from detectors 605a, 605b so long as one or both of the detectors are illuminated by solar radiation concentrated by reflector 120. Any suitable method or apparatus for comparing the signals from detectors 605a, 605b may be used.

Detectors 605a, 605b may be or comprise solar cells, for example. The solar cells may be, for example, of the same type as those used in receiver 110 and/or solar cells 430. Any other suitable solar radiation detectors may be used instead, however. Also, any other suitable implementation or configuration of a fine sun sensor 605 illuminated by solar radiation concentrated by reflector 120 may also be used in place of that just described.

As illustrated in FIG. 18A, solar energy collectors as disclosed herein may also include an optional coarse sun sensor 610. Coarse sun sensor 610 may be positioned above or on an upper surface of receiver 110 in a plane oriented perpendicularly to the optical axis of reflector 120, for example, as shown. Any other suitable position and orientation for coarse sun sensor 110 may also be used. When illuminated directly by solar radiation (indicated by rays 612), coarse sun sensor 110 produces a signal or signals from which the orientation of the reflector 120/receiver 110 assembly can be determined with respect to the sun with sufficient precision to allow that orientation to be adjusted as desired. In some variations also utilizing fine sun sensor 605, coarse sun sensor 110 allows the orientation of the reflector 120/receiver 110 assembly with respect to the sun to be measured with sufficient precision to adjust that orientation to illuminate fine sun sensor 605 with solar radiation concentrated by reflector 120. That precision may be, for example, of or within about ±5 degrees, ±3 degrees, ±2 degrees, or ±1 degree. Fine sun sensor 605 may then be used to further optimize the orientation of reflector 120/receiver 110.

In the illustrated example, coarse sun sensor 610 comprises two linearly elongated solar radiation detectors 610a, 610b positioned one on either side of a linearly elongated gnomon 615 (shading structure), with the long axes of detectors 610a, 610b and gnomon 615 arranged parallel to each other and to the rotation axis of the solar energy collector. Gnomon 615 is oriented perpendicular to the plane of detectors 610a, 610b, and parallel to the optical axis of reflector 120. In this arrangement, if the reflector 120/receiver 110 assembly is optimally aligned with the sun to maximize collection of solar radiation, gnomon 615 will be aligned directly at the sun and will cast no shadow. If instead the reflector 120/receiver 110 assembly is aligned away from the optimum for collecting solar radiation, gnomon 615 will shade one of solar radiation detectors 610a, 610b. The magnitudes of signals provided by detectors 610a, 610b thus indicate the magnitude and direction of misalignment of the reflector 120/receiver 110 assembly. Hence, similarly to as described for fine sun sensor 605, the orientation of the reflector 120/receiver 110 assembly can be determined by comparing signals from detectors 610, 610b. Any suitable method and apparatus for comparing the signals from detectors 610a, 610b may be used.

Detectors 610*a*, 610*b* may be or comprise solar cells, for example. The solar cells may be of the same type as those used in receiver 110 and/or solar cells 430. Any other suitable solar radiation detectors may be used, however. Also, any other suitable implementation or configuration of a coarse sun sensor 610 may also be used in place of that just described.

In some variations, signals from a coarse sun sensor 610 as described above are used to control the orientation of the reflector 120/receiver 110 assembly to adjust that orientation to illuminate a fine sun sensor 615 as described above. Signals from fine sun sensor 615 are then used to control further adjustment of the orientation of the reflector 120/receiver 110 assembly to, for example, maximize collection of solar radiation.

Some other variations do not utilize a coarse sun sensor. Some of those variations measure an absolute orientation of the reflector 120/receiver 110 assembly (e.g., using accelerometers), compare that orientation to a calculated position of the sun, and adjust the orientation of the reflector 120/receiver 110 assembly to illuminate a fine sun sensor 615 as described above. Signals from fine sun sensor 615 may then be used as previously described.

Some variations using a coarse sun sensor 610 in combination with a fine sun sensor 605 additionally measure an absolute orientation of the reflector 120/receiver 110 assembly (e.g., using accelerometers), compare that orientation to a calculated position of the sun, and adjust the orientation of the reflector 120/receiver 110 assembly to a range in which coarse sun sensor 610 effectively or more effectively provides signals with which the orientation may be further adjusted to illuminate fine sun sensor 605 with concentrated solar radiation.

In addition to and as a consequence of collecting solar energy, solar energy collectors generally shade the area beneath them from the sun. This is particularly true, for solar energy collectors as described herein, when the reflector/receiver assembly is oriented to optimally collect solar radiation, or at nearby orientations. In some variations in which a solar energy collector is located on a building rooftop, for example, the orientation of the reflector/receiver assembly may be adjusted to reduce or stop collection of concentrated solar radiation by the receiver but continue to reflect a significant portion of incident solar radiation away from the roof and thereby provide significant shading of the underlying rooftop. For example, the reoriented reflector (more generally, concentrator) may block at least about 70%, about 80%, about 90%, or about 95% of the amount of solar radiation that it would block if oriented to maximize concentration of solar radiation onto the receiver. Such an orientation may be selected to provide maximum shade without overheating or otherwise damaging the receiver, for example. Such defocusing may be done, for example, on occasions in which the supply or temperature of coolant available to cool the receiver is insufficient to otherwise prevent overheating the receiver. For example, such defocusing may de done when the receiver, or a coolant in the receiver, reaches or exceeds a predetermined temperature of for example, at least about 70° C., about 75° C. about 80° C., about 85° C., about 90° C., or about 95° C.

In variations employing one or more sun sensors to control the orientation of the reflector/receiver assembly, a defocused orientation may in addition be selected to maintain the reflector/receiver assembly in an orientation in which the one or more sun sensors can provide signals with which to return the reflector/receiver assembly to an orientation that maximizes or substantially maximizes concentration of solar energy on the receiver. For example, in variations employing coarse and fine sun sensors as described above, a defocused orientation may in addition be selected to maintain the reflector/receiver assembly in an orientation in which the coarse sun sensor can detect the position of the sun and effectively provide signals with which the orientation may be further adjusted to illuminate the fine sun sensor with concentrated solar radiation.

Maintaining significant shading of an underlying roof, as just described, effectively provides a "white roof" that may advantageously keep the building on which the solar energy collector is located cooler than would otherwise be the case.

As noted above, in some variations a reflector 120 comprises linear reflective elements arranged end-to-end in rows (e.g., of equal length) along the length of the reflector, with two or more such rows arranged side-by side (see, e.g., FIGS. 8A, 11A, and 15B). In such variations, and as illustrated, the linear reflective elements may be of two or more different lengths and arranged such that gaps or joints 375 between the reflective elements in one row are not next to gaps or joints between reflective elements in an adjacent row. In some variations, no gaps or joints between reflective elements in any row are next to gaps or joints between reflective elements in any adjacent row. In some variations, the majority of gaps or joints between reflective elements in any row are not adjacent to gaps or joints between reflective elements in any adjacent row. Arrangements such as those just described may produce a more uniform illumination of the receiver by concentrated solar radiation than would occur if gaps or joints between reflective elements in rows were generally next to gaps or joints in adjacent rows.

Figure 19A:
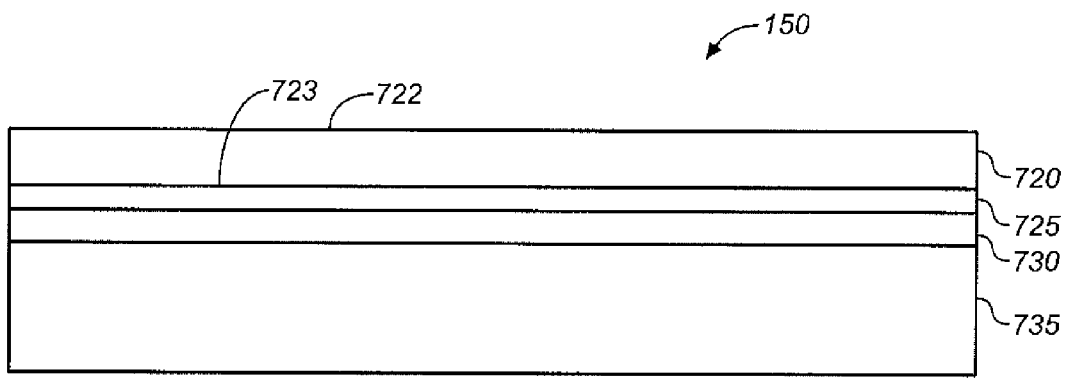
FIGS. 19A-19B show example reflective elements (e.g., minors) having laminated structures.

Also as noted above, in some variations linearly extending reflective elements 150 have a laminated structure. Referring to FIG. 19A, in the illustrated example reflective element 150 comprises a low-iron glass layer 720 having a first surface 722 and a second surface 723. In use in a solar energy collector as disclosed herein, reflective element 150 is oriented so that surface 722 faces the receiver (and hence also the incident solar radiation). A reflective layer 725 is disposed on the second surface of the low-iron glass layer. An adhesive layer 730 is disposed on the reflective layer. A second glass layer 735 is attached by adhesive layer 730 to reflective layer 725.

Figure 19B:
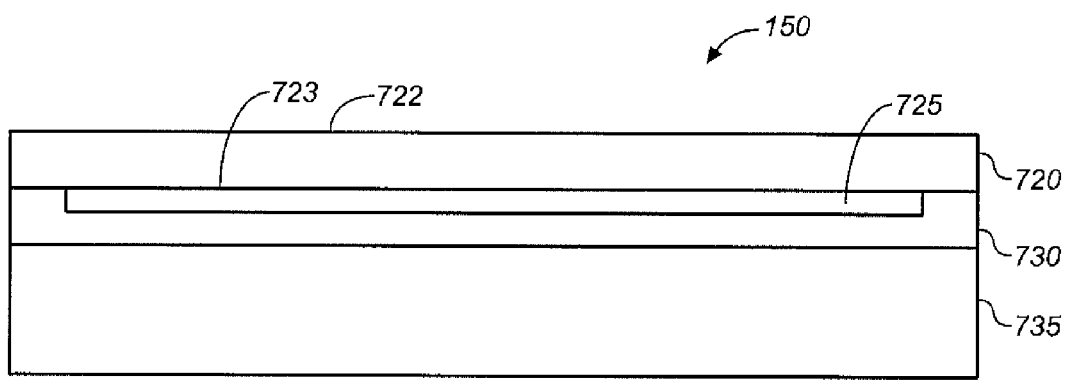

In the example illustrated in FIG. 19B, reflective layer 725 is absent from edge portions (e.g., around the entire periphery of reflective element 150) of the second surface 723 of low-iron glass layer 720. Adhesive layer 730 attaches corresponding edge portions (e.g., around the entire periphery of reflective element 150) of second glass layer 735 directly to the exposed edge portions of surface 723, and attaches other portions of second glass layer 735 to reflective layer 725. In this example, adhesive layer 730, in combination with glass layers 720 and 735, may seal and/or protect reflective layer 725 from the external environment.

Low-iron glass layer may be, for example, about 0.5 millimeters to about 3 millimeters thick. Reflective layer 725 may comprise, for example, silver, gold, chrome, or any other suitable metal or non-metal material or materials and be, for example, about 20 nanometers to about 200 nanometers thick. Adhesive layer 725 may comprise, for example, an acrylic closed-cell foam adhesive tape (e.g., VHB™ tape available from 3M™), and be, for example, about 0.5 millimeters to about 1.5 millimeters thick. Second glass layer 735 may comprise, for example, soda lime glass or borosilicate glass and be, for example, about 2 millimeters to about 5 millimeters thick. In one example, low-iron glass layer 720 is about 1 millimeter thick, reflective layer 725 comprises silver and is about 80 nanometers thick, adhesive layer 730 comprises acrylic closed-cell foam tape and is about 0.9 millimeters thick, and second glass layer 735 comprises soda lime glass and is about 4 millimeters thick.

Reflective layer 725 may be deposited and patterned (e.g., its edges removed), and adhesive layer 730 deposited, by conventional processes, for example.

Any of the above described variations of solar energy collectors may optionally be provided with spray nozzles, or the equivalent, located on the receiver 110 or the receiver support 160, for example, and configured to spray a washing fluid (e.g., water) onto reflector 120 to wash the reflector.

This disclosure is illustrative and not limiting. Further modifications will be apparent to one skilled in the art in light of this disclosure and are intended to fall within the scope of the appended claims. For example, a shared hydraulic or pneumatic drive system driving two or more (hydraulic or pneumatic) linear actuators may, in some variations, be substituted for a shared drive shaft driving two or more linear actuators as described herein.

What is claimed is:

1. A concentrating solar energy collector comprising:
   a linearly elongated reflector having a linear focus;
   a linearly elongated receiver oriented parallel to and located at or approximately at the linear focus of the reflector and fixed in position with respect to the reflector; and
   a support structure supporting the reflector and the receiver and pivotally mounted to accommodate rotation of the support structure, the reflector, and the receiver about a rotation axis parallel to the linear focus of the reflector;
   wherein the reflector comprises a plurality of linearly elongated reflective elements each having a long axis, and the linearly elongated reflective elements are arranged on and attached to a sheet of metal in two or more parallel side-by-side rows with the long axes of the linearly elongated reflective elements and the rows oriented parallel to the linear focus of the reflector, the sheet of metal providing longitudinal support parallel to the rotation axis along the length of the linearly elongated reflective elements;
   wherein the reflector has a reflective surface that is or approximates a portion of a parabolic surface, with the reflector located primarily or entirely on one side of a symmetry plane of the parabolic surface; and
   wherein the support to which the sheet of metal is attached, the transverse reflector supports structure comprises a plurality of transverse reflector supports supporting the reflector and extending transverse to the rotation axis and a corresponding plurality of receiver supports each connected to and extending from only one outer end of its corresponding transverse reflector support to support the receiver above the reflector, with the receiver supports located along an edge of the reflector adjacent the symmetry plane of the parabolic surface.

2. The concentrating solar energy collector of claim 1, wherein the receiver comprises solar cells that, in operation of the solar energy collector, are illuminated by solar radiation concentrated by the reflector onto the receiver.

3. The concentrating solar energy collector of claim 1 wherein the receiver comprises one or more coolant channels through which, in operation of the solar energy collector, fluid may pass to collect heat from solar radiation concentrated by the reflector onto the receiver.

4. The concentrating solar energy collector of claim 2, wherein the receiver comprises one or more coolant channels through which, in operation of the solar energy collector, fluid may pass to collect heat from solar radiation concentrated by the reflector onto the receiver.

5. The concentrating solar energy collector of claim 1, wherein the rotation axis is oriented in an East-West or an approximately East-West direction.

6. The concentrating solar energy collector of claim 1, wherein surfaces of the transverse reflector supports orient the sheet of metal, and thus the linearly elongated reflective elements attached to it, in a desired orientation with respect to the receiver.

7. The concentrating solar energy collector of claim 1 wherein:
   the receiver comprises upper and lower surfaces on opposite sides of the receiver, the lower surface of the receiver located at or approximately at the linear focus of the reflector, the upper surface of the receiver comprising solar cells arranged to face the sun and thereby be directly illuminated by solar radiation, and not receive solar radiation concentrated by the reflector, when the reflector is oriented to concentrate solar radiation on the lower surface of the receiver;
   the solar energy collector comprises a drive system powered by the solar cells on the upper surface of the receiver and coupled to the support structure to rotate the support structure, the reflector, and the receiver about the rotation axis; and
   the solar cells of the upper surface of the receiver generate sufficient electricity under a solar irradiance of at least about 100 Watts per square meter of solar cell to operate the drive system.

8. The concentrating solar energy collector of claim 7 wherein the receiver comprises one or more coolant channels through which fluid may pass to collect heat from solar radiation concentrated by the reflector onto the receiver.

9. The concentrating solar energy collector of claim 8 comprising a pump that pumps the fluid through the one or more coolant channels, wherein the pump is powered by the solar cells of the upper surface of the receiver.

10. The solar energy collector of claim 8, comprising a pump that pumps the fluid through the one or more coolant channels, wherein the pump is powered by an energy source external to the solar energy collector.

11. The concentrating solar energy collector of claim 8, wherein the lower surface of the receiver comprises solar cells that, in operation of the solar energy collector, are illuminated by solar radiation concentrated by the reflector onto the receiver.

12. The concentrating solar energy collector of claim 1 comprising:
   a first solar radiation sensor that, when illuminated by solar radiation concentrated by the reflector, generates a signal by which rotation of the support structure, the reflector, and the receiver may be controlled to maximize concentration of solar radiation onto the receiver.

13. The concentrating solar energy collector of claim 12, wherein the first solar radiation sensor is located in a focal region of the reflector.

14. The concentrating solar energy collector of claim 13, wherein the first solar radiation sensor comprises two solar radiation detectors positioned on opposite sides of a center line of the linear focus of the reflector.

15. The concentrating solar energy collector of claim 14, wherein each solar radiation detector is linearly elongated in a direction transverse to the linear focus of the reflector.

16. The concentrating solar energy collector of claim 12, comprising a second solar radiation sensor positioned to be illuminated directly by solar radiation not concentrated by the reflector, the second solar radiation sensor generating a signal by which rotation of the support structure, the reflector, and the receiver may be controlled to illuminate the first solar radiation sensor with solar radiation concentrated by the reflector.

17. The concentrating solar energy collector of claim 16, wherein the second solar radiation sensor is fixed in position with respect to reflector and the receiver and located in a plane oriented perpendicular to an optical axis of the reflector.

18. The concentrating solar energy collector of claim 17, wherein the second solar radiation sensor comprises a linearly elongated gnomon and two linearly elongated solar radiation detectors positioned on opposite sides of the gnomon, wherein the long axes of the gnomon and the linearly elongated solar radiation detectors are arranged parallel to the linear focus of the reflector.

19. The concentrating solar energy collector of claim 18, wherein the first solar radiation sensor is located in a focal region of the reflector and comprise two solar radiation detectors positioned on opposite sides of a center line of the linear focus of the reflector.

* * * * *